United States Patent [19]
Zaliznyak et al.

[11] Patent Number: 6,130,550
[45] Date of Patent: Oct. 10, 2000

[54] SCALEABLE PADFRAME INTERFACE CIRCUIT FOR FPGA YIELDING IMPROVED ROUTABILITY AND FASTER CHIP LAYOUT

[75] Inventors: Arch Zaliznyak, San Jose; Suresh Manohar Menon; Paul Takao Sasaki, both of Sunnyvale, all of Calif.

[73] Assignee: DynaLogic, Sunnyvale, Calif.

[21] Appl. No.: 08/978,451

[22] Filed: Nov. 25, 1997

Related U.S. Application Data

[63] Continuation-in-part of application No. 08/869,201, Jun. 4, 1997, which is a continuation-in-part of application No. 08/639,272, Apr. 23, 1996, Pat. No. 5,668,495, which is a division of application No. 08/375,303, Jan. 20, 1995, Pat. No. 5,570,059, which is a continuation of application No. 08/274,817, Jul. 14, 1994, Pat. No. 5,406,133, which is a division of application No. 08/002,172, Jan. 8, 1993, Pat. No. 5,355,035.

[51] Int. Cl.[7] ...................... H03K 19/173; H03K 19/177
[52] U.S. Cl. .................... 326/39; 326/41; 326/38
[58] Field of Search .................... 326/38, 39, 40, 326/41, 47

[56] References Cited

U.S. PATENT DOCUMENTS

| | | | |
|---|---|---|---|
| 4,987,319 | 1/1991 | Kawana | 326/37 |
| 5,017,813 | 5/1991 | Galbraith et al. | 326/63 |
| 5,027,011 | 6/1991 | Steele | 326/40 |
| 5,220,213 | 6/1993 | Chan et al. | 326/40 |
| 5,317,210 | 5/1994 | Patel | 326/40 |
| 5,329,460 | 7/1994 | Agrawal et al. | 325/39 |
| 5,497,108 | 3/1996 | Menon et al. | 326/84 |
| 5,504,440 | 4/1996 | Sasaki | 326/39 |
| 5,512,765 | 4/1996 | Gaverick | 257/202 |
| 5,543,640 | 8/1996 | Sutherland et al. | 257/202 |
| 5,552,721 | 9/1996 | Gould | 326/39 |
| 5,614,844 | 3/1997 | Sasaki et al. | 326/84 |
| 5,631,578 | 5/1997 | Clinton et al. | 326/41 |
| 5,654,665 | 8/1997 | Menon et al. | 327/541 |
| 5,671,432 | 9/1997 | Bertolet et al. | 395/800 |
| 5,692,147 | 11/1997 | Larsen et al. | 395/412 |
| 5,786,710 | 7/1998 | Graf | 326/40 |

*Primary Examiner*—Michael Tokar
*Assistant Examiner*—Daniel D. Chang
*Attorney, Agent, or Firm*—Ronald C. Fish; Falk & Fish

[57] ABSTRACT

An interface circuit for use in the layout of padframe interface circuits for field programmable gate arrays having a plurality of I/O cells each of which may be programmed as an input or an output (or both) and a programmable connection matrix which provide programmable pathways between the data output signals generated by the core array of logic blocks and I/O cells programmed as outputs and provide programmable pathways between I/O cells programmed as inputs and data input conductors going into the core array. The interface circuits are all substantially identical in structure, and each includes a sufficient number of power and ground connections to supply adequate current to the number of I/O cells the interface has. Each interface circuit also includes at least one and preferably two open spaces into which conductive paths may be laid out to carry power to the core array or carry dedicated signals to circuits other than the core which also reside on the integrated circuit. Because of the substantially identical structure of each interface and the preservation of ratios between I/O cells, power and ground connections and open slots, larger or smaller core arrays may be accommodated by cutting and pasting additional interface circuits into the layout thereby substantially decreasing design, placement and layout time and time to market for introduction of new FPGAs in a family with larger core arrays. The regular repeatable structure of RIU's simplifies software development for products within the family and as such contributes to faster "time to market".

15 Claims, 26 Drawing Sheets

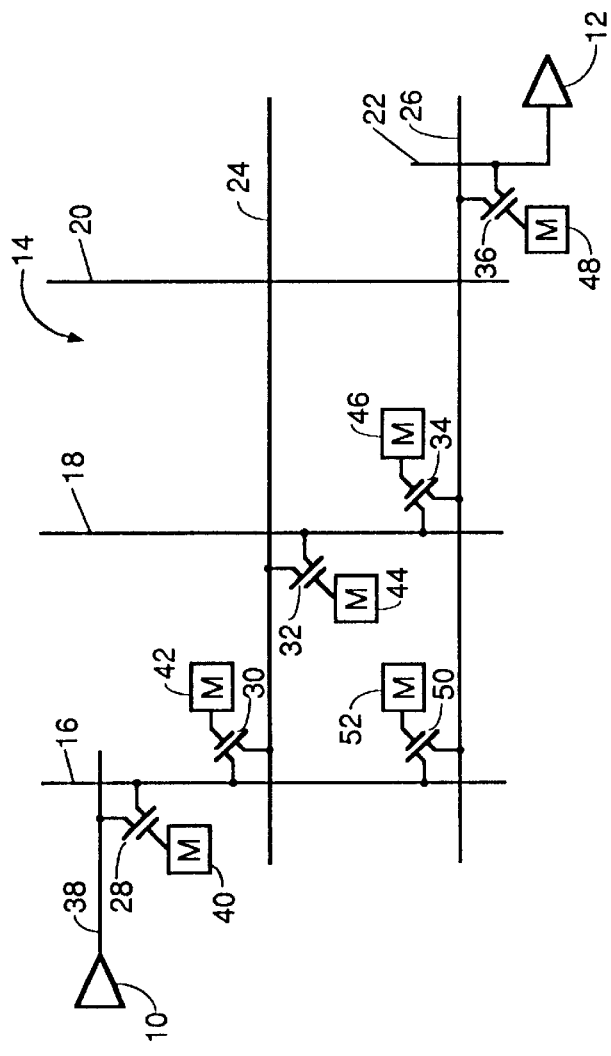
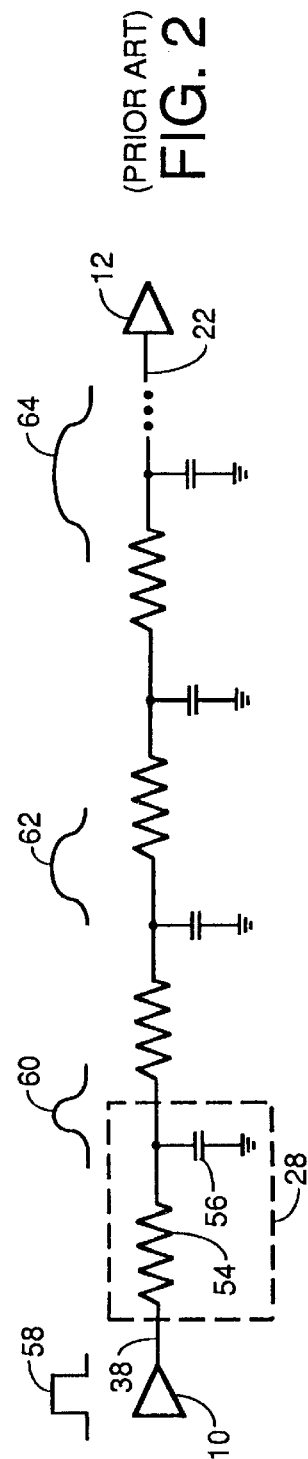

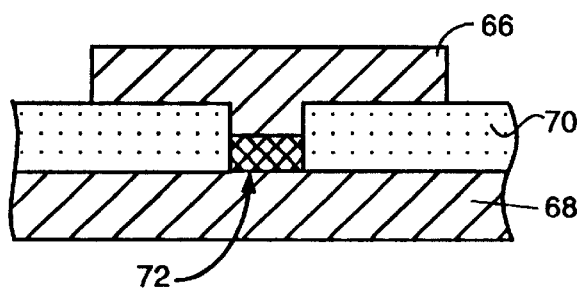
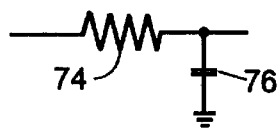
FIG. 3
(PRIOR ART)
FIG. 4
(PRIOR ART)
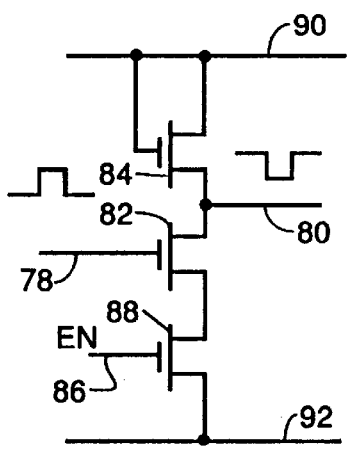
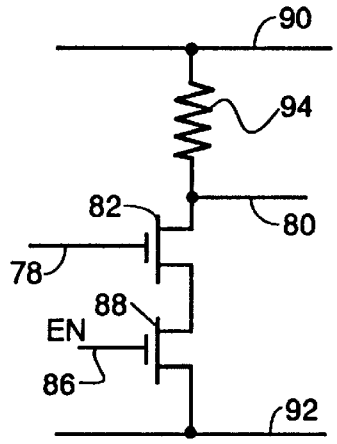
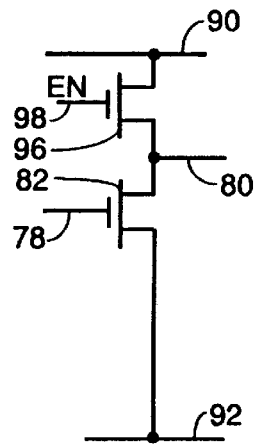
FIG. 6A
FIG. 6B
FIG. 6C
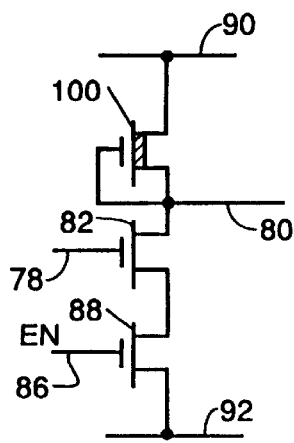
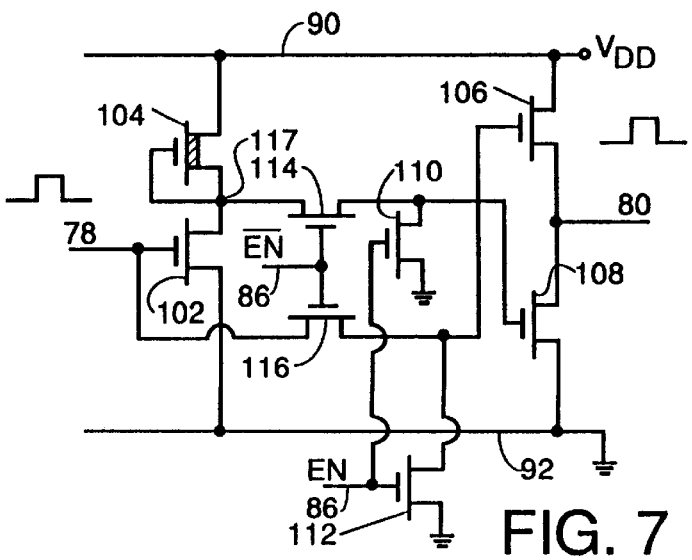
FIG. 6D
FIG. 7

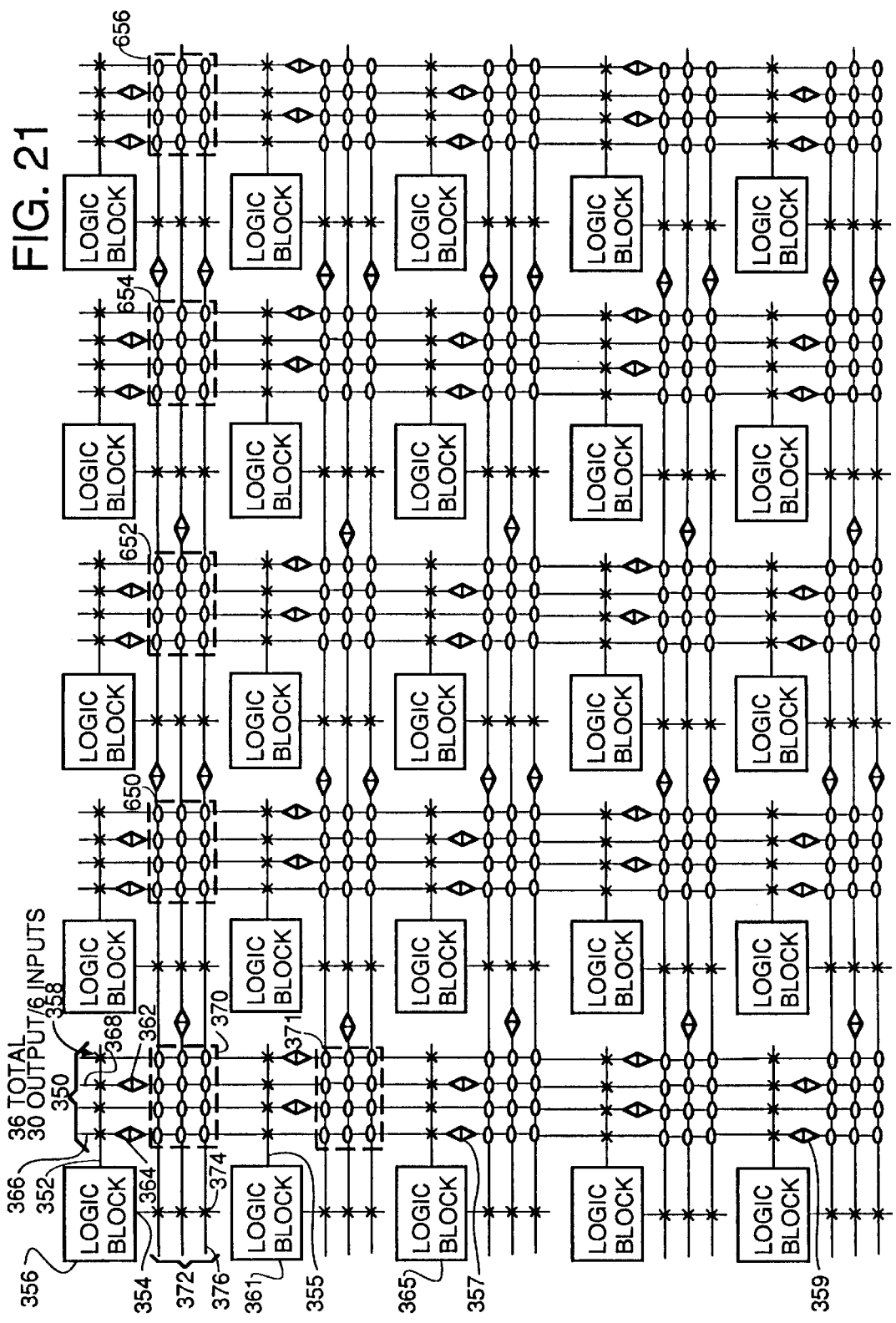

TRI-STATE DRIVER

| E | A | Y | |
|---|---|---|---|
| 0 | 0 | Z | } TRI STATE |
| 0 | 1 | Z | |
| 1 | 0 | 1 | |
| 1 | 1 | 0 | |

| EA | EB | A | B | |
|----|----|---|---|---|
| 0 | 0 | Z | Z | |
| 0 | 1 | $\overline{B}$ | B | B INPUT |
| 1 | 0 | A | $\overline{A}$ | A INPUT |
| 1 | 1 | NOT ALLOWED | | |

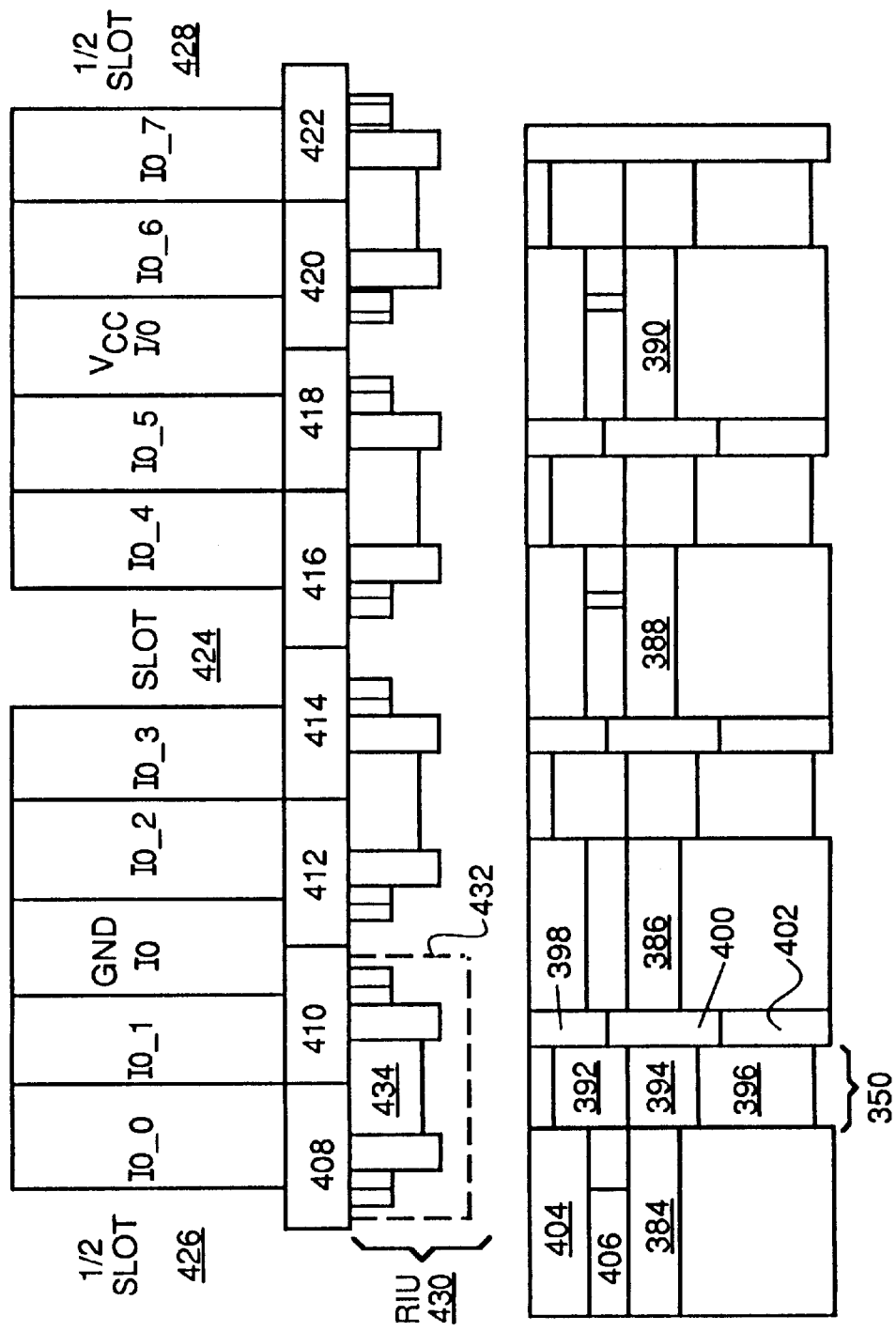
FIG. 24 OVERALL RIU - I/O - LOGIC BLOCK CONFIG.

INPUT CONNECTION MATRIX; LEFT SIDE

| GROUP | 3 | 3 | 2 | 2 | 1 | 1 | 0 | 0 | 3 | | | | | | | | | | | 2 | | | | | | | | | | | 1 | | | | | | | | | | | 0 | | | | | | | | | | BOTTOM |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| | 10 | 11 | 12 | 13 | 14 | 15 | 16 | 17 | 18 | 19 | 20 | 21 | 22 | 23 | 24 | 25 | 26 | 27 | 28 | 29 | 18 | 19 | 20 | 21 | 22 | 23 | 24 | 25 | 26 | 27 | 28 | 29 | 18 | 19 | 20 | 21 | 22 | 23 | 24 | 25 | 26 | 27 | 28 | 29 | 0 | | | | | |
| 0 | | | | | | X | X | X | | | | | | | | | | | | | | | | | | | | | | | | | | | | | | | | | | | | | | | | | | |
| 1 | X | X | X | X | X | X | X | X | | | | | | | X | | | | | | | | | | | | | | | | | | | | | | | | | | | | | | | | | | | |
| 2 | X | X | X | X | X | X | X | X | | | | | X | | | | | | | | | | | | | | | | | | | | | | | | | | | | | | | | | | | | | |
| 3 | X | X | X | X | X | X | X | X | | | | | | | | | | | | | | | X | | | | | | | | | | | | | | | | | | | | | | | | | | | |
| 4 | | | X | X | X | X | X | X | | | | | | | | | | | | | | | | | | X | | | | | | | | | | | | | | | | | | | | | | | | |
| 5 | X | X | X | X | X | X | X | X | | | X | | | | | | | | | | | | | | | | | | | | | | | | | | | | | | | | | | | | | | | |
| 6 | | | X | X | X | X | X | X | | | | | | | | | | | | | | | | | X | | | | | | | | | | | | | | | | | | | | | | | | | |
| 7 | X | X | X | X | X | X | X | X | | | | | | | | | | X | | | | | | | | | | | | | | | | | | | | | | | | | | | | | | | | |
| 8 | | | X | X | X | X | X | X | | | | | | | | | | | | | | | | | | | | | X | | | | | | | | | | | | | | | | | | | | | |
| 9 | X | X | X | X | X | X | X | X | | | | | | | | | | | | | | | | | | | | X | | | | | | | | | | | | | | | | | | | | | | |
| 10 | | | X | X | X | X | X | X | | | | | | | | | | | | | | | | | | | | | | | X | | | | | | | | | | | | | | | | | | | |
| 11 | X | X | X | X | X | X | X | X | | | | | | | | | | | | | | | | | | | | | | | | | | | | | | | | | | | | | | | | X | | |

INPUT CONNECTIONS TO THE HORIZONTAL ROUTING CHANNELS ON THE LEFT SIDE

NOTE: NUMBERING IS FROM THE TOP TO THE BOTTOM

SCALEABLE PADFRAME INTERFACE CIRCUIT FOR FPGA YIELDING IMPROVED ROUTABILITY AND FASTER CHIP LAYOUT

BACKGROUND OF THE INVENTION

This is a continuation-in-part of prior U.S. patent application entitled FAST REPROGRAMMABLE LOGIC WITH ACTIVE LINKS BETWEEN CELLS, Ser. No. 08/869,201, filed Jun. 4, 1997 (now co-pending) which was a continuation-in-part of a prior U.S. patent application entitled BICMOS REPROGRAMMABLE LOGIC Ser. No. 08/639,272, filed Apr. 23, 1996, now allowed, now U.S. Pat. No. 5,668,495, which was a divisional of a U.S. patent application of the same title, Ser. No. 08/375,303, filed Jan. 20, 1995, now U.S. Pat. No. 5,570,059, issued Oct. 29, 1996, which was a continuation of a U.S. patent application of the same title, Ser. No. 08/274,817, filed Jul. 14, 1994, now U.S. Pat. No. 5,406,133, issued Apr. 11, 1995, which was a divisional of a U.S. patent application of the same title, Ser. No. 08/002,172, filed Jan. 8, 1993, now U.S. Pat. No. 5,355,035, issued Oct. 11, 1994. The prior art cited by applicants to the U.S. Patent and Trademark Office and prior art cited by the U.S. Patent and Trademark Office to the applicants in all of these parent cases is hereby incorporated by reference and cited hereby to the U.S. Patent and Trademark Office.

The invention pertains to the field of field programmable gate arrays although it may have applications in the field of layout of circuit designs for other types of integrated circuits with high degrees of regularity in the structure of the core integrated circuit cells. Specifically, the invention contemplates a padframe interface circuit of uniform design which maintains a fixed ratio of power, ground and logic connections for each interface circuit when the size of the core logic increases or decreases and the number of interface circuits needed to make logic connections increases or decreases. By using an interface circuit of standard design with programmable connection matrices that allow multiple line drivers to programmably share connection lines that go into and come out of the core array, improved routability can be achieved in SRAM based field programmable gate arrays. Also, by using an interface circuit of standard design that can be "cut and pasted" into a circuit layout in blocks without adversely affecting the power, ground and logic connection capabilities, a great deal of time can be saved that would ordinarily be consumed in circuit layout labor thereby speeding the time to market of new products. Uniformity of padframe interface connections also simplifies software development for placement and routing software for new members of an FPGA family.

Logic designers have long had the need for custom logic circuits to implement their designs. In the 1970's, this need gave rise to programmable logic arrays, programmable array logic and programmable read only memory. Later in the decade, custom circuits were made by customizing the metal layer of integrated circuits which had standard cells formed in the layers below the metal layer. The customized metal layer interconnected the standard cells in a manner defined by the customer of the gate array manufacturer.

Gate arrays are only a good choice where the desired function to be performed by the gate array can be determined with certainty in advance. However, gate arrays are not a good choice where the desired function can change over time with changing requirements. This can happen when a circuit design is being evaluated and testing over time reveals the need for changes in the design. Another shortcoming of gate arrays was that they could not perform the function of packet encapsulation and delivery in network settings where packet construction was subject to a variety of different protocols and where packet headers change as the packets circulate, for example in token ring networks. This function has been done in software in the prior art, but increasing network speeds demands more speed which requires that this function be done in hardware.

Another application in which fixed gate arrays had shortcomings in where data flow paths change over time as a function of changes in the process that is being emulated by a particular circuit. Thus, a need arose for more flexibility in custom circuits such that the functions thereof can be changed. Field reprogrammable gate arrays were developed in response to these needs.

The market for field reprogrammable gate arrays (FPGAs) has been increasing steadily in recent years, because of the advantages they provide to designers. FPGAs comprise an array of standard cells which include certain high usage types of logic items such as multiplexers, combinatorial logic etc. The standard cells can be programmed to implement whatever function the designer needs by setting certain programming bits. There are different technologies used to implement these programming bits. One technology is called antifuse where small fuse-like structures in various lines are selectively burned out to "cut" connection lines to get the desired functionality. Other technologies include static RAM (SRAM) based technologies like the "pass transistor" interconnect type FPGAs marketed by competitors of the assignee and the "active repeater" type FPGAs described herein. In SRAM based FPGAs, thousands of programming bit are stored in SRAM cells spread throughout the FPGA. These programming bits control the conductivity state of the channel of pass transistors or the on-off state of active repeaters inside each standard cell and in connection matrices connecting the standard cells to each other and to the package pins. By properly programming all the SRAM cells, it is possible to make the necessary connections to implement the desired logic function.

The advantage of these FPGA structures is that a designer can have a custom design implemented in silicon much more rapidly than would be the case for a full custom chip design from scratch. Further, since the programming is not permanent (except in antifuse FPGAs), the functions implemented in the chip can be rapidly changed as the designer's design changes.

FPGAs typically have a ring of input/output cells (I/O cells) which surround the core array of standard cells in the middle of the die. The standard cells in the core are connected to each other by vertical and horizontal buses each having multiple conductors that have programmable switch connections therein. The function of the I/O cells is to interface the standard cells of the core to the outside world through the chip pinout as a plurality of data inputs and outputs. Each I/O cell can be programmed to be an input or an output or a bidirectional cell wherein data is sent out to the pin from the core array and goes right back into the core array on a different line. The I/O cells are connected to the various cells of the core through an array of driver circuits and conductive lines called the padframe interface. It is an area of circuitry that lies between the core cell array and the ring of I/O cells.

In the prior art, this padframe interface area was custom designed and had to be changed for every new chip in a family of FPGAs. As the core size grew or shrank, the padframe interface circuitry also grew or shrank and had to be laid out all over again using the design rules of the process being used to make the core. This custom layout process for each new FPGA in the family was time consuming and labor intensive and slowed down the time to market.

Routability is a key factor in FPGA commercial success. This means that for complex FPGAs, with many input and output signals and many needed connections between the logic blocks of the core array, there is a need for the software that programs the programmable connections to find individual routes for each needed interconnection without conflicts with other signals. Two different signals cannot share the same connection path absent some form of multiplexing. The more complex the functionality desired is, the more difficult the routing problem becomes and the more complex is the routing software.

Routability is not a significant problem in antifuse technologies since the antifuse programming connections are so small in terms of die area consumed per programmable connection that connection matrices can be fully populated (one programmable switch at every intersection of crossing wires) and many more options are available for making connections. However, antifuse has many problems which have caused designers to move away from antifuse FPGAs. First, antifuse structure require special processes to construct. These special processes complicate the manufacturing process. Another problem is that the programming voltage necessary to burn out an antifuse structure to program it is well above the Vcc voltage needed to run the rest of the circuit. This requires either a separate power supply, which customers do not like, or circuitry on the FPGA to generate the high programming voltage (typically 10 volts) from the low Vcc voltage (typically 3 volts). This circuitry complicates the design and uses chip area. Antifuse structures also take a long time to program each one, and since there can be hundreds of thousands of them on the chip, the total programming time can extend for a long time, which is bad for high volume production. Further, antifuse structures, once programmed, cannot be reprogrammed. If the design changes, an entirely new FPGA must be programmed for the new design. Finally, antifuse structures do not scale well as new technologies with smaller linewidths surface.

As a result of these problems with antifuse structures, the industry has tended to gravitate toward the SRAM based FPGAs noted above. SRAM based FPGAs however have their own set of problems which revolve around routability. SRAM cells are much larger than antifuse structures, and since there are many thousands or hundreds of thousands of them on an FPGA, considerable die area can be consumed just by the memory cells needed to program the necessary interconnects. As a result, connection matrices as the intersections of two or more multiconductor interconnect buses cannot be fully populated with a switch and its associated SRAM cell at the intersection of each individual conductor with each other individual conductor. This means that fewer connection possibilities are available to the routing software. As a result, no SRAM based FPGA company can guarantee routing for every desired functionality specified by a company.

The routing problem of an SRAM based FPGA breaks down into two problems: routability within the core array to make all the necessary connections between different logic blocks within the core array; and routability of connections through the padframe interface area from the core array and the I/O cells. Of these two problems, routing within the core is the more difficult of the two. Routing bottlenecks can occur where the number of needed connections to a logic block or to an I/O cell exceeds the number of possible programmable pathways to the I/O cell.

Thus, a need arose for an apparatus which could eliminate routing bottlenecks in the padframe area and also replace custom designed padframe interface circuitry with modular building blocks to allow faster time to market for new FPGAs in a family.

SUMMARY OF THE INVENTION

The teachings of the invention contemplate a genus of standard cell padframe interface circuits called Repeatable Interface Units (hereafter RIUs) which share the following characteristics, the detailed discussion of which begins with FIG. 19, the discussion of FIGS. 1–18 being discussion of subject matter from the parent cases.

The RIU cells are all identical in structure, and each has the capability to be coupled to the same number of: core logic blocks in the logic block array; I/O cells which connect to I/O pins at which signal inputs to the FPGA are received and signals from the FPGA are output; and power and ground pins to supply the I/O cell circuits and slots for power and ground connections to supply the core logic block array.

The uniformity of RIU cell structure means the RIUs can be "cut and pasted" into an FPGA chip layout as a standard cell as part of the padframe interface. Thus, as the size of the core array grows pursuant to introduction of a new chip in the family, the padframe interface can be redesigned simply by cutting and pasting more RIU cells into the padframe interface layout to provide the needed additional connections. This cut and paste mode of laying out the padframe interface does away with the need for many hours of custom circuit design and layout of the padframe interface circuitry that would otherwise be required to make a padframe interface circuit design and do the placement and routing and design rule compliance for that padframe interface circuit design to make all the necessary connections between the core logic blocks and the various pins of the pinout.

Because each RIU is identical in structure and connects to the same number of core logic blocks, I/O cells, power and ground pins and slots, the cutting and pasting into the layout of additional RIU cells allows the software to not change from product to product within an FPGA family since the connectivity ratio remains the same even though the number of core blocks changes. Software development is a "time to market" issue. Cutting and pasting of RIU cells into a layout to make a padframe interface circuit is advantageous since it can be done without changing the ratio of logic blocks to RIU cells to I/O, power, ground and slot connections from the ratios which worked for the smaller array chips in the same family and this fact simplifies the software needed for placement and routing and decreases the software development time.

Each RIU connects to the same fixed number of I/O cells, each of which can be programmed as either an input or an output. Each RIU provides a programmable switching matrix which allows each I/O cell programmed as an input to connect to any or all simultaneously of a fixed number of specific input lines in a column of input lines at the edge of the core logic block array and associated with a particular one or more of the logic blocks to which the RIU is coupled so long as there is no conflict between multiple inputs trying to use the same intermediary connections in the programmable matrix or trying to drive the same data input lines to the core array with different data input signals. Connections of the input can also be programmed to any or all simultaneously of a fixed number of specific input lines in each of the other columns of input lines at the edge of the core logic block array to which the RIU is coupled. The programmable switching matrix can be programmed and reprogrammed by a user in a non-volatile fashion. However, as the number of RIU cells is increased, the availability of programmable connectivity between the core logic blocks and the I/O cells remains the same.

If an I/O cell is programmed as an output, the programmable switching connection allows the same output to be coupled to any one of a fixed number of specific output lines in a selectable subset of columns of output lines at the edge of the core array associated with one of the logic blocks of the subset of logic blocks to which the particular output is coupled through the RIU connection matrix. Again however, conflicts are to be avoided so that only one data output signal from the core array drives any particular I/O cells programmed as an output at any particular time and so that multiple data output signals from the core array do not attempt to use the same intermediary connection in the programmable connection matrix.

The I/O cells and RIUs can be programmed to act in a bidirectional manner steering data output signals coming out of the core array on one line back into the core array on another line.

Each RIU connects to the same fixed number of core logic blocks and to both the input and output data signal lines of each column or row coming out of the core array.

Each RIU also is coupled to a fixed number of power and ground inputs for supplying ground to the I/O cells and to a fixed number of slots which can be converted to power and ground connections to supply power and ground to the logic blocks of the core array or to dedicated pins.

The forgoing features of the genus translate to a smaller time to market for introduction of new chips in a family of FPGAs with either larger or smaller arrays of core logic blocks. Also, the RIU according to the teachings of the invention, by inclusion of a routing area comprised of a plurality of programmable connection matrices coupled to both multiple columns and multiple I/O cells, provides more connection possibilities to the I/O cells. This reduces the possibilities of a routing bottleneck in routing to the I/O cells. The RIU of the genus of the invention also greatly simplifies the routing software and offloads some of the routing problem of routing in the core array by the use of interconnects coming out of the core array, through an RIU and back into the core array.

In an important alternative embodiment, bidirectional active repeaters are added to the RIU to couple the two halves of the O_lines together and at both ends of both the O_lines and the I_lines. This provides even more routing possibilities and further simplifies the routing software.

Specifically, the genus of RIUs defined above is an interface circuit for interfacing logic blocks in a core array of programmable logic blocks of an integrated circuit to a plurality of external pins of an integrated circuit, and each said interface circuit will have:

a fixed number of input/output cells each of which may be programmed as either an input or an output and each of which is electrically coupled to an external pin of an integrated circuit;

a fixed number of I/O power and ground ports connected to external pins of an integrated circuit and connected to said input/output cells to supply power thereto, said fixed number of I/O power and ground ports established at a number which is high enough to supply adequate current considering the number of input/output cells in said interface circuit;

at least one empty slot for use in laying out power or ground connections from at least one external pin of said integrated circuit to said core array or for making connections from at least one external pin to other circuitry not part of said core array to carry one or more signals needed by said other circuitry;

a plurality of columns each comprising a plurality of data output signal lines carrying data output signals from said core array and a plurality of data input signal lines carrying data input signals to said core array; and a programmable connection matrix coupling said input/output cells to said plurality of data output signal lines and said data input signal lines via a plurality of programmable signal pathways.

A process for using the interface circuit of the invention comprises cutting and pasting a sufficient number of predesigned, identical interface circuits to make connections between a plurality of data input and data output signals lines and the external pins of the integrated circuit, wherein each of said identical interface circuits has a plurality of input/output cells for coupling to external pins, a number of power and ground connections from external pins to the input/output cells which are adequate to supply enough power to that number of input/output cells, at least one empty slot and a programmable connection matrix through which pathways may be programmed to make connections between said input/output cells and the data input and data output signal lines in a core array of programmable logic blocks of said field programmable gate array.

In a specific species within the genus of RIU defined herein, one RIU is comprised of four programmable connection matrices, each of these matrices being coupled to one core logic block at the edge of the core logic block array and two I/O cells at the edge of the FPGA. In this species, the connection of the connection matrix is to both the input line column (having 6 individual input signal lines) and the Output line column (having 24 separate output signal lines) of the logic block to which it is connected. Each connection matrix in this species is also connected to the Data Out, Data In, Output Enable and CKE connection ports of each of two I/O cells. The connection matrices in this species are also coupled together within each RIU so as to provide specific programmable connectivity between I/O cells programmed as inputs (for up to all 8 I/O cells) and input lines of the columns of all four logic blocks to which the RIU is connected. In this species, each of the 8 I/O cells can be programmed as an input and can be connected via a programmable data path through the matrices simultaneously to up to 3 specific input lines of the 6 total input lines of each column and this connection can be made for up to 3 specific input lines of the 6 total input lines of each of the other 3 columns to which the RIU is connected as well.

The connection matrices in this species are also coupled together within each RIU so as to provide specific programmable connectivity between the outputs in each of two groups of four I/O cells and output lines of the two logic blocks to which the group of four I/O cells is coupled through the matrices. Specifically, within each group of four I/O cells, each I/O cell programmed as an output can be coupled to any of up to 14 specific output lines of the 24 total output lines in each output column for the two logic blocks to which the group of four I/O cells programmed as outputs is coupled.

This particular species is useful for RIUs at the top and bottom of the logic block array. For connections to the left and right edges of the logic block array, two different species, one for the left and one for the right are used. These species have the same general characteristics of the genus but have different input and output connection possibility matrices from the top and bottom RIUs and as between the left and right side RIUs. The particular connection possibility matrices are given later herein in table form as are the connection matrix possibilities of the top and bottom RIUs.

In a second invention, each of the individual conductors of the vertical and horizontal buses that pass through the core logic array are segmented into multiple segments by active repeaters. The terms "active repeater" and "active link" mean the same thing and include both unidirectional and bidirectional active devices that can bring gain to bear and which provide no "direct connection" between line segments coupled to the active repeater (as the term "direct connection" is defined later herein-basically it means no direct conductive path for holes or electrons to flow from one line segment to the other through the active repeater). This lack of a "direct connection" provides isolation between the line segments such that the parasitic capacitances coupled to one line segment are not charged by drivers coupled to the other line segment but are charged by the active repeater which separates the two segments. This substantially speeds up performance by reducing delays and rendering the delays more predictable when the routing software does its routing. Because these active repeaters do not provide direct paths by which charge carriers in one line segment coupled to the input of an active repeater can reach parasitic capacitances coupled to line segments coupled to the output of the active repeater and because the active repeater has gain, several advantages flow. First, the lack of a direct connection causes the total parasitic capacitance load of each line segment to be fixed regardless of the programming state of the active repeaters. This means that the drivers coupled to that line segment can be optimized in structure to handle that exact capacitive load since it will not change regardless of how many other line segments are coupled to it to make an interconnect. Second, segmentation means different line segments of the same line can be used to make different interconnects by the routing software. Further, the gain of the active repeaters means that degradation of the signals propagating through a chain of active repeaters can be minimized or eliminated since losses to parasitics can be replaced by energy from the power supply driving the active repeater. A further advantage is achieved by staggering the active repeaters in the vertical and horizontal buses. Staggering the repeaters such as in echelon fashion increases "access", i.e., the number of logic blocks a logic block output can be connected to by passing through only one vertical-to-horizontal active repeater and no repeater boundaries between two line segments on the same line. Higher degrees of access further simplify the routing software. The same techniques of using active repeaters and staggering them are used in the RIUs in the I_lines and O_lines.

BRIEF DESCRIPTION OF THE DRAWINGS

FIG. 1 is diagram illustrating a typical prior art FPGA with passive link structure in the form of an MOS pass transistors.

FIG. 2 is an equivalent circuit showing the parasitic components of the prior art structure of FIG. 1.

FIG. 3 is a cross section of a typical prior art antifuse structure.

FIG. 4 is an equivalent circuit showing the parasitic elements of the prior art antifuse structure of FIG. 3.

FIG. 6A is a circuit diagram of a typical NMOS inverter active link using a saturated MOS transistor for a load resistance.

FIG. 6B is a circuit diagram of a typical NMOS inverter active link using a passive resistor for a load resistance.

FIG. 6C is a circuit diagram of a typical NMOS inverter active link using a nonsaturated MOS transistor operating in the triode region for a load resistance.

FIG. 6D is a circuit diagram of a typical NMOS inverter active link using a depletion mode MOS transistor for a load resistance.

FIG. 7 is a circuit diagram for an active link in the form of an NMOS inverter having push-pull outputs and a tristate circuitry to improve the isolation between the lines to be connected.

FIG. 21 is a more detailed diagram of the programmable connection paths within the core array of logic blocks and showing the columns of input and output lines such as column 350 that exit the core array for connection to the RIUs.

FIG. 24 is a top view of a general integrated circuit layout of the preferred form of the RIU and including the layout of four logic blocks at the edge of the core array.

FIG. 30 is a table showing the input connections of a particular species of left side RIUs.

FIG. 31 is a table showing the input connections of a particular species of right side RIUs.

FIGS. 32A and 32B are tables showing the data output connection possibilities for a particular species of right and left side RIUs, respectively.

DETAILED DESCRIPTION OF THE PREFERRED EMBODIMENT

Figure 5:
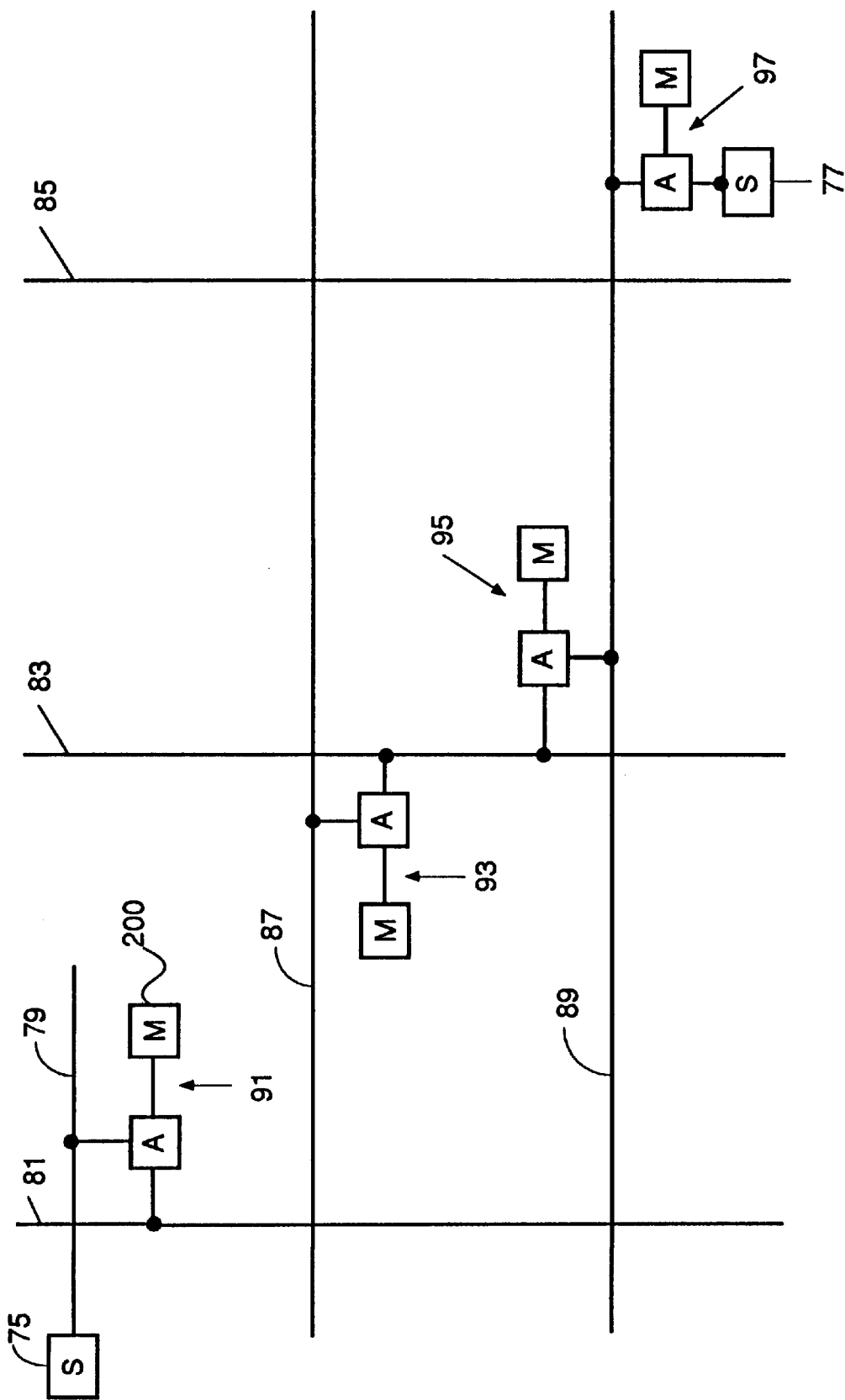
FIG. 5 is diagram illustrating a symbolic structure for a field programmable gate array using the active link technology disclosed herein.

Prior art FPGAs using pass transistor interconnect technology have been slow. The reason for this is because of the interconnect technology. Using standard 0.35 micron line widths, the logic blocks can run at speeds in excess of 200 MHz. The I/O structure speed depends upon the package speed, loading on the pins and output voltage swings, but with a high speed package and good board design, the I/O structure can run at speeds of 100 MHz. This leaves the interconnect structure as the key culprit and bottleneck factor in causing low speed performance of FPGAs.

If all the interconnects that need to be made in a typical FPGA could be made point-to-point, the FPGA could run at 250 MHz. The software that routes the interconnects however cannot make all interconnections point-to-point because of the not fully populated connection matrices of SRAM based FPGAs. As a result, a few of the interconnects are quite long and pass through many programmable pass transistors to make the appropriate switching connections in prior art FPGAs. Each pass transistor in these prior art structures adversely affects the signal propagating on the interconnect by subjecting it to parasitic RC networks to be described below. These parasitic RC networks slow propagation of the signals on these long interconnect "slow nets" enough and act as a bottleneck on the overall speed of the FPGA. Further, the $V_t$ drop of each pass transistor means that there is less and less voltage after each pass transistor to charge up parasitic capacitances which further slows down propagation over the degradation due to the RC time constants alone. Speeding up the fast nets (point-to-point connections) does not increase performance, but speeding up these slow nets will increase performance. The active repeaters disclosed herein will speed up the slow nets.

Referring to FIG. 1, there is shown a diagram of a typical field programmable gate array of the type using prior art passive links in the form of pass transistors such as is typically found in Xilinx FPGAs. To implement a desired function in this prior art FPGA, the output of a first standard cell 10 needs to be coupled to the input of a second standard cell 12. The FPGA integrated circuit has a matrix 14 of intersecting conductors on different layers which are insulated from each other. The conductors on one layer are symbolized by the vertical lines 16, 18, 20 and 22, while the conductors on another layer are symbolized by horizontal lines 24 and 26. To make the desired connection, 5 passive MOS "pass" transistors 28, 30, 32, 34 and 36 are programmed to make connections between various of the conductors in matrix 14. Pass transistor 28 is programmed to make a connection between the output 38 of standard cell 10 and matrix conductor 16. This is done by programming a logic 1 (or logic 0 depending upon the type of MOS transistor technology used for the pass transistors and logic levels) into memory cell 40.

Likewise, pass transistor 30 is programmed to make a connection between lines 16 and 24 by programming a logic 1 into memory cell 42. Pass transistor 32 is programmed to make a connection between lines 24 and 18 by programming a logic 1 into memory cell 44, and pass transistor 34 is programmed to make a connection between lines 18 and 26 by programming a logic 1 into memory cell 46. Finally, pass transistor 36 is programmed to make a connection between line 26 and the input 22 to standard cell 12 by programming a logic 1 into memory cell 48.

Because pass transistor 50 is not needed to make the connection between standard cell 10 and standard cell 12, it's memory cell 52 is programmed with a logic 0 so that no connection is made between line 16 and line 26 (unless this connection is needed as part of another conductive path between two different standard cells.

Memory cell 40, like all the other memory cells symbolized by an M in a box on the drawing, is typically a 6 transistor CMOS static RAM cell, and usually is part of a shift register (not shown) which snakes through the integrated circuit layout. This shift register contains the programming bits needed to control each pass transistor as well as any enable transistors in the standard cells. In alternative embodiments, the memory cells such as memory cell 40 can be stand alone memory cells coupled by shared data, address and control lines that go to each cell or memory cells grouped into a memory array having shared data input, address and control lines and coupled to the individual pass transistors by individual data output lines. the first layer The arrangement shown in FIG. 1 has disadvantages in that it slows down operation of the FPGA. The reason for this can be understood by reference to FIG. 2 which is an equivalent circuit for the electrical path between the output line 38 of standard cell 10 and the input line 22 of standard cell 12. The resistor and capacitor inside dashed line 28 represent the parasitic components of pass transistor 28 which affect propagation on the line. The resistor 54 represents the channel resistance of the pass transistor 28, and is typically 1000 ohms. The capacitor 56 represents the parallel summation of the parasitic gate-to-source, gate-to-drain, gate-to-substrate and line-to-substrate capacitances of the lines to and from each pass transistor source, drain and gate terminal. The combination of series resistor 54 and shunt capacitor 56 represent a low pass RC filter that shunts high frequency components of the high speed data signal to the substrate and causes delay in the rise times of fast pulses in accordance with the RC time constant of the filter.

Loss of high frequency components caused by these RC low pass filters, and the RC delay factor tends to soften the edges of rectangular pulses and spread them out. This decreases the slope of the edges of high speed rectangular pulses thereby increasing rise times. For example, consider high speed data input pulse 58 which will be assumed to be 10 nanoseconds in width. The pulse looks line pulse 60 after passing through the first low pass filter of pass transistor 28 and continues to degrade in both amplitude and pulse width as it propagates through each pass transistor, as represented by pulses 62 and 64.

Pass transistor interconnect suffer from the tradeoff between size and low turn-on resistance. Large size is not good because there are hundreds of thousands of pass transistors in the typical prior art gate array, and large size increases the die size and lowers yield and leaves less room for standard cells in the core array and interconnect lines. However, small size in a pass transistor, although it decreases its parasitic capacitance, also increases its parasitic turn-on resistance. Pass transistors also do not scale with technology. If a pass transistor is shrunk, its area and device capacitance are reduced, but its resistance stays constant because of voltage scaling. A third disadvantage of pass transistors is that the transistor of choice is a single n-channel device. Because of this, a $V_T$ drop is encountered when a signal crosses a pass transistor. This starts to become a major disadvantage at technologies below 0.35 microns. As the supply voltage drops, there is less voltage across the pass transistor meaning less current. This causes designers to change their design goals to only maintain performance as opposed to improve it as linewidths shrink. In the prior art, designers have attempted to solve the pass transistor's problems using a hierarchy of lines that span different numbers of logic blocks in the core array. Other efforts have focussed on use of charge pumps to increase the gate voltage to lower the "on" resistance. Charge pumps become more difficult to implement at lower gate lengths because of the ever reducing thickness of gate oxides. These prior art attempts have made incremental improvements, but no great leap forward in performance.

Each MOS pass transistor such as transistors 28, 30, 32, 34, 36 and 50 operates in common gate mode. MOS devices operating in common gate mode exhibit no gain. Such passive devices are not coupled to any power supply so they supply no energy to replace the energy dissipated in the series resistance of the MOS device channel and the energy of the high frequency components siphoned off to the substrate through the parasitic shunt capacitances. This is the cause of the degradation of the amplitude and pulse width of the pulses 62 and 64.

Other FPGA companies use different forms of passive links called antifuse technology. A typical antifuse structure cross-sectional diagram is shown in FIG. 3. In an antifuse FPGA structure, a first plurality of conductors are formed on a first conductive layer, one line of which is represented by metal layer 66. A second plurality of conductors are formed on a second conductive layer which is insulated from the first conductive layer. This second plurality of lines is represented by metal layer 68. At the intersection of each line on the first layer with a line of the second layer, an antifuse structure like that shown in FIG. 3 is formed. In each antifuse structure, the two conductive layers 66 and 68 are separated from each other by an insulating layer 70 which is typically polysilicon. The polysilicon layer has a gap etched through it to form a via from the metal layer 66 to the metal layer 68. Metal from layer 66 fills in this via. The via has a layer of nitride 72 formed therein to separate and insulate the metal of layer 66 from the metal of layer 68.

To make a connection between metal line 66 and metal line 68, a 10 volt programming signal is applied to metal line 66 relative to metal line 68. This voltage exceeds the breakdown voltage of the nitride layer 72 and causes punch through by arcing wherein molten metal from layer 66 fills a hole in nitride layer 72 caused by the arc and makes electrical contact with metal layer 68. This punch through metal has a parasitic series resistance associated with it and the lines themselves have parasitic capacitance to the substrate.

The equivalent circuit for the structure of FIG. 3 is as shown in FIG. 4. Again, the equivalent circuit is comprised of a series resistance 74, which is typically 300 ohms, and a shunt capacitance 76 which is comprised of the parallel combination of the parasitic capacitance of the fuse plus the parasitic capacitance of the lines to and from the fuse. This RC combination again defines a low pass filter which siphons off high frequency components of the high speed data to ground.

The antifuse technology suffers from the same deficiency of the passive MOS pass transistor in that the successive RC delay factors and loss of high frequency components to ground through the shunt parasitic capacitances rounds off the corners of high speed rectangular data pulses, spreads out the width of the pulses and increases the rise time.

Although the antifuse technology has less parasitic resistance and shunt capacitance than a passive, common gate MOS pass transistor, it also suffers from the additional infirmity of not being scaleable down to today's extremely small design rules. When an antifuse FPGA structure is scaled down to today's 0.35 micron design rules, the structures on the FPGA get so small that they do not have sufficient breakdown voltage protection to withstand voltages greater than 3 volts. This means that application of a 10 volt programming voltage to a programming line can cause arcing and punch through at places where not arcing or punch through is intended thereby causing shorts or destroying devices or both.

Active devices such as MOS and bipolar transistors and other active devices are much more easily scaleable than antifuse technology, so active devices capable of amplification are used for the switches of active links according to the teachings of the invention.

Referring to FIG. 5, there is shown a diagram of a FPGA according to the teachings of the invention using active link technology which is more readily scaleable and which does not degrade the speed of the chip as much as passive links. In the symbolic example of FIG. 5, two standard cells, logic gates or other circuitry 75 and 77 need to have a conductive path formed therebetween in order to implement some function desired by the user. When the integrated FPGA circuit is manufactured, it is manufactured with a plurality of standard cells of various designs, a plurality of logic gates, registers, multiplexers, ALUs etc. thereon. The boilerplate circuits can be any collection of known circuits and some FPGA chips intended for use in a particular field may have a different collection of boilerplate circuits than other FPGA circuits intended for use in another field of use. In the claims, these standard "boilerplate" circuits are referred to as standard cells, logic gates or other circuitry.

The FPGA chip after manufacture also has formed thereon a connection matrix, crossbar switch or some other form or arrangement of conductors and active links which is coupled to the boilerplate circuits and which can be programmed to make the desired connections between the boilerplate circuits to implement the desired functionality. In FIG. 5, the connection matrix is represented by conductors 79, 81, 83, 85, 87 and 89 and the associated active links represented by boxes with the letter A inside them. The boxes with the letter M inside them represent memory cells in which are stored bits which define whether the particular active link presents a high impedance path between the circuit nodes between which is connected or a low impedance path. The term active link in the claims means both the switching circuit represented by the boxes with the letter A inside as well as the memory cell or other circuitry by which the switching circuitry is either turned off or turned on at the choice of the user to make the necessary connections to implement the desired functionality. Typically, the control signals needed to control the switching circuits of the active links are supplied by memory cells which are loaded with logic bits by means of a shift register (not shown) of which each memory cell typically is a part and which snakes throughout the FPGA chip. To program the FPGA to any particular functional configuration, this shift register is loaded with thousands of bits in a particular sequence so all the desired connections are made in the connection matrix.

The exact nature of the switching circuits of the active links can vary, but all the different embodiments for active link switching circuits share the common characteristic of having a gain of approximately one or more so as to not degrade the speed of operation of the FPGA when a signal traverses a long chain of active links. One way of looking at the active links is that they have the capability of replacing energy lost to the substrate through parasitics from the signal propagating through a long chain of active links. Of course, a competitor might conclude that if he makes an active link with a gain of 0.9, he could escape infringement while still enjoying a speed advantage over the prior art passive link FPGAs. The phrase "having a gain of approximately one or more" is not intended to limit the gain of an active link according to the teachings of the invention to exactly one or higher. Instead this phrase is intended to indicate that an active link according to the teachings of the invention will have sufficient gain to not seriously degrade the rise times of signals propagating of a long chain of, for example, 10 active links to the extent such rise times are degraded in propagating through a chain of, for example, 10 passive links of the prior art.

A connection matrix according to the teachings of the invention is characterized by a plurality of conductors which are electrically insulated from each other such as conductors 79, 81, 83, 85, 87 and 89 in FIG. 5. A plurality of programmable electrical connections between selectable combinations of these conductors is implemented using a plurality of active links. In the example of FIG. 5, a programmable, easily reconfigurable data path between standard cell 75 and standard cell 77 is implemented by properly programming active links 91, 93, 95 and 97. Active link 91 is programmed by writing an appropriate bit into its memory cell to causing the switching circuit to form a low impedance path between conductors 81 and 79. Likewise, active link 93 connects conductors 87 and 83 and active link 95 connects conductors 83 and 89 and active link 97 connects conductor 89 and standard cell 77.

A process for forming a field programmable gate array circuit similar to that shown in FIG. 5 comprises forming the boilerplate circuitry on the die using any integrated circuit fabrication process compatible with the technology in which the boilerplate circuits are to be implemented. Then a connection matrix of conductors is formed using the same process such that the conductors are electrically insulated from each other. Then a plurality of active links are formed at locations so as to be able to make programmable connections between at least some of the conductors in the matrix and between input and output nodes of the boilerplate circuits and at least some of the conductors of the connection matrix.

An important feature of the invention is therefore to guide signals along data paths of a field programmable gate array in such a manner so as to prevent degradation of the rise or fall times of the signal to the same degree as the degradation of these rise or fall times should the same signal propagate through a like number of passive links in a prior art field programmable gate array. This is done by applying sufficient gain at each active link to prevent degradation in the rise or fall times of the signal comparable to that which would occur if the same signal were to propagate through the same number of antifuse or common gate type MOS device passive links such as are found in the prior art field programmable gate arrays.

Figure 10:
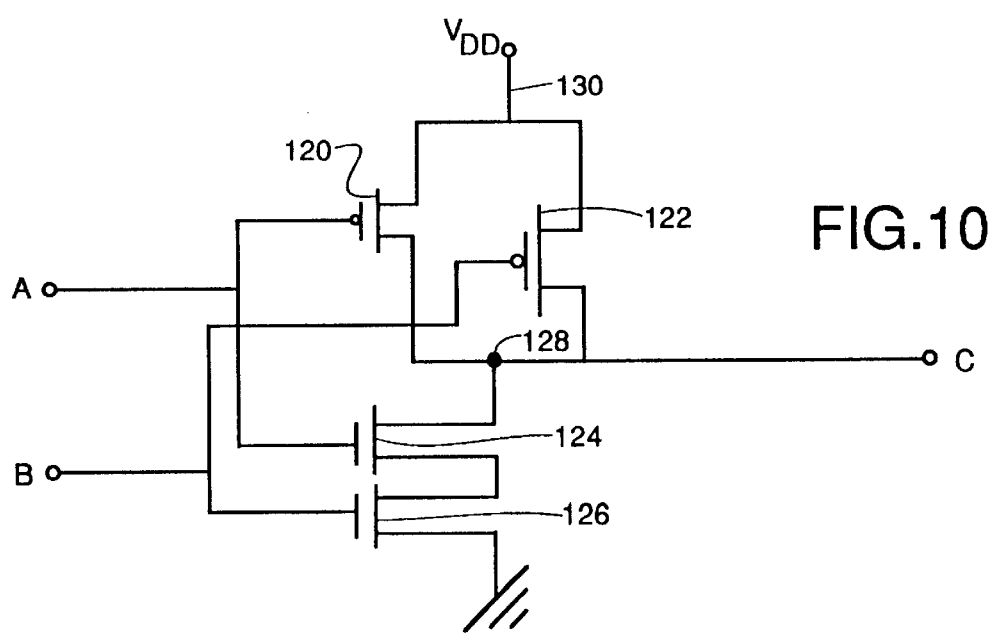
FIG. 10 is a circuit diagram of a CMOS implementation of a NAND gate.

FIGS. 6A through 6D are examples of MOS inverter circuits, and FIG. 10 is an example of a CMOS AND gate that could be used to implement the switching circuit of an active link according to the teachings of the invention. FIG. 7 is an example of an NMOS inverter with a push-pull output stage and tristate circuitry that also could be used to implement an active link according to the teachings of the invention. The examples of FIGS. 6A through 6D were taken from the treatise Ong, *Modern MOS Technology, Processes, Devices and Design,* Section 9-2, pp. 189–197 (McGraw Hill 1984) ISBN 0 07-047709-4, the entire contents of which is hereby incorporated by reference. In the particular example of FIG. 6A, an MOS inverter transistor 82 has as a load a saturated MOS device and is set up to apply a gain of approximately one or greater to the input signal. Lines 78 and 80 are the conductors in the connection matrix to be connected through the active link. The connection is controlled in programmable fashion by the logic level on an enable signal EN on line 86 coupled to the gate of enabling MOS transistor 88. The enable signal EN comes from the associated memory cell containing the programming bit or from another source of enable signals that defines the desired functionality of the chip. The high rail voltage defining a logic 1 level is on line 90, and the low rail voltage defining a logic 0 level is on line 92. Thus, even if the gain of the inverter is greater than one, the logic level of the signal output from a chain of such active links can never rise higher than the logic one level defined by the voltage on the high rail 90.

FIG. 6B is an example of an MOS inverter active link using a passive resistor load 94, and enabled by an enable signal EN on line 86 coupled to MOS device 88. All the considerations mentioned above with regard to the switching circuit of FIG. 6A apply equally to the switching circuits of FIGS. 6B, 6C and 6D, so only the differences in the switching circuits will be described below.

FIG. 6C is an example of an MOS inverter active link using a nonsaturated MOS device 96 for a load operating in the triode region. In this embodiment, the enable signal EN is a voltage higher than the high rail voltage on line 90 when the device is to be enabled so as to force MOS device 96 into the triode region. EN is low so as to cut off transistor 96 when the device is to be disabled. Any circuitry to convert the logic one level of the enable signal from the memory cell to the appropriate voltage to place the inverter in the triode region will suffice to practice this embodiment according to the teachings of the invention.

FIG. 6D is an example of an MOS inverter active link using a depletion mode MOS device 100 as a load. As is the case for the embodiments of FIGS. 6A, 6B and 6C, the inverter is enabled and disabled in a programmable fashion by application of an enable signal EN on line 86 from an associated memory cell or other source to an MOS device 88. In one logic state of EN, the MOS device 88 couples the source of the transistor 82 to the low rail 92 to enable the device. In the other state of EN, transistor 88 is cutoff thereby disabling the device by decoupling the source of transistor 82 from the low rail.

All of the MOS inverter embodiments for active links in FIGS. 6A through 6D, when disabled, present a degree of isolation between the input line 78 and the output line 80 which may be sufficient in some applications and insufficient in others. When the inverters are disabled, the input line 78 is coupled to the output line 80 by the gate-to-drain parasitic capacitance of the inverter transistor 82. This small capacitance should provide sufficient isolation for all but the highest frequency data signals. However, high speed data signals having a frequency so high that inadequate isolation is provided by this gate-to-drain parasitic capacitance are not likely to be used with the MOS inverter active links shown in FIGS. 6A through 6D. This is because these active links directly couple MOS devices to the high speed signal path thereby slowing the signal down because of the effects of the parasitic components inherent in each MOS device. With high speed data, the biCMOS differential current mode logic active links disclosed later herein are preferred, because the MOS devices in those active links are not coupled to the high speed signal path. Therefore, the MOS inverters of FIGS. 6A through 6D are likely to provide adequate isolation when disabled for low speed data FPGAs.

If a higher degree of isolation is desired for low speed or some higher speed FPGAs, the active links can simply be bipolar, CMOS or MOS tristate buffers of the type which are well known in the art. An active link of the tristate buffer type will have its data input coupled to conductor 78 and its data output coupled to line 80. The enable signal on line 86 will be coupled to the tristate control input of the tristate buffer. When the enable signal is in a logic state to disconnect line 78 from line 80, the tristate buffer will be put in a tristate mode wherein line 80 sees an essentially infinite impedance.

FIG. 7 is an example of a noninverting MOS tristate buffer taught in *Modern MOS Technology*, pp 217–8 which is used as an active link in low speed FPGAs according to the teachings of the invention. An NMOS transistor 102 forms a basic MOS inverter with depletion mode load transistor 104. This inverter is coupled through tristate circuitry to a totem pole push-pull driver comprised of NMOS transistors 106 and 108. The reason for the totem pole output driver is that use of a simple inverter to drive output loads which are usually capacitive will result in uneven rise and falltimes. This can possibly be remedied by increasing the load transistor size to improve the risetime, but this inordinately increases DC power consumption and the area of the inverter. The push-pull driver of FIG. 7 remedies this problem because when the output pull-down transistor 108 is turning on, the pull-up device 106 is simultaneously turning off. This ratioless configuration allows individual tailoring of device sizes for symmetrical waveform preservation.

Tristate operation can be achieved for the active link of FIG. 7 by raising the enable signal EN on line 86 to a logic 1. In this state, output lead 80 is isolated from both the high and low rails 90 and 92 by high impedances. This high impedance state is achieved when both output devices 106 and 108 are turned off by activation of the enable signal EN. When EN is activated, tristate NMOS transistors 110 and 112 turn on thereby grounding the gates of output transistors 106 and 108. Simultaneously, transistors 114 and 116 are turned off by EN* (the complement of EN) going to logic zero. This cuts off the gates of transistors 106 and 108 from their connections to the input line 78 and the output node 117 of the inverter, respectively.

Figure 8:
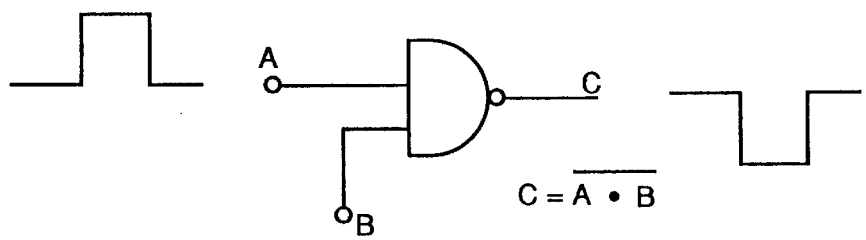
FIG. 8 is a circuit diagram for an active link in the form of a NAND gate.
Figure 9:
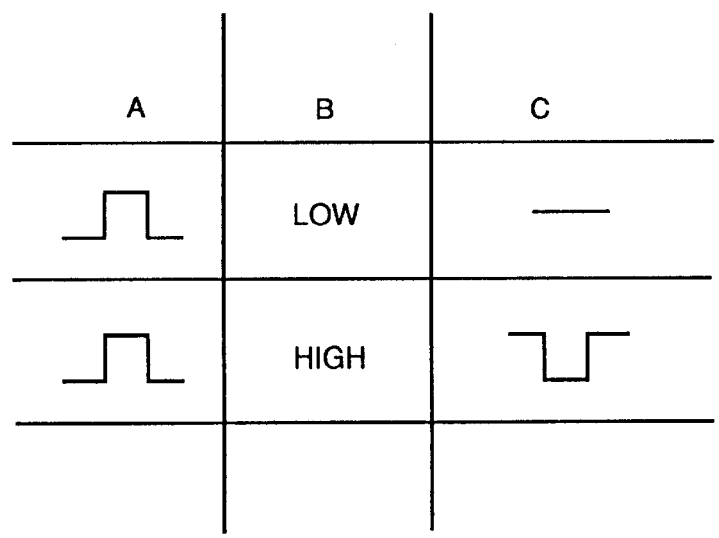
FIG. 9 is a truth table showing how the NAND gate of FIG. 7 is used as an active link.

One of the simplest forms an active link according to the teachings of the invention can take is a NAND gate of FIG. 8. This gate has A and B inputs and a C output. To use a NAND gate as an active link, the A input is connected to one of the conductors of the connection matrix to be connected and the C output is connected to another to be connected. The B input is connected to receive the enable signal which controls in programmable fashion whether the connection is or is not made. The truth table of FIG. 9 shows how A and C are selectively coupled under the influence of the enable signal B.

Of course NAND gates come in many different implementations some of which may be passive. Any NAND gate implementation capable of connecting two or more lines together in programmable fashion and having a gain of at least approximately one (or enough to provide a significant improvement in degradation of rise and fall times characteristic of propagation through chains of passive links) will suffice to practice the invention. The circuit of FIG. 10 is one implementation of a NAND gate which can be used to implement an active link.

In the FIG. 10 CMOS implementation of a NAND gate to practice the invention, PMOS transistors 120 and 122 are connected in parallel and have their gates coupled to receive the A and B signals, respectively. Two complementary NMOS transistors 124 and 126 connected in series between common source node 128 and ground or the low voltage source also have their gates coupled to receive the A and B signals. When B is high, the connection between A and C is enabled, and transistor 126 is turned on and transistor 122 is turned off. Thus, when A goes high, transistor 124 turns on and transistor 120 turns off thereby grounding the common source node 128 which is coupled to output C. When A goes low, transistor 120 turns on and transistor 124 turns off thereby coupling output C to the high voltage reference 130 making output C a logic high. Because the NAND gate of FIG. 10 is an inverting gate, an even number of gates must be used to make the connections between standard cells to be connected.

In applications where more isolation is needed between the A and C lines than the CMOS devices provide, a tristate buffer can be added immediately after the switch.

Figure 11:
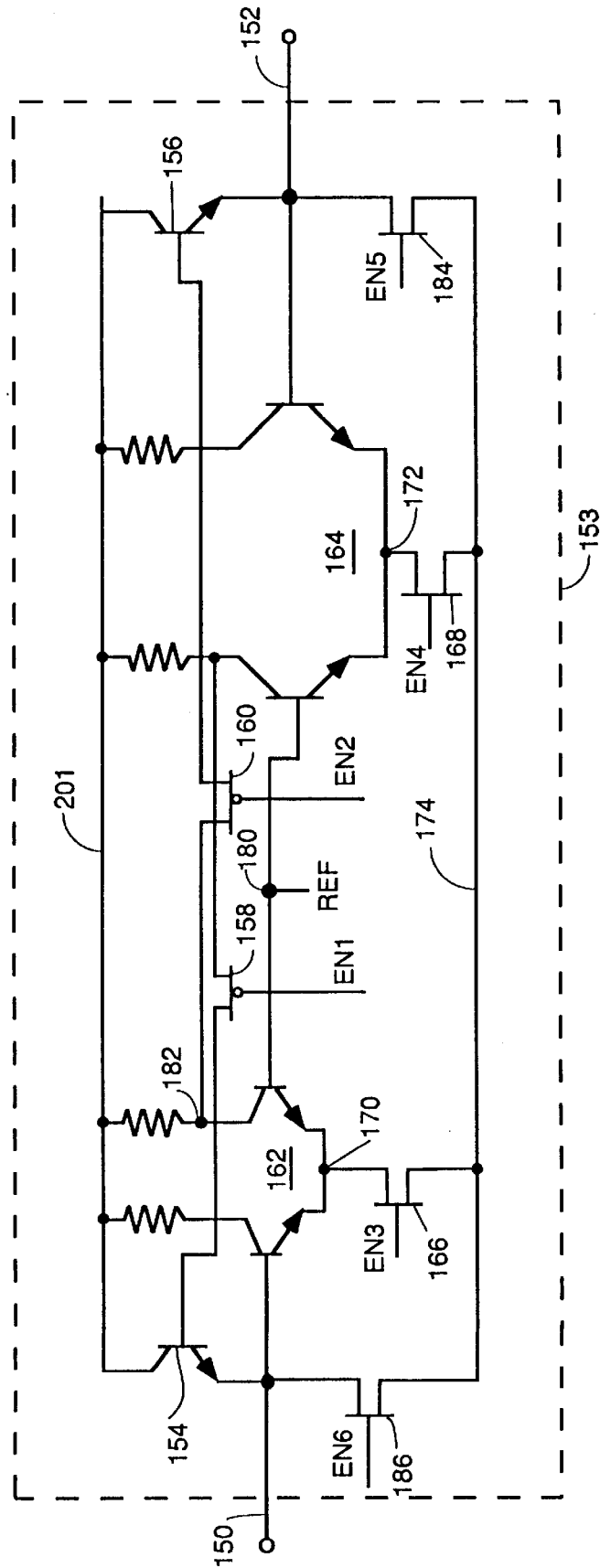
FIG. 11 is a bidirectional, high input impedance active link design using emitter followers to provide high input impedance.

Referring to FIG. 11, there is shown another circuit diagram for a preferred form of active link which can make buffered connections between two lines in a connection matrix. An advantage of the active link of FIG. 11 is that the deleterious effects of the series parasitic resistance and shunt parasitic capacitances of passive links in the prior art are reduced or eliminated and gain of approximately one or more can be applied to high speed signals propagating through the active link. This reduces the deterioration of rise and fall times of high speed signals as they propagate through a series of active links.

In the active link of FIG. 11, three different scenarios can be implemented depending upon the state of the enabling signals. They are:

1. line 150 isolated from line 152;
2. line 150 drives line 152;
3. line 152 drives line 150.

Which of these scenarios is implemented depends upon the programming of the enable signals transmitted into the circuitry inside box 153.

In case 1, NPN transistors 154 and 156 coupled as emitter followers are both disabled by programmable switches in the form of PMOS devices 158 and 160. All the MOS enabling transistors in FIG. 11 are referred to in the claims as programmable switches, but other programmable switching devices could be substituted. The PMOS devices are both turned off by virtue of the enable signals EN1 and EN2 both being high. In addition, current-mode, common emitter node current switches 162 and 164 are both disabled by virtue of the enable signals EN3 and EN4 being low. This causes NMOS devices 166 and 168 to be turned off thereby disconnecting the common emitter nodes 170 and 172 from the low rail voltage supply 174. No power is consumed in this state, and lines 150 and 152 are isolated and undriven.

The low rail conductor 174 and a high rail conductor 201 are coupled to a voltage source for development of a potential difference therebetween.

In case 2, the current switch 162 is enabled by driving enable signal EN3 high thereby turning on NMOS device 166 to connect common emitter node 170 to the low rail 174. Current switch 164 remains disabled by virtue of enable signal EN4 remaining in a logic 0 state thereby pinching off the channel in NMOS device 168. Emitter follower 154 is turned off because PMOS device 158 is off by virtue of enable signal EN1 being high. In this state, if the voltage of the input signal on line 150 is above the voltage of the reference voltage REF at node 180, then emitter follower 156 will drive output line 152 in accordance with the signal on line 150 by virtue of being coupled to the output node 182 of current switch 162 through PMOS device 160. In order for this to happen, the enable signal EN2 is driven low thereby turning on PMOS device 160, and enable signal EN5, and enable signal EN5 is driven high so as to turn on NMOS device 184 so as to enable the emitter follower 156 by connecting line 152 to ground. Enable signal EN6 is low in this mode thereby pinching off the channel of NMOS device 186. The structure of NMOS devices 186 and 184 and 166 and 168 is such that when their enable signals are high, the on resistance of the device supplies sufficient emitter feedback for their respective current switches or emitter followers to work. The on resistance of devices 186 and 184 should however be low enough that the RC time constant of this on resistance coupled to the parasitic capacitance of lines 150 or 152 as the case may be is sufficiently low so as to not substantially degrade the rise time of the high speed data signals propagating through the active link.

If the input signal at line 150 is below the reference voltage REF at node 180 in case 2 operation, then current flow through the emitter follower 156 and NMOS device 184 pulls line 152 down to a logic zero level.

Operation in case 3 is similar but reversed to operation in case 2. In this case, line 152 drives line 150 through emitter follower 154. In case 3, the enable signal EN4 is high, and enable signal EN5 is low. Enable signal EN6 is high so as to enable emitter follower 154, and enable signal EN1 is low so as to turn on PMOS device 158. Enable signal EN2 is high so as to turn off PMOS device 160 thereby disconnecting emitter follower 156 from current switch 162. In this state, when the signal on line 152 is higher than the reference voltage REF (set between logic 1 and logic 0 levels), emitter follower 154 drives output line 150 high. When the signal on line 152 is below the voltage of the reference voltage REF, emitter follower 154 pulls line 150 low.

The active link switching circuit of FIG. 11 has 6 different enable signals the logic states of which control in which of the three states the active link operates. These enable signals EN1 through EN6 may be supplied from 6 separate memory cells like memory cell 200 in FIG. 5, or they may be supplied by any other means which allows programmability of the FPGA active links to operate as desired.

An advantage of the active link of FIG. 11 is that it does not load whatever driving device is coupled to it, and this is true regardless of whether line 152 is driving line 150 or line 150 is driving line 152. In either mode, the driving device sees the essentially infinite input impedance of an emitter follower buffer. In the mode where line 150 is driving line 152, the driving device sees the high input impedance of emitter follower 156. In the mode where line 152 is driving line 150, the driving device sees the high input impedance of emitter follower 154.

Figure 12:
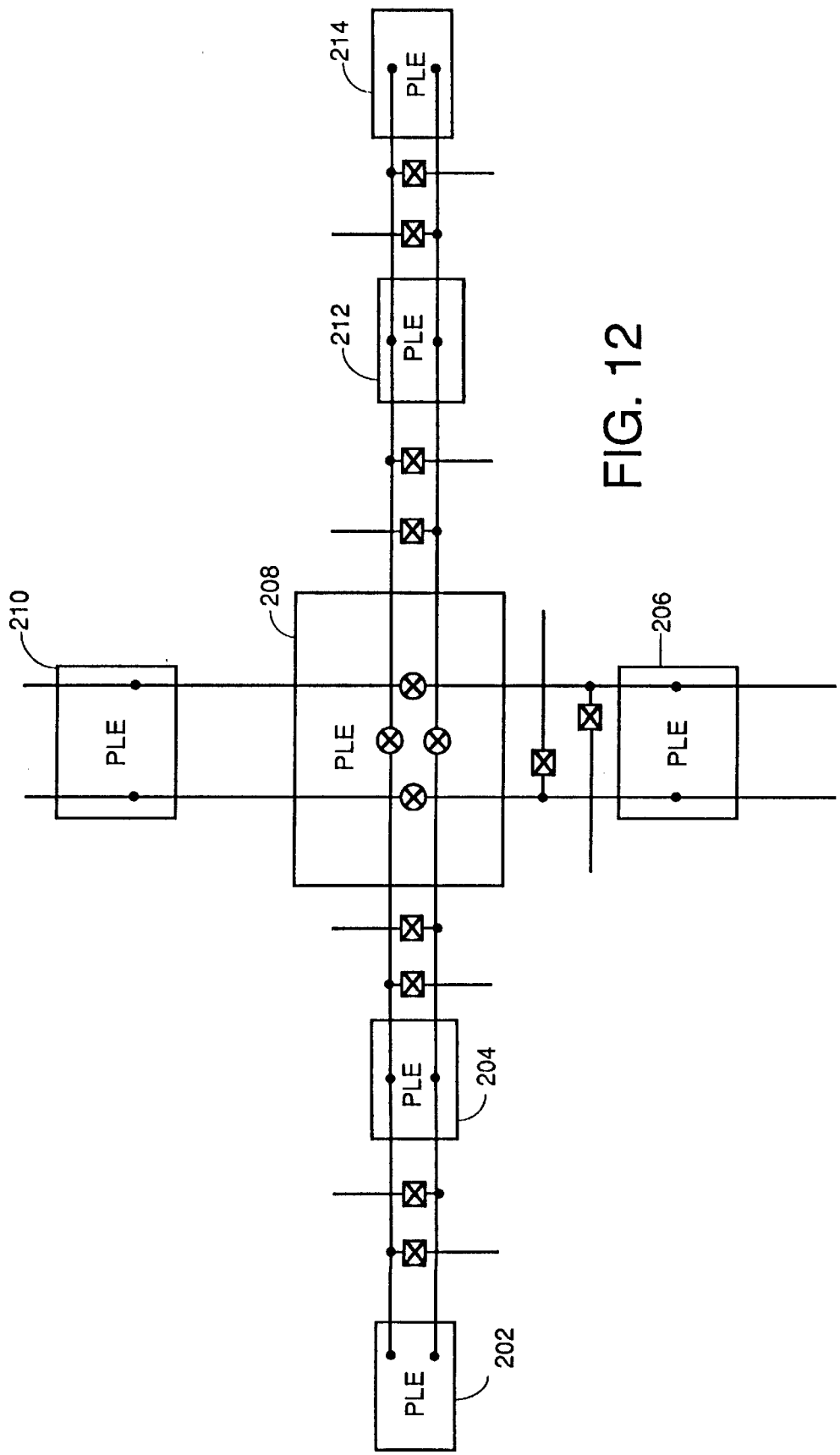
FIG. 12 is a symbolic diagram of an FPGA using both long range and short range active links.

A useful FPGA architecture using the active link teachings of the invention is shown in FIG. 12. In this symbolic arrangement, programmable or nonprogrammable logic elements 202, 204, 206, 208, 210, 212 and 214 are programmably connected to each other and other devices elsewhere on the integrated circuit die. These connections are made by active links designated by the circles and boxes with Xs inside them. The active links shown as Xs inside circles inside PLE 208 are short range active links suitable for driving short lines coupling a PLE to it nearest and next nearest neighbors. Examples of the types of active link circuits disclosed herein which could be used for such short range active links are any of the active link circuits disclosed herein with short line drive capability such as the NMOS inverters, NAND gates etc.

To account for situations where signals must connect to devices that are not neighbors, the active links symbolized by Xs inside boxes are provided. These active links are designed to drive longer lines to enable connection of signals between circuits separated by as much as the entire width or length of the integrated die. An example of good long range active link designs are the NMOS inverter with totem pole, push-pull driver stage shown in FIG. 7 or the programmably bidirectional active link with emitter follower output stages of FIG. 11.

The significance of using two different types of active links on an FPGA is that each different type of active link will have different parasitics, different delay characteristics, different power requirements and different input and output impedances and different complexity in terms of the number of devices needed, the number of programming bits needed and the amount of chip area consumed. Some of these active links will be better than others for driving short lines and some will be better for driving long lines. Since most FPGA layouts have standard cells or logic circuits connected to neighboring circuits, it is beneficial to have at least two different types of active links and use the short range ones for most link sites and only use the bigger, more complex active links where absolutely necessary to drive long lines.

This allows high speed signals to propagate at much higher speeds than in the prior art. The reason is that the gain in the active link and/or the energy supplied to the propagating signal by each active link as it passes through the active link replenishes energy dissipated in parasitic resistance or lost to the substrate through shunt parasitic capacitance thereby arresting or reducing the amount of deterioration of signal rise times as a signal propagates across the chip. The circuit of FIG. 7 is well adapted for use as the long range active links because of the totem poll, push-pull output stage.

Figure 13:
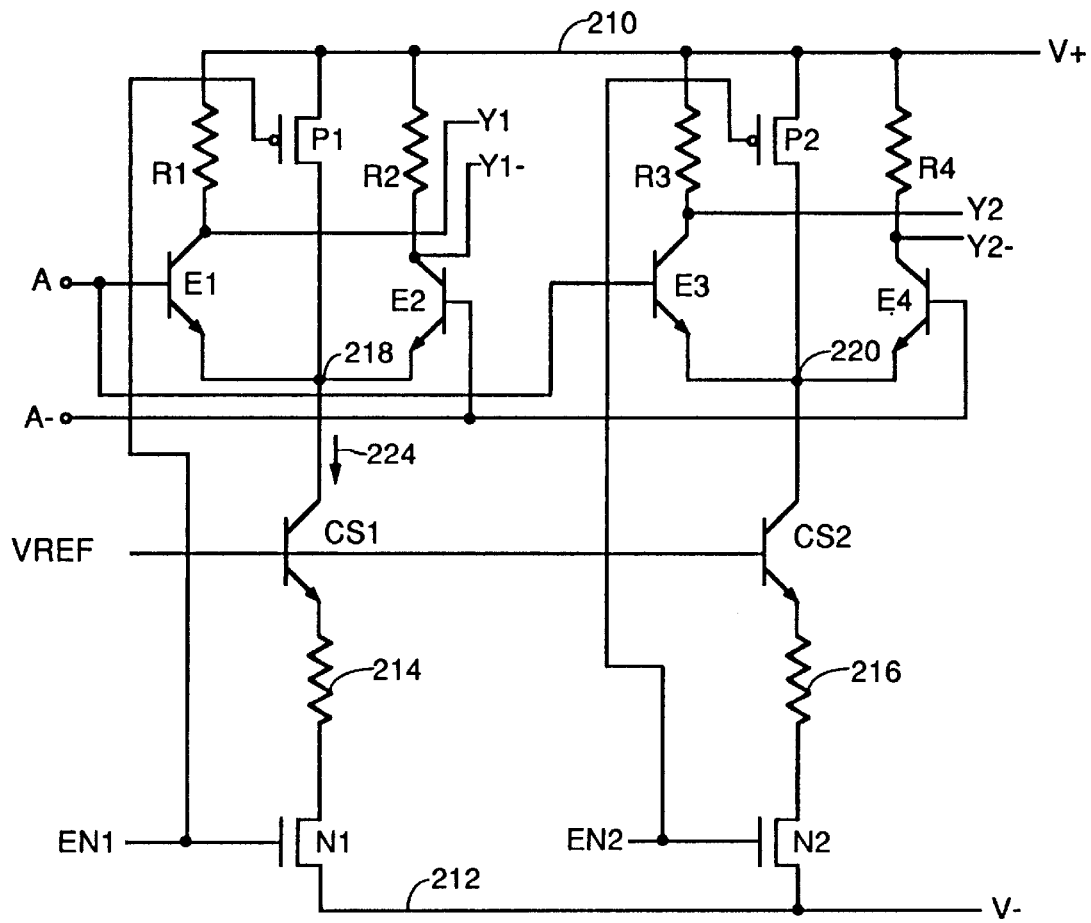
FIG. 13 is a circuit diagram of an active link in the form of a biCMOS, differential, current-mode, one-input-two-output multiplexer.

Referring to FIG. 13, there is shown a circuit diagram for a one-input-two-output multiplexer embodiment of an active link suitable for use in implementing programmable logic circuitry that must process very high speed signals. In the embodiment shown in FIG. 13, emitter-coupled-logic (ECL) circuitry is used in the data path, and CMOS circuitry is used for steering the input signals from the inputs to one or more of the outputs. In other embodiments, other fast technologies may be used in the data path such as bipolar, Josephson junction, ballistic effect devices etc. The data inputs for high speed data are shown at A and A-. These two inputs are coupled to two ECL differential pairs comprised of a first pair of transistors E1 and E2 and a second pair of transistors E3 and E4. Transistors E1 and E2 have load resistors R1 and R2, respectively. Transistors E3 and E4 have load resistors R3 and R4, respectively. The first data input A is coupled to the bases of ECL transistors E1 and E3. The complementary data input A- is coupled to the bases of ECL transistors E2 and E4. The collectors of the E1 and E2 pair are coupled to the Y1 and Y1- outputs, respectively. The collectors of the E3 and E4 pair are coupled to the Y2 and Y2- outputs, respectively. Each of the ECL transistors is coupled to the high voltage supply rail 210 via a collector load resistor where R1 is the load resistor for transistor E1 and R4 is the load resistor for E4 etc.

The emitters of transistors E1 and E2 are coupled so as to share a common constant emitter current regulated by current source transistor CS1, and the emitters of transistors E3 and E4 are coupled so as to share a common constant emitter current regulated by current source transistor CS2. The bases of these two current source transistors are coupled to a reference voltage VREF, and the emitters are coupled to the low voltage supply 212 through emitter feedback resistors 214 and 216 and through NMOS steering transistors N1 and N2. The gate terminals of transistors N1 and N2 are coupled to enable signal lines EN1 and EN2, respectively. These two enable signal lines are also coupled to two PMOS steering transistors P1 and P2, respectively, which are coupled between the high voltage supply 210 and the common emitter nodes 218 and 220.

The operation of the circuit of FIG. 13 is as follows. The fundamental purpose of the circuit is to steer the signals in the data path on complementary signal lines A and A- onto one or both of the complementary output signal pairs Y1/Y1- or Y2/Y2- without substantially degrading the rise or fall times of the high speed signal so as to implement a one-input-two-output multiplexer type active link. This is done using the EN1 and EN2 enable or steering signals from associated memory cells and the CMOS steering transistor pairs N1/P1 and N2/P2, the CMOS steering transistors being outside the data path so as to not expose the high speed data to the effects of the parasitic resistance and capacitance of the CMOS devices. Those skilled in the art will appreciate that the concept illustrated in the circuit of FIG. 13 can be extended to more outputs than two and can be reversed to steer input signals on one of a plurality of inputs onto a single output.

Assuming now for illustration that the EN1 enable signal is active, i.e., high. This causes the steering transistor N1 to conduct thereby connecting the steering transistor N1 to the low voltage power supply and causes the steering transistor P1 to be nonconductive. This has the effect of activating the output pair Y1 and Y1- by enabling the current source CS1 to draw the fixed current represented by arrow 224 out of node 218. Current source transistor CS1 stabilizes the current flow out of node 224 by virtue of the negative feedback to the emitter caused by emitter resistor 214 as is well-known in the art. Because transistor P1 is nonconductive, the common emitter node 218 is not held at the voltage of the high voltage supply 210, and the ECL transistors E1 and E2 are free to drive the outputs Y1 and Y1- as an ordinary current mode logic buffer/inverter under the influence of whatever data signals are present on the data inputs A and A- as in normal ECL differential mode operation. If the EN2 steering signal is not active, i.e., low, simultaneously with the active high state of the EN1 steering signal, the Y2 and Y2- outputs are deactivated. This results from the fact that the steering transistor N2 is not conductive thereby disabling the current source transistor CS2 from drawing current from common emitter node 220. When steering signal EN2 is low, the PMOS steering transistor P2 is conductive thereby driving the common emitter node 220 to the voltage of the high voltage source 210. This affirmatively reverse biases the base-emitter junctions of the ECL transistors E3 and E4 rather than leaving the common emitter node 220 floating so as to positively cut off the E3 and E4 transistors and prevent any signal leakage from the inputs A and A- to the outputs Y2 and Y2.

In some embodiments where this positive cutoff of the ECL transistors of the pair associated with whatever steering signal EN1 or EN2 is low, is not necessary and a floating common emitter node 218 or 220 provide adequate isolation between the input and output when the associated current source is not active, the PMOS transistors P1 and P2 can be eliminated.

If the enable signal EN2 is high, the NMOS steering transistor N2 is conductive and the PMOS steering transistor P2 is rendered nonconductive. This has the effect of activating the two outputs Y2 and Y2- by connecting the current source transistor CS2 to the low voltage supply thereby causing the transistors E3 and E4 to drive the outputs Y2 and Y2- in accordance with whatever data signals are on the A and A-data inputs. This is true regardless of whether steering signal EN1 is simultaneously active high. If EN1 is simultaneously low when EN2 is high, steering transistor N1 is nonconductive and steering transistor P1 is conductive. This drives common emitter node 218 to the voltage of the high voltage rail and reverse biases the emitter-base junctions of the ECL transistors E1 and E2 thereby isolating the inputs A and A- from the outputs Y1 and Y1-.

By controlling which of steering signals EN1 and/or EN2 are high, it is possible to connect the input signal pair A, A- to either or both of the output signal pairs Y1, Y1- or Y2, Y2-. Thus, by control of the states of signals EN1 and EN2, it is possible to electronically control the switching of very high speed signals at an input to any of a plurality of outputs without substantially slowing down the signals even though CMOS steering transistors are used. Because the resistivity of the NMOS steering transistors N1 and N2 is much lower than the resistance of the emitter feedback resistors 214 and 216, the presence of the NMOS transistors N1 and N2 in the path between the emitters of the current source transistors CS1 and CS2 to the low voltage rail does not appreciably affect the speed of operation of the circuit.

The structure of FIG. 13 can be extended to more ECL differential pairs driving more output pairs, but there is a limit imposed by the loading on the input signal lines A and A- caused by the junction capacitances of the ECL transistor bases. Also, since the beta factor of the ECL pairs is not infinite, adding more ECL pairs causes the base current to exceed accepted ECL limits of no more than 10–20 bases coupled to one signal. The preferred limit of the number of bases which can be coupled to input signal lines A and A- is from 4 to 8. It is preferable for the load on A and A- signal lines to not be dependent upon the number of transistors connected thereto.

Figure 14:
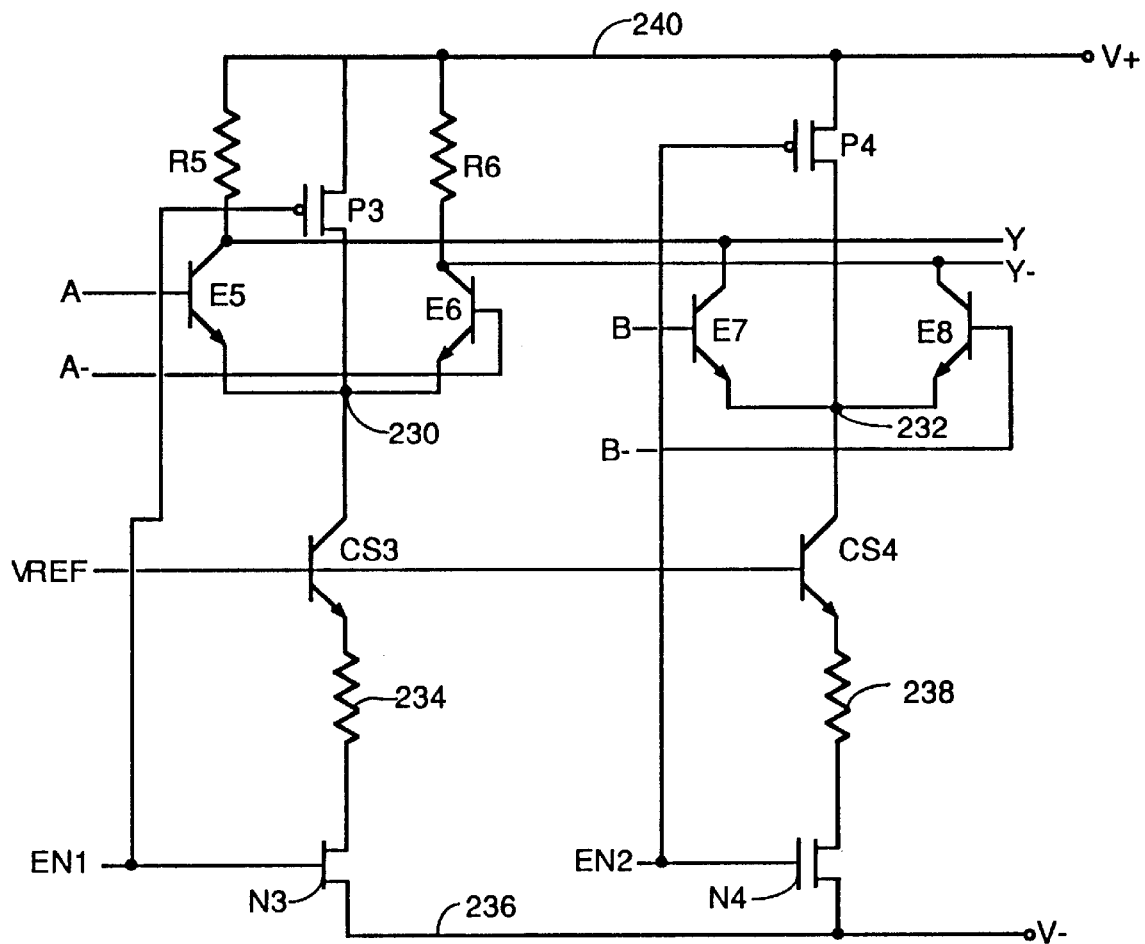
FIG. 14 is a circuit diagram for an active link biCMOS differential, current-mode, two-input-single-output multiplexer.

Referring to FIG. 14, there is shown a circuit diagram for a two-input-single-output multiplexer active link for steering high speed signals without substantially degrading the rise or fall times thereof. A first ECL transistor pair E5 and E6 share a common emitter node 230, while a second ECL transistor pair E7 and E8 share a common emitter node 232. Common emitter node 230 is coupled to a constant current source comprised of transistor CS3 and emitter feedback resistor 234. This constant current source is turned off and on by an NMOS steering transistor N3 which couples the current source to the low voltage supply line 236. The transistor pair E5 and E6 each have a load resistor, R5 and R6, respectively, which is shared with a second ECL transistor pair E7 and E8 via a pair of single output lines Y and Y-. The second transistor pair E7 and E8 share emitter node 232 and share a constant current source comprised of transistor CS4 and emitter feedback resistor 238. The CS4 constant current source is selectively coupled to the low voltage supply rail 236 by an NMOS steering transistor N4. As in the case of the embodiment of FIG. 13, two PMOS steering transistors P3 and P4 are used to positively control the voltage of common emitter nodes 230 and 232, respectively.

The first ECL transistor pair E5 and E6 is enabled when the enabling signal EN1 is high. This condition turns the NMOS transistor N3 on and couples the current source transistor CS3 to the low voltage supply 236. The transistors E5 and E6 are coupled to a high voltage supply line 240 through their respective load resistors R5 and R6. When EN1 is high, PMOS transistor P3 is off which releases the common emitter node 230. Thus, transistors E5 and E6 are enabled to drive the output lines Y and Y- under the influence of whatever signals are on the high speed input signal lines A and A-. Note that if EN1 is high, care must be taken to insure that EN2 is not simultaneously high as this would cause a conflict in that ECL pair E7 and E8 would be simultaneously trying to drive the output lines Y and Y- at the same time transistors E5 and E6 were trying to drive the same lines, possibly with conflicting signal levels. This conflict is avoided if the steering signal EN2 is low when steering signal EN1 is high, because a low EN2 causes PMOS transistor P4 to be turned on which drives the shared emitter node 232 to the voltage of the high voltage supply line 240. This disables E7 and E8 by reverse biasing the emitter-base junctions thereof. Likewise, when EN1 is low, transistors E5 and E6 are disabled in the same way.

In alternative embodiments of the circuit of FIG. 14, interlock circuitry is employed to prevent both EN1 and EN2 from being active high simultaneously. Also, in some embodiments, the PMOS transistors P3 and P4 can be omitted where leaving the shared emitter node floating is an acceptable way of disabling the ECL transistor pairs.

The multiple input, single output arrangement of FIG. 14 can be extended to many different input pairs driving many different ECL pairs sharing a single output pair, as will be apparent to those skilled in the art. If such a circuit were to be implemented as an integrated circuit, all transistors whose collectors are connected to the same output line could share the same collector tub on the integrated circuit die thereby creating vast savings in layout area. Thus, for example, four separate input pairs could drive four ECL transistor pairs sharing a single output pair and a single pair of load (pull up) resistors. The four transistors coupled to one output line of the output pair would share the same collector tub and likewise for the four transistors coupled to the other output line. At most one of the four ECL pairs would be enabled by its corresponding steering signal while all other steering signals would be inactive.

Figure 15:
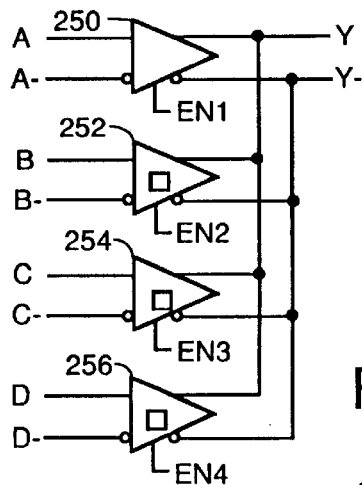
FIG. 15 is a circuit diagram of another notation for the multiplexer of FIG. 14 having four inputs and a single output.

Such an embodiment is shown symbolically in FIG. 15. In the notation used in FIG. 15, ECL pair E5 and E6 with pull up resistors R5 and R6 and their associated current sources and MOS steering transistors are represented by switch 250 while ECL pairs without pull-up resistors such as transistors E7 and E8 and their associated current sources and MOS steering transistors are represented by switches 252, 254 and 256.

In FIG. 15, the first ECL transistor pair is driven by high speed signal input lines A and A- in the data path, while the second ECL transistor pair is driven by high speed input signal lines B and B-. Both ECL transistor pairs drive a single pair of shared output signal lines Y and Y- and share a single pair of pull up resistors.

Figure 16:
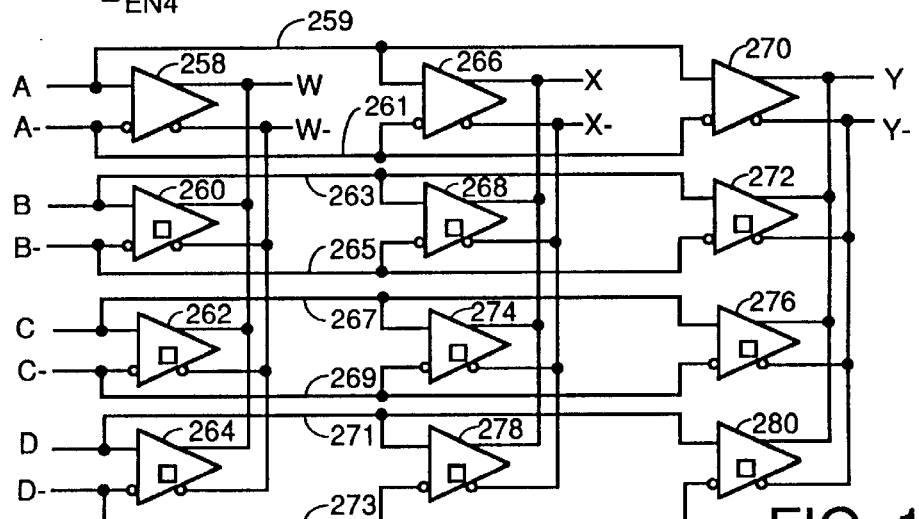
FIG. 16 is a circuit diagram for a crossbar switch having four inputs and three outputs using the notation of FIG. 15.

Referring to FIG. 16, there is shown a symbolic diagram of a four-input-three-output crossbar switch comprised of active links of either the long range or short range variety. Each triangle in FIG. 16 represents an active link. The particular cross-bar switch shown has three modules like that shown in FIG. 15 interconnected such that the data inputs of the first module comprised of switches 258, 260, 262 and 264 also drive the data inputs from corresponding switches in the other two modules. Specifically, the A and A- data inputs to switch 258 are coupled not only to the data inputs of switch 258, but also to the data inputs of switches 266 and 268 via lines 259 and 261, and the B and B- data inputs drive the data inputs of both the switch 260 and the switches 268 and 272 via lines 263 and 265. The C and C- data inputs are similarly connected so as to drive the data inputs of switches 262, 274 and 276 via lines 267 and 269, and the D and D- data inputs are coupled to drive the data inputs of switches 264, 278 and 280. For clarity of the figure, the separate enable inputs of each switch are not shown, but each switch has an enable input coupled to receive a steering signal such as the signal EN1 in FIGS. 13 or 14. These steering signals are coupled to the CMOS steering transistors that control enabling of the ECL transistor pair of each switch in the manner described above for the circuits of FIGS. 13 and 14. The concept of FIG. 16 can be extended to any number of modules and any number of inputs and outputs limited only by the fan-out specifications or loading limitations on each input and output of the switch.

Operation of the crossbar switch of FIG. 16 is a straightforward function of activating selected ones of the steering signals. For example, if it is desired to pass the D and D- signals on to only the W and W- outputs, the enable signal to switch 264 would be activated and all other enable signals to all other switches would be inactive. If the D and D- outputs were to be steered to the X and X- outputs, the enable signal for only switch 278 would be active, and all other enable signals to all other switches would be inactive.

Any input pair can be coupled to any one or more output pairs in the architecture of FIG. 16, and two or more inputs can be coupled to two or more outputs simultaneously as long as no output is coupled to more than one input at any particular time. For example, the A and A- inputs can be coupled to the W and W- and X and X- inputs simultaneously while the D and D- inputs are simultaneously coupled to the Y and Y- inputs. Many other combinations are also possible as will be apparent to those skilled in the art.

The architecture of the crossbar switch of FIG. 16 can be extended to larger numbers of input pairs and/or output pairs.

Simulations of the operation of a 4×4 (four input pairs and four output pairs) crossbar switch having an architecture like that of the circuit of FIG. 16 has shown propagation delays of about ¼ nanosecond. This is much faster than the propagation delays of such crossbar switch circuits implemented using CMOS in the data path. That is, the time it takes for a change of level on any output pair to propagate through the circuit and cause a corresponding change in level on any one or more selected output pair is ¼ nanosecond.

The circuits shown in FIGS. 13 through 16 all use current mode logic which has a maximum output voltage swing on the order of 300 millivolts. If the output voltage swing is stretched to a value more than 300 millivolts, soft saturation or total saturation can occur in the ECL transistors. This is highly undesirable because saturation or soft saturation of current mode logic switches substantially decreases the switching speed thereof. Thus, in the preferred embodiment, emitter followers are used as output buffers so as to increase the permissible output voltage swing.

There are other reasons to use emitter followers either as active links or in conjunction therewith. Specifically, in addition to having very high input impedance which is useful to prevent the driving circuit from being loaded down, emitter followers can be used to shift the voltage levels so as to drive other logic families. Emitter followers can also be used to create higher current source or sink capacity for driving long lines which is useful for construction of the long range active links of FIG. 12.

To provide maximum flexibility, it is desirable to be able to couple the output of a current mode logic switch active link to any one or more of a number of emitter follower arrangements, some of which may have different characteristics such as different output voltage levels, logic swing or current source or sink capacity.

Figure 17:
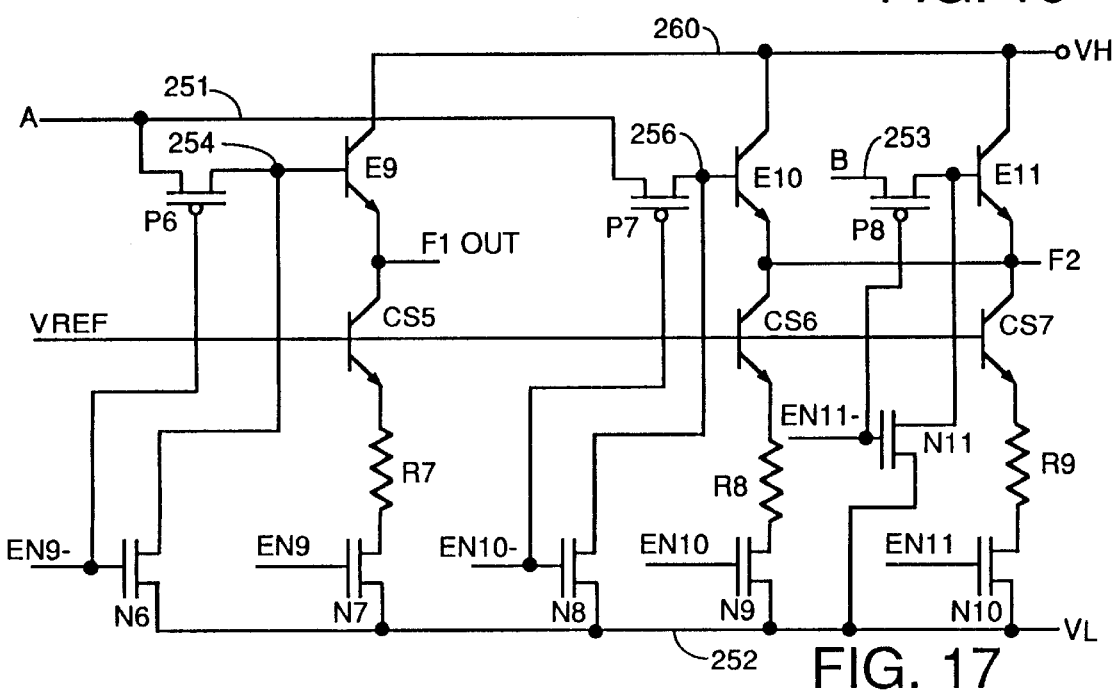
FIG. 17 is a circuit diagram of a typical set of high speed emitter followers for use with the circuits of FIGS. 13–16 as a driver to provide high input impedance or as a stand-alone, field-programmable active link.

To provide this flexibility, the circuit of FIG. 17 may be used alone as a multiplexing active link or in conjunction with other active link circuits to provide long line drive capability, voltage level shifting, better isolation etc. In the circuit of FIG. 17, a data output line A from the output of a current mode logic switch or any other type of active link or boilerplate circuit is coupled via line 251 to two emitter followers comprised of ECL transistors E9 and E10 which drive output lines F1 and F2. Each of these emitter follower transistors has an associated current source and associated CMOS enabling circuitry. Specifically, transistor E9 drives output line F1 and has its emitter coupled to a current source transistor CS5 which has an emitter feedback resistor R7 and which has its base coupled to a constant reference voltage Vref as was the case with the current source transistors of the circuits of FIGS. 13–16. The CMOS enabling circuitry for emitter follower transistor E9 is comprised of NMOS transistors N6 and N7 and PMOS transistor P6. Likewise, emitter follower transistor E10 has its emitter coupled to a current source transistor CS6 having emitter feedback resistor R8. The base of the current source transistor CS6 is coupled to the constant reference voltage line Vref. The enabling CMOS circuitry for the current source E10 is comprised of NMOS transistors N8 and N9 and PMOS transistor P7.

Emitter follower E9 is enabled when the steering signal EN9 is active high and complementary steering signal EN9- is active low. This state causes NMOS transistor N7 to be turned on thereby activating the current source transistor CS5 by coupling its emitter to the low voltage supply line 252. Because EN9- is active low, NMOS transistor N6 is turned off and PMOS transistor P6 is turned on thereby allowing the base of transistor E9 to assume whatever voltage high speed input signal A currently has. Note that although a PMOS transistor P6 is in the high speed signal path, the load on this transistor is very light comprised of only one ECL transistor base and one NMOS transistor drain. This light load does not appreciably slow down signal propagation. It is necessary to use the P6 transistor in the embodiment shown in FIG. 17 because it is necessary to disconnect the high speed signal A from the base of transistor E9 when the base is coupled to the low voltage supply 52 so that the high speed data signal is not loaded down thereby slowing signal propagation.

To disable emitter follower E9, steering signal EN9 is driven to its inactive low state and complementary steering signal EN9- is driven to its inactive high state. This state causes NMOS transistor N7 to turn off and NMOS transistor N6 to turn on simultaneously with PMOS transistor P6 turning off. This causes current source transistor CS5 to be disconnected from the low voltage supply line 252 and become inactive thereby disabling the emitter follower transistor E9. Simultaneously, the base 254 of NPN transistor E9 is coupled to the low voltage supply 252 to reverse bias the base-emitter junction and the base 54 is cut off from the A data input line 251 by virtue of transistor P6 turning off. By coupling the base 254 of transistor E9 to the low voltage supply, the base-emitter junction of NPN transistor is reverse biased thereby preventing any voltage source coupled to the F1 output from accidentally turning transistor E9 on.

Emitter follower E10 works in the same fashion as emitter follower E9. However, it may have a different physical geometry or emitter feedback resistor R8 may have a different value so as to present different voltage levels on output line F2. Further, emitter follower E10 may be designated so as to be able to source more current to output line F2 to drive a long line. Thus, when steering signal EN10 is active high and steering signal EN10- is active low, NMOS transistor N9 is on enabling the current source transistor CS6 and NMOS transistor N8 is off while PMOS transistor P7 is on thereby connecting the base 256 of NPN transistor E10 to high speed data input A. To turn off E10, steering signal EN10 is made inactive low and steering signal EN10- is made inactive high.

Note that the architecture of the circuit of FIG. 17 allows the high speed data signal A to drive either output F1 or output F2, or both simultaneously or neither depending upon the states of the steering signals EN9 and EN10 and their complements. Each emitter follower has a gain of approximately one or greater and presents a high input impedance to the data input A so as to prevent unnecessary loading of whatever circuit is driving data input A.

Another high speed data input, B, on line 251 is coupled to the base of an NPN emitter follower transistor E11 which also drives output F2. If level shifting of the output swing of output F2 were desired when driven by input B, emitter follower transistor E11 could be replaced by two transistors in series such that two base emitter drops of approximately 850 millivolts would be imposed between the high voltage supply line 60 and the output F2 when the emitter follower E11 is turned on. Emitter follower E11 and its steering circuitry works the same way as emitter followers E9 and E10. Specifically, when steering signal EN11 is active high and its complement EN11- is active low, NMOS transistor N10 is on and activates current source transistor CS7 by coupling the emitter thereof to low voltage supply line 252. The base of transistor CS7 is coupled to the constant reference voltage Vref as are the bases of current source transistors CS5 and CS6. Simultaneously, NMOS transistor N11 is turned off by the low state of EN11- and PMOS transistor P8 is turned on thereby connecting the high speed data input B to the base of emitter follower transistor E11. This causes the changes in logic level of high speed data input signal B to be reflected on output F2 while imposing the buffering, level shifting and boosted current drive benefits of the emitter follower E11 between the high speed data input signal B and the output signal F2 which follows it.

Thus, by driving steering signal EN11 active high and steering signal EN10 inactive low and the complementary steering signals to their corresponding active/inactive states, it is possible to drive output F2 with input B. Likewise, by driving steering signal EN10 active high and steering signal EN11 inactive low and the complementary steering signals to their corresponding active/inactive states, it is possible to drive output F2 with input A. It is not permitted to have both steering signals EN10 and EN11 active high at the same time, although it is permitted to have both inactive low simultaneously.

Note that the inputs A and B on lines 251 and 253 may be coupled to any of the outputs shown in FIG. 13–16 such as Y or Y- etc., and note that duplicate emitter follower circuitry may be used to couple to the complementary outputs. Also, the outputs F1 and F2 may be coupled to the inputs of the single ended circuit of FIG. 18 to provide any necessary one Vbe drop (base-emitter voltage drop) to properly bias that circuit. The number of possible permutations and combinations of the fast switching circuits and emitter follower circuitry that does not impede the switching speed according to the teachings of the invention are too numerous to draw them all, but they will be apparent to those skilled in the art. Any fast switching circuit that uses MOS enabling circuitry that is substantially removed from the data path to enable the switch or do a steering function for the high speed data signals is equivalent to what is taught herein and intended to be within the scope of the claims appended hereto.

The consequence of use of the architecture of FIG. 17 in conjunction with the architecture of any of FIGS. 13–16 is that the high speed switches of FIGS. 13–16 may be coupled to any other type of logic family regardless of the logic levels of the logic family to which the high speed switches are to be coupled. The level of the output signals at outputs F1 and F2 can be raised by raising the voltage at the high voltage supply line 260 or changing the values of emitter feedback resistors R7, R8 and R9 and changing the characteristics of the current source transistors and/or changing the reference voltage Vref to alter the level of current flowing through the emitter feedback resistors. Likewise, output level voltages can be shifted downward by coupling more emitter follower transistors in series so that all transistors in the chain turn on or off simultaneously with changes in the input signal levels and so as to impose their base-emitter voltage drops in series between the high voltage supply line 260 and the corresponding output. This level shifting can be done without loss of the advantage of ECL speeds. This provides great flexibility to designers. For example, in well-known differential mode cascade logic, one set of data inputs coupled to the lower differential pair substituted for the normal current source must be driven between level changes which are uniformly one base-emitter voltage drop (approximately 850 millivolts) below the corresponding levels of the other set of data inputs coupled to the upper differential pair. This can be done using the emitter follower technology of FIG. 17, for example by driving one set of inputs with the F1 output and driving the other set of inputs coupled to the lower differential pair with output F2 and substituting a pair of series coupled emitter followers for single emitter followers E10 and E11.

Those skilled in the art will appreciate that the concepts illustrated in FIG. 17 can be extended such that input A can drive more emitter followers and more outputs, and the crossbar switching capabilities of input A or B being able to drive input F2 can be extended to more inputs and outputs by modification of the circuit of FIG. 17. Likewise, the concepts illustrated in FIGS. 13–16 may be extended to more inputs and more outputs and can be extended to single ended technology. Generally, differentially coupled current mode logic devices are preferred, because the logic swing can be reduced with adequate noise immunity and therefore great speeds can be achieved. However, where integrated circuit space is an issue, and the number of transistors is to be held down, single ended logic can also be used.

Figure 18:
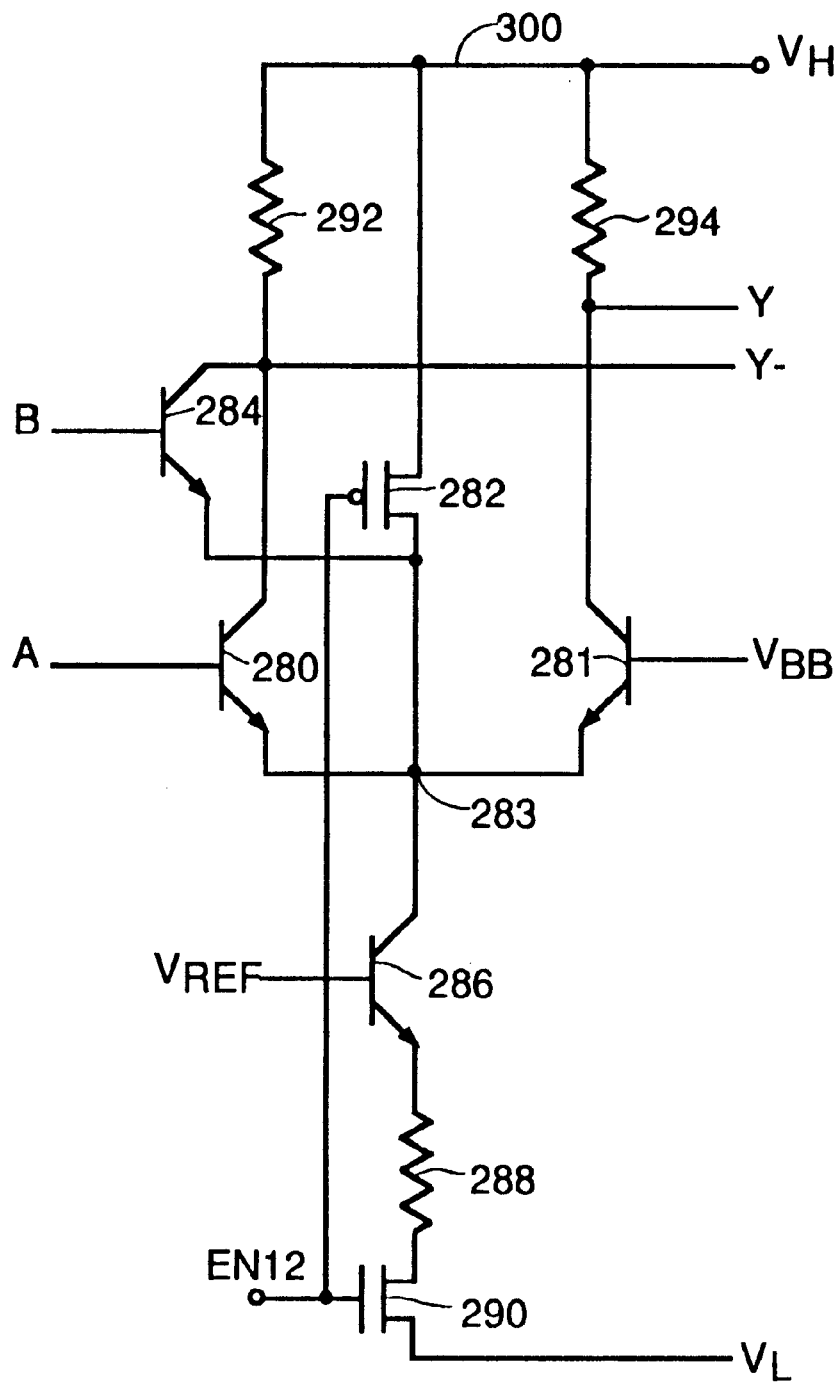
FIG. 18 is a circuit diagram of one example of how the structures of FIGS. 13–16 can be implemented in single ended ECL technology.

For example, a single-ended, fast OR gate employing the teachings of the invention is shown in FIG. 18. In this circuit, a differentially coupled pair current mode NPN transistors 280, 281 and 284 are coupled to share a common node 283. A reference signal Vbb is coupled to the base of transistor 281, and high speed data input signals A and B coupled to the bases of transistors 280 and 281 have logic states which swing both above and below the level of Vbb. A constant current source comprised of transistor 286 and resistor 288 selectively drives the common node 283 when NMOS transistor 290 is turned on. This occurs when steering signal EN12 is active high. When this occurs, PMOS transistor 282 turns off and common node 283 is free to seek whatever voltage it normally assumes when the differential pair is enabled. The transistors 284, 280 and 281 then drive the outputs Y and Y-. Pullup resistors 292 and 294 couple the outputs to the high voltage source. The voltage swings of the signals on inputs A and B can be increased to increase noise immunity, but the high level of either signal cannot be higher than one base-emitter voltage drop below the level of Vh on the line 300. Thus, an emitter follower according to the teachings of FIG. 17 could be used to drive the A and B inputs if necessary to provide the necessary one base-emitter drop.

The concept of FIG. 18 can be extended to any of the other switches or arrays shown in FIGS. 13–16 as will be apparent to those skilled in the art. Further, although NPN bipolar current mode logic technology is used for illustration, PNP bipolar technology could also be used, and any differentially coupled circuit could also be single ended. Further, other high speed switching technologies either now existing or to be invented in the future could also be used to implement the teachings of the invention if the slower enabling/steering logic is kept out of the high speed data path.

Figure 19:
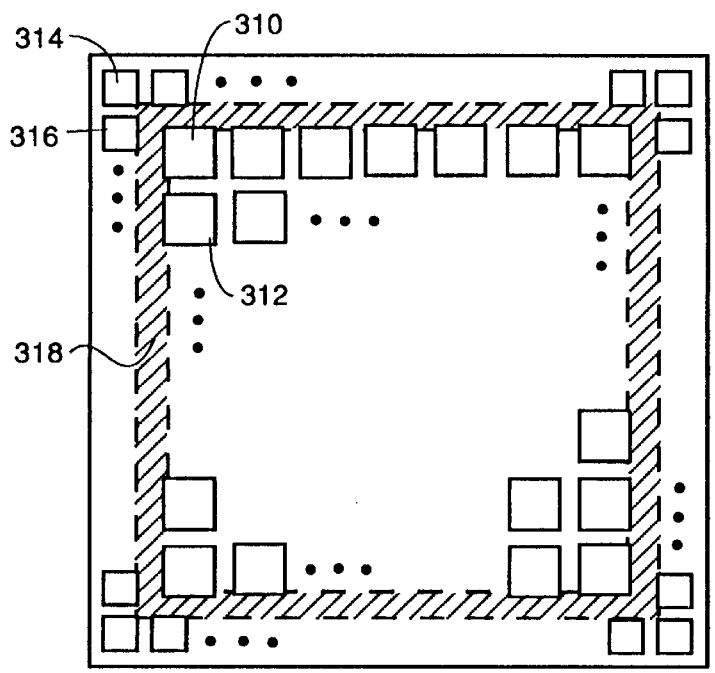
FIG. 19 is an overall top view of the layout of an FPGA showing the relative position of the RIUs according to the teachings of the invention.

Referring to FIG. 19, there is shown an overall top view of the layout of a typical FPGA employing RIUs according to the teachings of the invention and showing the relative positions thereof. Blocks 310 and 312 are typical logic blocks of the core array of programmable logic blocks which may be programmed to define the overall functionality of the chip. Blocks 314 and 316 are programmable I/O cells which are typical of the I/O cells which ring the array of logic blocks. The cross-hatched area 318 which rings the array of logic blocks and lies between the logic blocks and the ring of I/O cells is called the padframe interface circuit. This circuit is used to connect the logic blocks of the core array to the ring of I/O cells.

Typically, in the prior art, the padframe interface circuit area was very congested with circuit lines running all over and multiple metal layers in the integrated circuit structure. This complicated circuit took many hours to design and do the placement and routing. Each time a new chip in a family of FPGA was introduced with a bigger array of logic blocks, the padframe interface circuit had to be redesigned—a process which considerably slowed down the time to introduction of the new chip to the market. The RIUs according to the teachings of the invention speed up that time to market by considerably shortening the time to design the padframe interface circuit.

Figure 20:
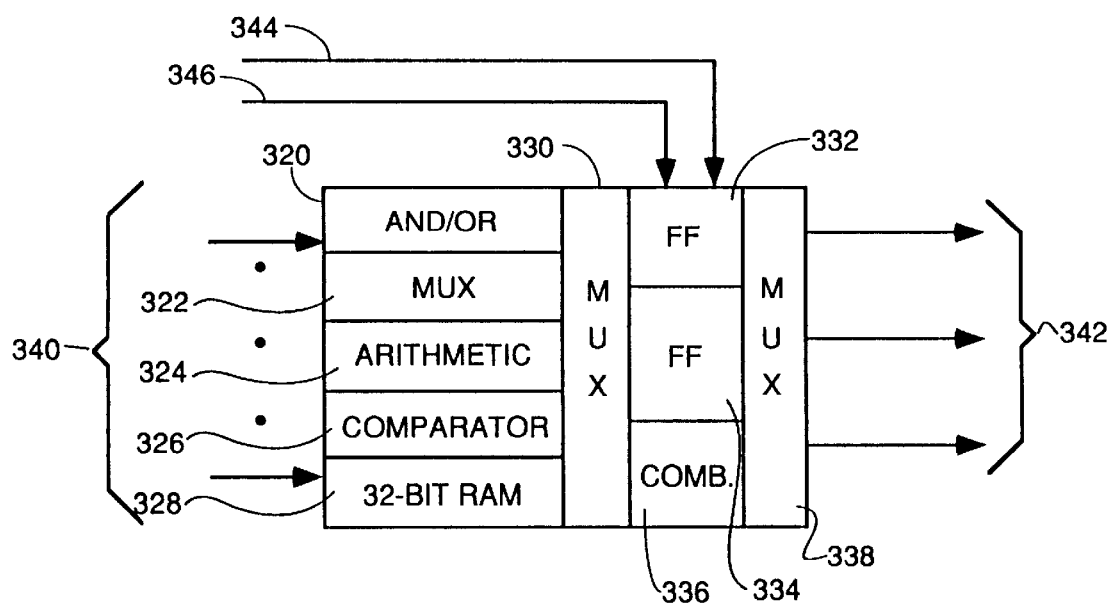
FIG. 20 is a block diagram of a typical logic block such as logic block 312 that makes up the core array.

FIG. 20 is a block diagram of the functionality of a typical logic block such as logic block 310. The RIUs of the invention are not limited to working with the particular logic block of FIG. 20 however. A typical logic block has an AND/OR section 320, a first multiplexer 322, an arithmetic section 324, a comparator section 326, a 32-bit RAM section 328, a second multiplexer section 330, a first flip-flop 332, a second flip flop 334, a combinatorial logic section 336 and a third multiplexer 338. Each logic block has 18 inputs shown at 340 and 3 outputs shown at 342. The three outputs are driven by the combinatorial logic or the flip flops. Input 344 is a local, global or quadrant clock signal, and input 346 is a local or global set/reset signal.

Each column of logic blocks is separated from the next column of logic blocks by a column of north-south connection lines shown symbolically as four lines, column 350 being typical. Each of the 4 north-south lines in each column represents 9 individual conductors for a total of 36 traces. Of these 36 conductors, 30 conductors are outputs and 6 are inputs. Any 24 of the output conductors are coupled to the RIUs in the padframe interface, the other 6 stopping at the edge of the array. All 6 of the input conductors are coupled to the RIU connection matrices, as will be described in more detail below.

The single lines 352 and 354 coming out of logic block 356 represent the collection of input and output lines to and from logic block 356. These input and output lines are coupled to selected ones of the 36 north-south column lines in column 350 using a not fully populated matrix of programmable connections represented schematically by the X-like symbols of which symbol 358 is typical. These programmable connections are, in this particular core configuration, implemented using one-way tri-state driver built in CMOS. The one way connections are from the east-west signal lines represented by line 352 to the north-south signal lines of column 350.

Figures 22A, 22B:
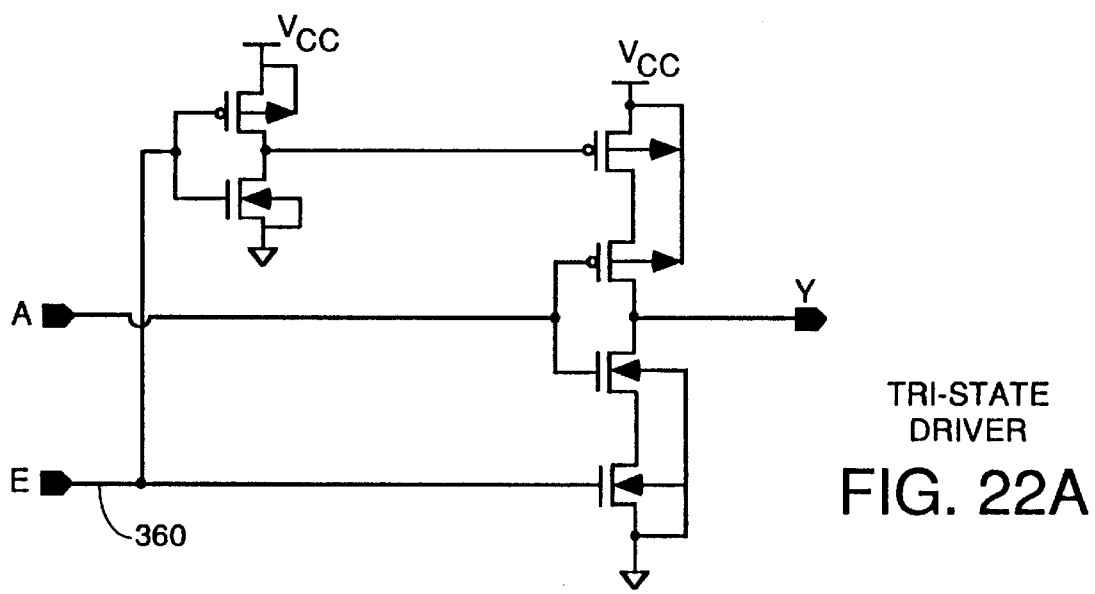
FIG. 22A is a schematic diagram of the preferred tri-state driver for use in the programmable connection matrices.
FIG. 22B is a truth table showing the operation of the tri-state driver of FIG. 22A.

FIG. 22A is a schematic diagram of the preferred tri-state driver, and FIG. 22B is the truth table defining its operation. When the enable signal on line 360, which is defined by a programmable bit stored elsewhere on the chip in memory, is low, the output line Y is tri state and no transition on input A gets through to output Y. When enable signal E is high, logic levels and transitions on input A are inverted and appear on output Y. Note that the tristate driver is an active device which regenerates the input signal on A on output line Y thereby replenishing energy lost to parasitics from the signal on input A. The use of any of the active repeaters described herein for interconnects has the advantage of speeding up the operation of the chip by segmenting the load. In the prior art pass transistor based interconnects, a logic block driving a signal to another logic block through a long net of pass transistor sees the entire load to the next logic block. When the same interconnect is implemented with active repeaters, the load is segmented such that each active repeater sees only the load to the next active repeater. The active repeater fully regenerates the signal and provides the optimum amount of drive to its load. Another significant advantage of active repeaters is fanout. With pass transistors, the $V_t$ drop of each pass transistor reduces the voltage and current available to drive a load so if there is significant fanout to multiple loads, the problem gets even worse. With an active repeater, there is plenty of current to drive many loads, so performance is not significantly degraded as fanout increases within the current drive capability of the active repeater.

Other implementations for the tri-state driver in biCMOS or other technologies compatible with the logic block construction can also be used. Programmability of the connection is provided by a signal defined by a bit stored in memory and supplied on line 360 to make or block the connection. The matrix of connections can be fully populated if sufficient chip area exists and power consumption and cooling issues are adequately managed.

Bidirectional active repeaters, represented by blocks 362 and 364 in FIG. 21, are used to provide programmable connections between the conductors represented by lines 366 and 368 and the programmable connection matrix at 370 such that signals can be driven in either direction. The symbols 362 and 364 represent a bidirectional active repeater on each of the individual signal lines represented by buses 366 and 368. Each of these bidirectional active repeaters preferably has the structure shown in FIG. 23A and operates in accordance with the truth table shown in FIG. 23B, but they can also have the structure of any of the other bidirectional repeaters disclosed herein.

Figure 33:
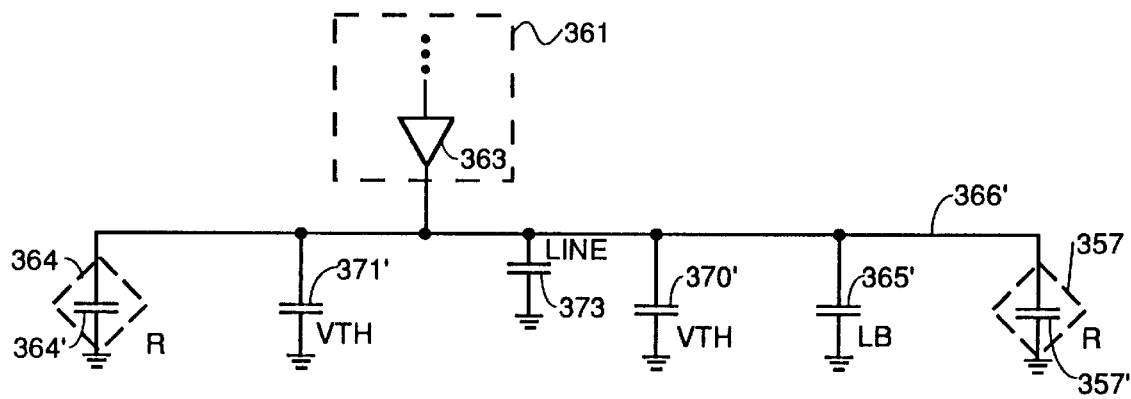
FIG. 33 is an equivalent circuit showing how the active repeaters that segment conductive lines in the FPGA limit the capacitive load of each segment to the parasitic capacitors actually coupled to that segment.

The bidirectional active repeaters act as buffers and serve several functions. First, pairs of bidirectional active repeaters on the same line act as natural dividers to segment one conductive line into multiple segments. These active repeaters shield the line segments between the repeaters from the parasitic capacitances and resistances affecting the line outside the segment of interest. This segmentation causes the capacitive load seen by the drivers at the output of a logic block or an I/O cell to be fixed and limited to the amount of parasitic capacitance coupled to the particular segment to which the driver is connected. For example, conductive line 366 has two separate segments defined therein. The first segment lies between active repeater 364 and active repeater 357. The second segment lies between active repeater 357 and active repeater 359. Focussing on the first line segment, suppose a driver in logic block 361 has its output coupled to one of the lines of bus 355 and suppose that line is coupled by a tri-state driver to line 366. In this situation, the parasitic capacitances seen by this driver coupled to the first segment of line 366 will be limited to only those parasitic capacitances of devices actually physically connected to this first line segment. Specifically, FIG. 33 is an approximate equivalent circuit of the load parasitic capacitances seen at the output of a driver 363 within logic block 361 by virtue of it being coupled to the first segment of line 366 (represented by reference number 366' in FIG. 33). The gate and drain parasitic capacitances of repeaters 364 and 357 are represented by capacitors 364' and 357'. The driver 363 also sees the capacitance 365' of the disabled line buffer 365' inside logic block 365 in FIG. 21 since this driver cannot be simultaneously enabled with driver 363 to drive the same line segment. Driver 363 also sees the parasitic gate (unidirectional repeaters—370' and 371' are gate parasitics only, but for local bidirectional repeaters 370' and 371' represent both gate and diffusion parasitic capacitances) capacitances 370' and 371' representing all the gates of tri-state drivers connected to line 366' in the programmable vertical-to-horizontal connection matrices 370 and 371, respectively, at the intersection of the vertical line segment 366' and horizontal buses over which it passes. Finally, driver 363 also sees the parasitic capacitance between the line segment 366' itself and the substrate, represented by capacitor 373.

Because driver 363 sees a constant capacitive load regardless of whether the active repeaters are programmed to be "on" or "off", it can be optimally structured to drive this load. This is also true of all the active repeaters in the FPGA—they can all be designed optimally to drive a fixed capacitive load. Specifically, optimized active repeaters can be used for the repeaters that segment the individual signal conductors of the horizontal and vertical buses in the core array and which segment the I_lines and O_lines of the alternative RIU structure described herein and which populate the programmable connection matrices in both the core array at the intersections of the horizontal and vertical buses and elsewhere and at the intersections of the individual conductors of the vertical buses or columns with the I_lines and O_lines of the RIUs.

Note in FIG. 21 that the placement of active repeaters in the individual conductive signal lines of the vertical buses is staggered in symbolic groups of four. Likewise, the active repeaters in the horizontal buses are also staggered in symbolic groups of three. This staggering of active repeaters improves access. "Access" is defined as the number of logic blocks to which the output of a single logic block can connect while crossing no "repeater boundaries" ( a repeater boundary is an active repeater dividing a line into two segments) and only one vertical-to-horizontal active repeater connection between a vertical bus conductor and a horizontal bus conductor). Having a high degree of access is important in an active repeater for highest performance and ease of routability. The staggered nature of the active repeaters improves access because the routing regions are not regular, and this irregularity allows the output of a logic block to access a much greater area. If the active repeaters were not staggered, any logic block output can only get to 13 other logic blocks (in the particular 2×2 core structure with an active repeater on every vertical and horizontal line at every other logic block) before crossing a repeater boundary. Crossing a repeater boundary is not a serious disadvantage but it does add another repeater delay and slows down performance slightly. With staggered repeaters in some embodiments within the genus of the core array configuration invention, a single logic block can access 8 other logic blocks not including itself without crossing a repeater boundary in either a vertical conductor or a horizontal conductor. In this case, the delays to all 34 logic blocks are equal. If crossing a single repeater boundary is allowed, the number of logic blocks a single logic block can access grows to a substantially larger number. Higher degrees of access greatly simplifies the placement and routing software designed to decide which programmable connections to make to implement a desired functionality and minimize interconnect delays. This also lowers the need to place timing critical circuits in the same region of the array.

Figure 34:
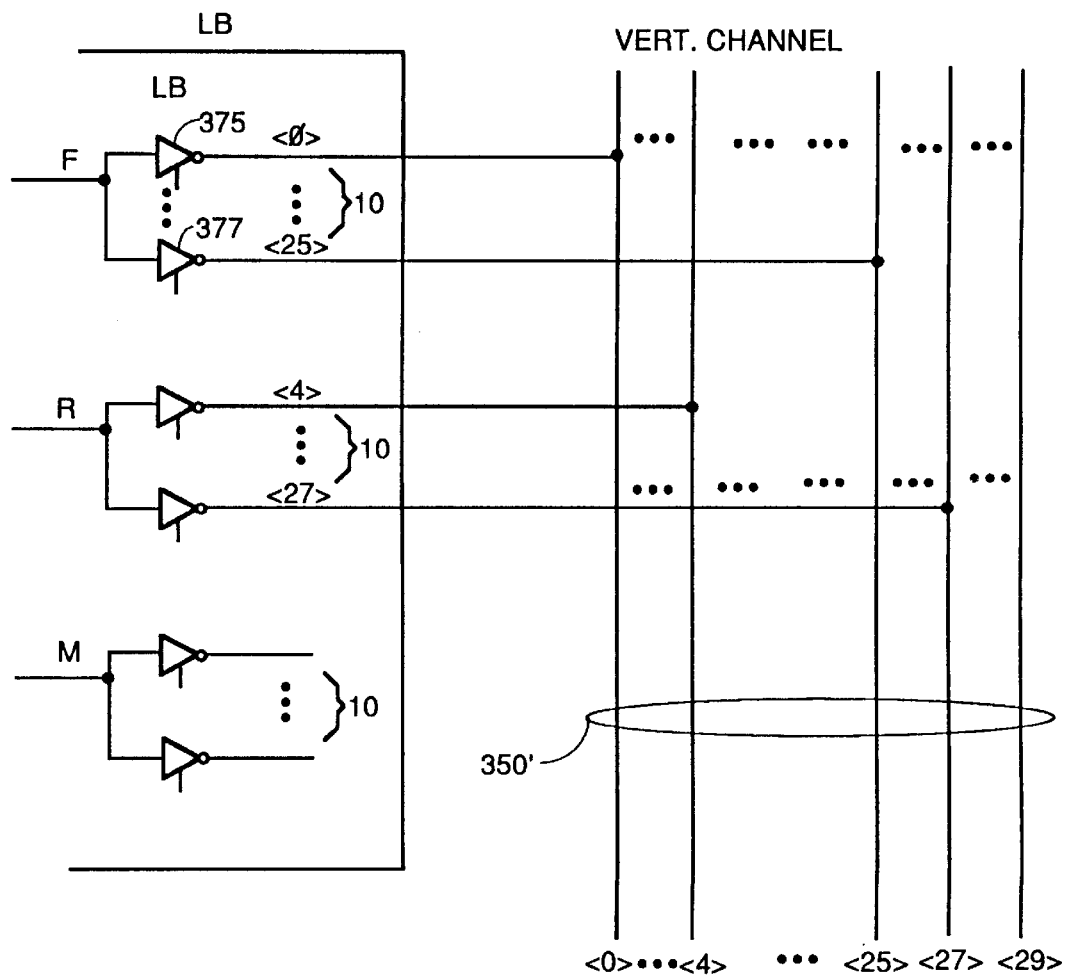
FIG. 34 is a more detailed diagram of the actual output structure for coupling the three data output signals from each logic block to the conductors of the vertical channel.

Driver 363 in FIG. 33 is only symbolic. FIG. 34 represents the actual configuration of the output drivers and output lines from each logic block. Each logic block can output only three signals, labelled F, R and M. Each output drives ten tri-state drivers symbolized by drivers 375 and 377 in the case of output signal F. The ten output lines for each of these three sets of ten tri-state drivers intersect with the 30 output lines of the vertical channel, represented by vertical bus 350' representing only the 30 output lines of the vertical channel 350 and ignoring the six input lines. At preselected intersections, direct connections are made without the use of active repeaters.

Note that in the equivalent circuit of FIG. 33, there are no parasitic capacitances representing loads coupled to line 366 above repeater 364 or below repeater 357. Also, note that there are no parasitic capacitances coupled to line segment 366' representing loads coupled to any of the lines of the horizontal buses passing through programmable connection matrices 370 and 371 since those are blocked by the tri-state driver active repeaters in the programmable connection matrices 370 and 371.

This segmentation by active repeaters limits the capacitance on the segment of the line between two active repeaters because there is no "direct connection" between the line segments coupled to different terminals of the same active repeater. As the phrase is used in the claims, the lack of a "direct connection" means that there is no direct conductive path from one line segment to the other such that charge carriers from one line segment can flow directly through the active repeater to the other line segment. In a pass transistor FPGA, charge carriers can flow from one line segment coupled to the source to the other line segment coupled to the drain through the channel when the pass transistor is programmed to be "on". This direct path from one line segment to another does not exist in the preferred MOS inverter active repeater because in an MOS-based active repeater, one line segment is typically coupled to the gate of the MOS inverter and the other line segment is coupled to the drain thereof. There is no direct conductive path through the MOS inverter in which electrons can move from one line segment to the other. Although some current may flow between the line segments momentarily by capacitive coupling between the gate and the drain, after that parasitic capacitance is charged, no further direct current will flow between the line segments. In contrast, in a pass transistor, current originating from the driver of a logic block or I/O cell can flow directly from one line segment coupled to the source of the pass transistor to the other line segment coupled to the drain of the pass transistor through the channel of the device when it is turned on and start charging all the parasitic capacitances coupled to the drain of the pass transistor. This slows down propagation of a signal from this driver because propagation is measured by the time it takes from launch of a 0-to-1 logic transition at the output of the driver to attainment at the other end of the line of a predetermined voltage on the 0-to-1 transition. Charging of all the new parasitic capacitances added to the load of the driver as each new line segment is added in a pass transistor based FPGA as an interconnect is built by the routing software naturally slows down the propagation time of a logic transition from the output of the driver to the other end of the interconnect.

With an active repeater, regardless of whether it is programmed "on" or "off", there is no direct current path between the line segments for charging current to flow from a driver coupled to a first line segment to one or more parasitic capacitances coupled only to the second line segment. Thus, the additional propagation delay of adding each new line segment in a pass transistor based FPGA does not occur in an FPGA where the conductive lines are segmented by active repeaters.

Another significant advantage of this segmentation of lines by active repeaters is that it allows the same line to be used for multiple interconnects by using different segments of it for different interconnects.

However, the key advantage which arises out of the use of active repeaters, whether they are bidirectional or unidirectional tri-state drivers, is the segmentation of the capacitive loads seen by the drivers at the outputs of logic blocks and the resulting predictability of the delays which that entails. With the active repeaters segmenting the lines in either the columns or rows of the core array or in the I_line or O_lines of the RIUs, the capacitive load seen by the drivers at the output of the logic blocks or I/O cells does not change regardless of whether the active repeaters are programmed to be "on" or "off" because the parasitic capacitances coupled to line segments other than the line segment to which the driver is coupled are not being charged by current from that driver. This is true because the segments of a line connected by an active repeater are not directly connected so that current can flow from one segment directly to the other line segment. Although when the active repeater is programmed to be on, current/voltage in one line segment will cause current flow in the other line segment, the current flowing in the other line segment is current from the power supply and not from the output of the driver driving the first line segment. This is because, in the case of MOS inverters or bidirectional active repeaters, one segment of the line is coupled to a gate of an MOS device of the active repeater and the other segment is coupled to a drain of an MOS device. As a result, the only load seen by a driver coupled to drive the segment coupled to the gate is the gate capacitance of the active repeater plus any other parasitics coupled to that segment, and any parasitics coupled to the segment coupled to the drain are not seen by any driver coupled to the line segment coupled to the gate. Likewise, drivers coupled to the segment coupled to the drain see only the load of the drain plus any other parasitic coupled to that segment, and any parasitics coupled to the segment coupled to the gate of the active repeater do not affect the load of the segment coupled to the drain. This is true whether the active repeater is on or off because there is no direct connection between the segments. This situation is not true of a pass transistor based interconnect, because when the pass transistor is turned on, there is a direct current flow between the line segments and all the parasitics coupled to both segments coupled together through the pass transistor will affect any driver coupled to either segment.

This simple fact of direct connection in pass transistor interconnect FPGAs causes unpredictability of the loads affecting drivers at the data outputs of logic blocks or I/O cells in pass transistor based FPGAs and causes exponential rises in delays in these prior art FPGAs as the length of an interconnect gets longer by connecting multiple segments together through multiple pass transistors.

The unpredictability of the delay in pass transistor based FPGAs also substantially complicates the routing software used to route interconnections in these FPGAs. Routing software attempts to minimize the delays involved in making a connection from one logic block to another or from a logic block to an I/O cell. As pass transistors are programmed to be "on" to connect one line segment to another, all the parasitic capacitances coupled to the line segment just added plus any parasitic capacitances coupled to other line segments coupled through other "on" pass transistors to the line segment just added now must be added to the parasitic capacitances coupled to the line segment already part of the interconnect being built by the software. This is a substantial complication in the software because it must do RC time constant calculations for all the new parasitics coupled to each line segment just added. This is a floating point calculation and is slower and more complicated calculation than the simple addition of a lump sum known delay of a new active repeater. Further, the new delay is unpredictable because it depends upon the previous history of the routing process where other parasitics may have been connected to the newly added line segment in previous routing operations.

In contrast, if the same length interconnect is made by coupling the same number of line segments together through the same number of active repeaters as there were pass transistors, the delay rises in only a modular, predictable fashion. The delay of the newly routed interconnect is equal to the sum of the fixed and known in advance delay of each line segment that comprises the interconnect. The delay for each segment is the total RC time constant delay for that segment alone taking into account all the parasitic capacitances affecting that line segment. The difference in routing calculation of time delays for each interconnect over the pass transistor FPGAs is that the delay calculation can be made simply by adding up the known, fixed delay of each line segment whereas in a pass transistor FPGA, the delay calculation is a floating point calculation and the outcome depends upon the previous routes which have been established. In the active repeater FPGA, the delay calculation never depends upon the previous routes that have been established. That is, the overall delay will depend upon the previous routes in the sense that the previous routes will preclude use of certain line segments that would have been used for a shorter route. Therefore, previous routing decisions may dictate how many line segments are needed to make the new route. The difference is that each new line segment's delay is known in advance, predictable and does not change with previous routing decisions so the total delay calculation is a simple addition of the known delays for each line segment.

The reason for this behavior is that the parasitics of new line segments are being charged by the output of the active repeater coupled to that line segment using current from the Vcc supply of that active repeater and not from the source driver. In other words, with each new segment added to the interconnect, the delay rises by only the known delay of the new segment, and the load of the new segment is not added to the load of the previous segment requiring a new RC time constant calculation. Thus, higher predictability of performance can be achieved by doing interconnects through active repeaters. This not only vastly speeds up performance in terms of propagation times for signals but also substantially simplifies the calculations required of the routing software.

The same attributes apply to the biCMOS active repeaters disclosed herein. For example, with the biCMOS multiplexer of FIG. 13, one line segment will be coupled to the A and A- input port which is coupled to the bases of the bipolar NPN differentially coupled devices E1 and E2 and E3 or E4. The other line segment will be coupled to either the Y1 and Y1- or Y2 and Y2- ports coupled to the collectors of the bipolar NPN differentially coupled devices E1 and E2 or E3 or E4. There is no direct conduction path for electrons to flow from the base to the collectors of the devices because any current flowing into the base is caused by recombination of carriers crossing the forward biased base-emitter junction with holes in the base region. The base current is an equivalent current to the amount of recombination occurring in the base region. Thus, current flowing into the base does not cross the reverse biased base-collector junction and reach the parasitic capacitances coupled to the line segment coupled to the collector. Instead, the parasitic capacitances coupled to the line segment coupled to the collector are charged by the main current flow supplied by the power supply which flows across the forward biased base-emitter junction, through the base region without recombination and across the reverse biased base collector junction. Thus, there is no direct current flow from the line segment coupled to the base to the line segment coupled to any of the collectors. Thus, the meaning of the phrase "no direct connection" in the claims is that there is no direct flow of electrons or holes through the active repeater from one line segment coupled to an active repeater to another line segment coupled to the active repeater. Therefore, the meaning of "active repeater" in the claims is any circuit which, in addition to being able to bring gain to bear in transferring a signal from one line segment to another in regenerating the signal by replacing losses to the parasitics with current to the power supply, but also having a structure which provides "no direct connection" between line segments coupled to the active repeater so charge carriers cannot transition directly from one line segment to another through the active repeater.

From all of the above it is clear that pass transistor based interconnects have delays which increase at an exponential rate because of the RC networks that are added as the interconnect gets longer. Further, pass transistor based interconnects do not scale with the technology. In contrast, active repeater based interconnects have constant delay until the next repeater boundary is crossed and then the delay jumps by a known incremental amount not related to the number of parasitic capacitances coupled to the line segment added to the interconnect. Active repeater interconnects do scale with the technology.

Figures 23A, 23B:
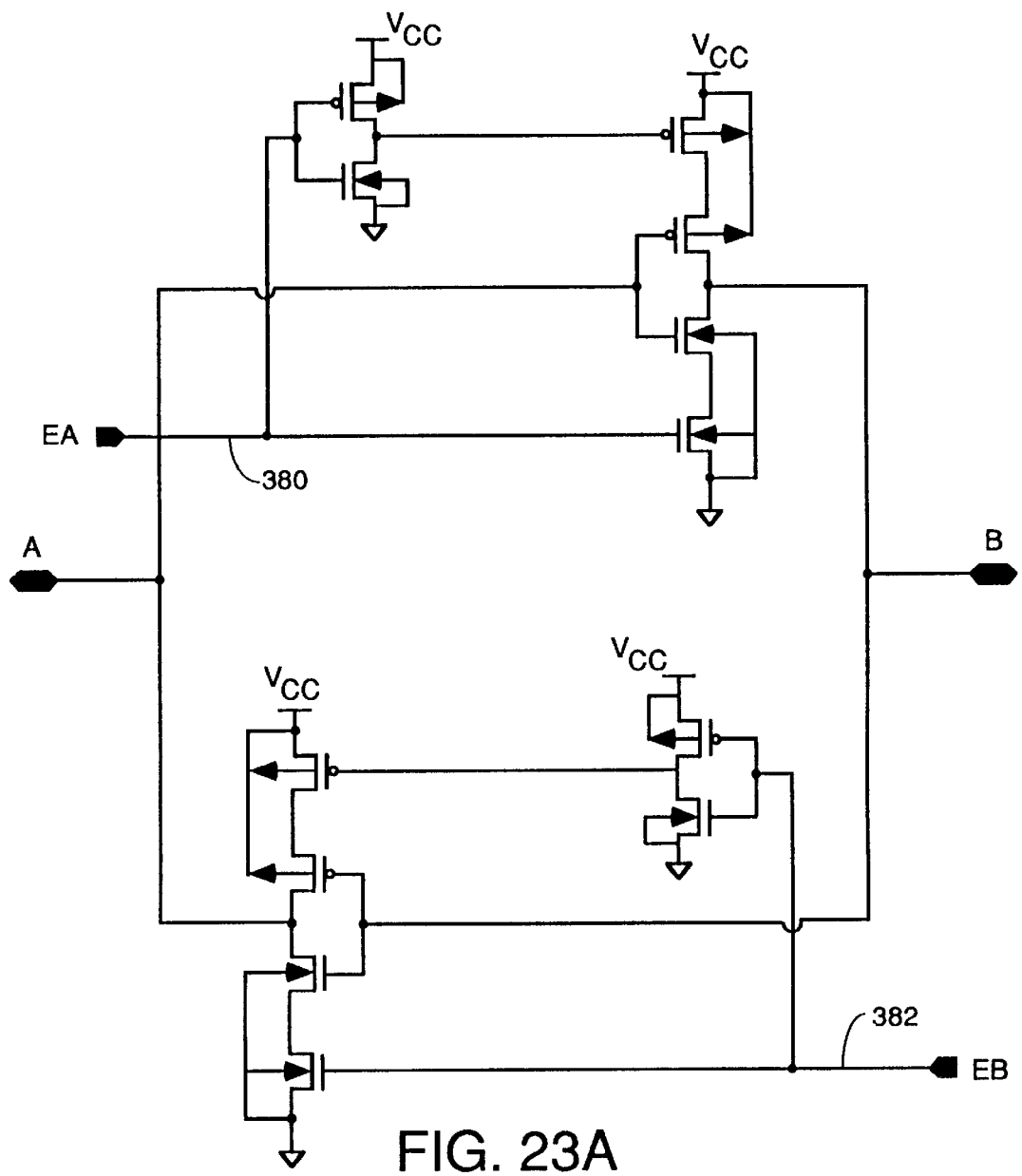
FIG. 23A is a circuit diagram of the preferred CMOS bidirectional tri-state driver.
FIG. 23B is a truth table defining the operation of the circuit of FIG. 23A.

Returning to the consideration of FIG. 21, the programmable connection matrix at 370 in FIG. 21 is a partially populated matrix with programmable connections, represented by bubbles or ovals, each which may be either one-way active repeater like the tri-state inverter of FIG. 22A or a bidirectional active repeater like the circuit shown in FIG. 23A. In some embodiments, the active repeaters within the programmable connection matrices within the core array or within the RIUs are all unidirectional active repeaters. However, in the preferred embodiment, the programmable connection matrices are primarily unidirectional active repeaters with some bidirectional active repeaters. The presence of the bidirectional active repeaters in the programmable connection matrices of the core array and the RIU's increases the number of possible connection routes that can be made by the routing software. Further, in the preferred embodiment there are different types of programmable connection matrices each with different connection possibilities. These different types of programmable connection matrices are "rolled" along the horizontal buses in the core array and "rolled" along the O-lines buses in the RIU's. "Rolled" as that term is used herein means sequentially alternated. For example, in FIG. 21, if there are four different "flavors" (different connection possibilities) they will be rolled by making programmable connection matrices (PCM) 370 flavor 1, PCM 650 will be flavor 2, PCM 652 will be flavor 3, PCM 654 will be flavor 4 and PCM 656 will be flavor 1. The sequence then repeats.

This rolling is done only along the horizontal buses and not along the vertical buses. The reason for this is the rolling increases the amount of "chaos", i.e., lack of regularity, in the programmable connection possibilities available. This increased chaos eases the job of the routing software.

The different programmable connection possibilities in each PCM is not really a chaotic or random event. The particular connection possibilities for each PCM are selected so that they are all different within the rolling group, but so as to provide "completeness" and substantially equal "weighting". "Completeness" means that the particular programmable connection possibilities selected for the individual PCM's within the rolling group are selected to be different for each PCM, but are selected such that when the rolling pattern is repeated, all logic block inputs, all logic block outputs and all I/O pins can be reached by at least one conductive path. Substantially equal "weighting" means that the programmable connection within the PCM's is selected within the rolling group of PCM's so that each PCM is different but such that when the rolling pattern is repeated in the core array and RIU, each output of a logic block or each I/O pin can be programmably connected to substantially the same number of inputs as any other logic block output or I/O pin. In other words "completeness" and substantially equal "weighting" means that in an FPGA having PCM's having these characteristics each input, output and I/O pin can be reached somehow and none are substantially choked off more than the others in terms of the routing possibilities to it.

Returning to the consideration of FIG. 21, other embodiments of active repeaters disclosed herein will also work in the programmable connection matrices in the core and RIU's, but the circuits of FIGS. 22A and 23A are preferred. These active repeaters in matrix 370 make programmable connections between selected ones of the north-south conductors of column 350 and the conductors of east-west row 372, and, at intersections having bidirectional active repeaters, vice versa.

The logic block 356 is connected to the lines of the east-west row 372 by a bus 354 each line of which is the output of a multiplexer, the multiplexers being represented by the Xs on bus 354. The symbol 374 in this instance represents a 10 or 11 input multiplexer with its inputs coupled to each of the 10 individual conductors represented by bus 376. The multiplexer has a sufficient number of select inputs (not shown) to select one of the conductors in bus 376 which is connected to one of the inputs represented by line 354. The select signals are programmable and the logic states on these lines are defined by programming bits stored in memory cells (not shown) set by the user. The preferred circuit for the multiplexers is shown in FIG. 27 which shows a 4-input buffered multiplexer which can be extended to as many inputs as needed. This same multiplexer is used for the multiplexers 456, 458 and 460 in FIG. 26 and for all the multiplexers in each RIU programmable connection matrix. These buffered multiplexers are also considered active repeaters because they have gain and can reconstruct a signal and there is no direct connection between line segments coupled to the inputs and outputs.

FIG. 23A is a circuit diagram of the preferred CMOS bidirectional tri-state driver, and FIG. 23B is a truth table defining the operation of the circuit of FIG. 23A.

When the enable A (EA) and enable B (EB) programmable control inputs on lines 380 and 382 are both low, the driver is in tri-state mode and no signal on line A propagates to line B or vice versa. When EA is low and EB is high, signal line B is an input and signal line A is an output so transitions on B show up on output line A inverted and with energy lost to parasitics replaced by the active nature of the repeater. Likewise, when EA is high and EB is low, signal line A is the input and signal line B is the output so transitions on A show up inverted on B with energy lost to parasitics replaced and the signal regenerated.

The ovals within connection matrix 370 in FIG. 21 represent either the one-way tri-state driver of FIG. 22A or the bidirectional tri-state driver of FIG. 23A. The particular programmable connection possibilities selected for connection matrix 370 and the connection matrix between the conductors of column 350 and the conductors represented by line 352 are not part of the RIU invention claimed herein and any combination of one-way and bidirectional active repeaters at any combination of junctions will suffice to practice the RIU invention.

Referring to FIG. 24, there is shown a top view layout diagram for a single RIU showing the relative positioning of the RIU for coupling to the columns of four logic blocks, 8 I/O cells and pads, one power pad for the I/O circuitry, one ground pad for the I/O circuitry and two slots which can be used for dedicated pins or for power and ground connections to supply the core logic blocks. Logic blocks 0–3 are laid out in areas 384, 386, 388 and 390. The north-south column of input and output lines is shown at 350 with the one-way tri-state buffers coupled to line 352 in FIG. 21 laid out in area 392, the bidirectional repeaters 362 and 364 in FIG. 21 laid out in area 394 and the programmable connection matrix 370 laid out in area 396. Areas 398, 400 and 402 contain memory for storing programming bits to define the state of the programmable connections made in the matrices in areas 392, 394 and 396. Area 404 is the SRAM for logic block 384, and area 406 is the memory that defines the functionality of the logic block and the configuration of the SRAM.

The 8 I/O pads are shown as IO_0 through IO_7, and their respective programmable logic that defines whether each pad is an input or output signal line is laid out in areas 408, 410, 412, 414, 416, 418, 420 and 422, respectively. A full slot 424 and half slots 426 and 428 (shared with neighboring RIUs) complete the possible input and output connection possibilities for the RIU indicated generally at 430. These slots can be used for dedicated signal line or for power and ground connections to supply power to the circuits of the core array.

The RIU includes 4 programmable connection matrices one of which is outlined in dashed lines at 432. Each of these 4 programmable connection matrices within an RIU has a partial population of possible connections which is different. Each is equivalent in the sense that each provides a plurality of programmable connection possibilities. However, in the preferred embodiment, the specific connection possibilities are different for different connection matrices, because this creates "chaos" in the routing possibilities which helps the routing software. In interface circuit 432, area 434 contains a plurality of tri-state buffer drivers which form part of the programmable connection matrix. The overall RIU is a circuit of fixed design, placement and layout, but it provides a multitude of connection possibilities through programming of the connection matrices. Each RIU is comprised of 4 interface cells or programmable connection matrices, 8 I/O cells each of which can be programmed to be either an input or an output (or both), 1 power pin and 1 ground pin to supply power to the I/O cells and 2 slots comprised of a complete slot in the middle of the I/O cells and two ½ slots.

This entire RIU structure can be "cut and pasted" into an FPGA circuit layout as many times as needed to handle the necessary connections to the core array of logic blocks. Because the ratio of I/O to power and ground pins is the same in every RIU, this ratio remains the same as more RIUs are added to handle connections to bigger core arrays or RIUs are taken away when the size of the core array decreases. Further, the connectivity (connection possibilities) of the core array to the I/O cells through the RIUs remains the same as the number of RIUs increases or decreases. Thus, the increased number of connections needed to handle bigger arrays are automatically provided by cutting and pasting more RIUs into the design. The fact that the padframe interface circuit can be designed by this simple cut and paste operation substantially reduces the time needed for design, placement and routing functions and substantially reduces the time to market for a new chip in the family. The standard interface circuit also provides scaleability with changing process lithography design rules. The exact connections which are programmably possible within the RIU programmable connection matrix and the exact circuitry used to make these connections possibilities available and programmable are not critical to the genus of the invention. The invention of the genus lies in the fact that all the RIUs are the same and have the same ratio of I/O to power and ground pins and all provide programmable connections to the input and output signal lines of the same number of columns thereof coming out of the core logic block array. This provides "cut and paste" utility to designing the padframe interface for bigger FPGAs in the same family thereby reducing time to market, and provides scaleability by virtue of the constant ratios which are maintained as the number of RIUs rises.

PREFERRED SPECIES OF RIU WITHIN THE INVENTIVE GENUS

Figure 25:
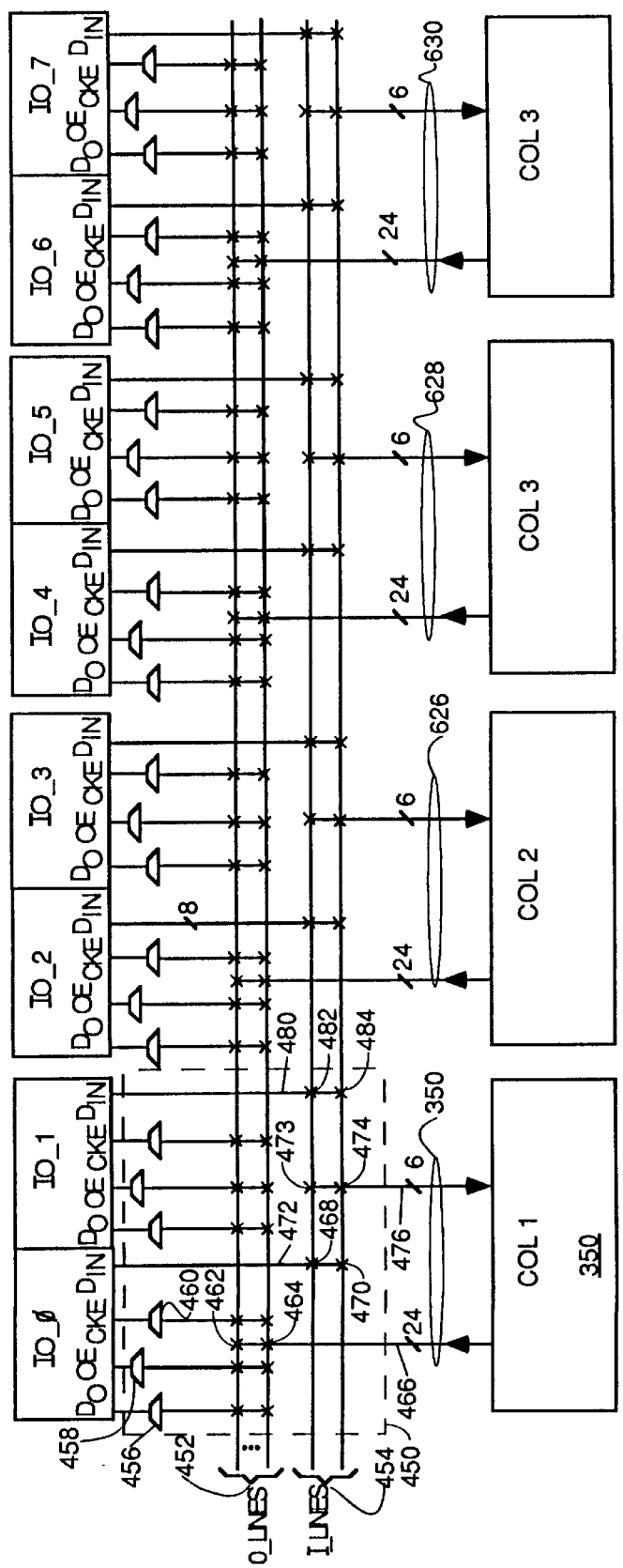
FIG. 25 is a pseudo-schematic diagram of the programmable connection matrix of a single RIU.

Referring to FIG. 25, there is shown a block diagram of the structure of one RIU including details on the programmable connection possibilities provided by the programmable connection matrix. The RIU's programmable connection matrix is represented by four individual programmable connection matrices, one of which is outlined at 450. Multiple, partially populated connection matrices are represented by the X's since each of the horizontal and vertical signal lines in the diagram actually represents plural lines. The particular connection possibilities selected for this species are given in table form below, but other combinations of partially populated connection possibilities are possible for different species and fully populated (a programmable connection possibility at every intersection between crossing signal lines) connection matrices are also possible in some species. Fully populated connection matrices are not as fast as partially populated matrices because of the number of gate loads on the signal lines and the associated parasitic capacitance loads placed on the signal paths. Parasitic capacitance slows signal propagation.

The general structure of the programmable connection matrix is as described in the following paragraphs. Twelve intermediary signal lines called O_lines, shown at 452, are used to make output I/O connections, and 12 intermediary signal lines called I_lines, shown at 454, to make input I/O connections. Multiplexers such as multiplexers 456, 458 and 460 make programmable connections between the O_lines and the three inputs of each I/O cell used for data output. The multiplexers have the structure shown in FIG. 27 but extended to as many inputs as necessary.

A partially populated array of tri-state drivers symbolized by X's 462 and 464 are used to make programmable connections between the 24 output signal lines of bus 466 taken from the 36 total lines of column 350 which extends into the array of programmable logic blocks (not shown). Likewise, a partially populated array of tri-state drivers symbolized by X's 468 and 470 make programmable connections between the data-in line 472 coming from the I/O cell IO_0 and the I_lines 454. The tri-state drivers of these two connection arrays preferably have the structure shown in FIG. 22A. Likewise, a partially populated array of tri-state drivers symbolized by X's 473 and 474 make programmable connections between the 6 data input lines of bus 476 of column 350 and the I_lines.

This general structure is repeated for each of the four programmable connection matrices like matrix 450. Each programmable connection matrix connects two I/O cells, either one or both of which may be programmed as a data input or a data output (or both—meaning a signal exits the array, goes to an I/O cell on a first line and is turned around in the I/O cell and sent back into the core array on a different line), to one column such as column 350 which goes into the logic block array. The I_lines extend across the entire RIU and are coupled to each of the four programmable connection matrices. The O_lines extend only half way across the RIU in this species and connect to only two of the four programmable connection matrices, but there are two sets of O_lines, one of which couples to the first two connection matrices and the other of which couples to the other two connection matrices. The above described general structure is repeated for each RIU.

The overall RIU provides the connection possibilities generally described below through the programmable connection matrix for the top and bottom edges of the padframe interface. In this particular species, left and right side padframe interface connection possibilities are different from the top and bottom interface circuits and are different from each other. This is because of the specific architecture of the core array chosen (which is not part of the invention), but in some species the left and right side connection possibilities in the padframe interface connection matrix may be the same as the top and bottom.

For the top and bottom edge connection matrices, each RIU couples to four columns such as column 350 coming out of the core array. There is one programmable connection matrix per column. Each column has 24 output lines and 6 input lines. The overall RIU programmable connection matrix provided by the four programmable connection matrices is coupled to provides output connectivity to the core array such that any of the four I/O cells coupled to a particular set of O_lines which is programmed as an data output can programmably receive its data from any of a preselected 14 of the 24 total output lines from each of the two columns coupled to the same set of O_lines that the four I/O cells are coupled to. In other words, although any particular I/O cell programmed to provide a data output can only be driven by one output signal from the core array, that one output signal can be, by proper programming of the appropriate connection matrices, be from any of a preselected 14 of the 24 output lines from one of the columns to which those matrices are coupled or any of a preselected 14 of the 24 output lines from the other of the two columns to which the connection matrices are coupled.

Input connectivity is slightly different because any input pin can be used to drive multiple inputs to the core array simultaneously. The particular species of RIU selected for the top and bottom padframe interface circuit allows any of the eight I/Os of the RIU programmed as an input to simultaneously drive up to 3 preselected input lines of the 6 input lines of each of the four columns. The only restriction is that only one I/O cell programmed as an input can drive any particular I_line at any particular time since the I_lines extend across the entire RIU and are coupled to all four connection matrices. To make this clear, suppose that I/O cell IO_0 is programmed as an input and the connection matrix to which it is coupled is programmed such that the data-in line 472 of this particular I/O cell is connected to drive I_line 11 through a tri-state driver. I_line 11 can be coupled to a selected one of the 6 input lines of two selected columns through tri-state drivers, and all of those tri-state drivers can be programmed to be turned on so that this single data input signal can be driven onto 2 different signal inputs of two selected columns. By changing the I_line which the data input line 472 drives, up to three data input lines in each of the four columns can be driven simultaneously. These input connection possibilities are detailed in tables of the Figures for the RIU's of the top, bottom, left and right sides of core array. Since the data input line is not programmably connected to each I_line because the connection matrices 482 and 484 are not fully populated, it cannot drive all six input lines of each of the four columns in this particular species.

Figure 26:
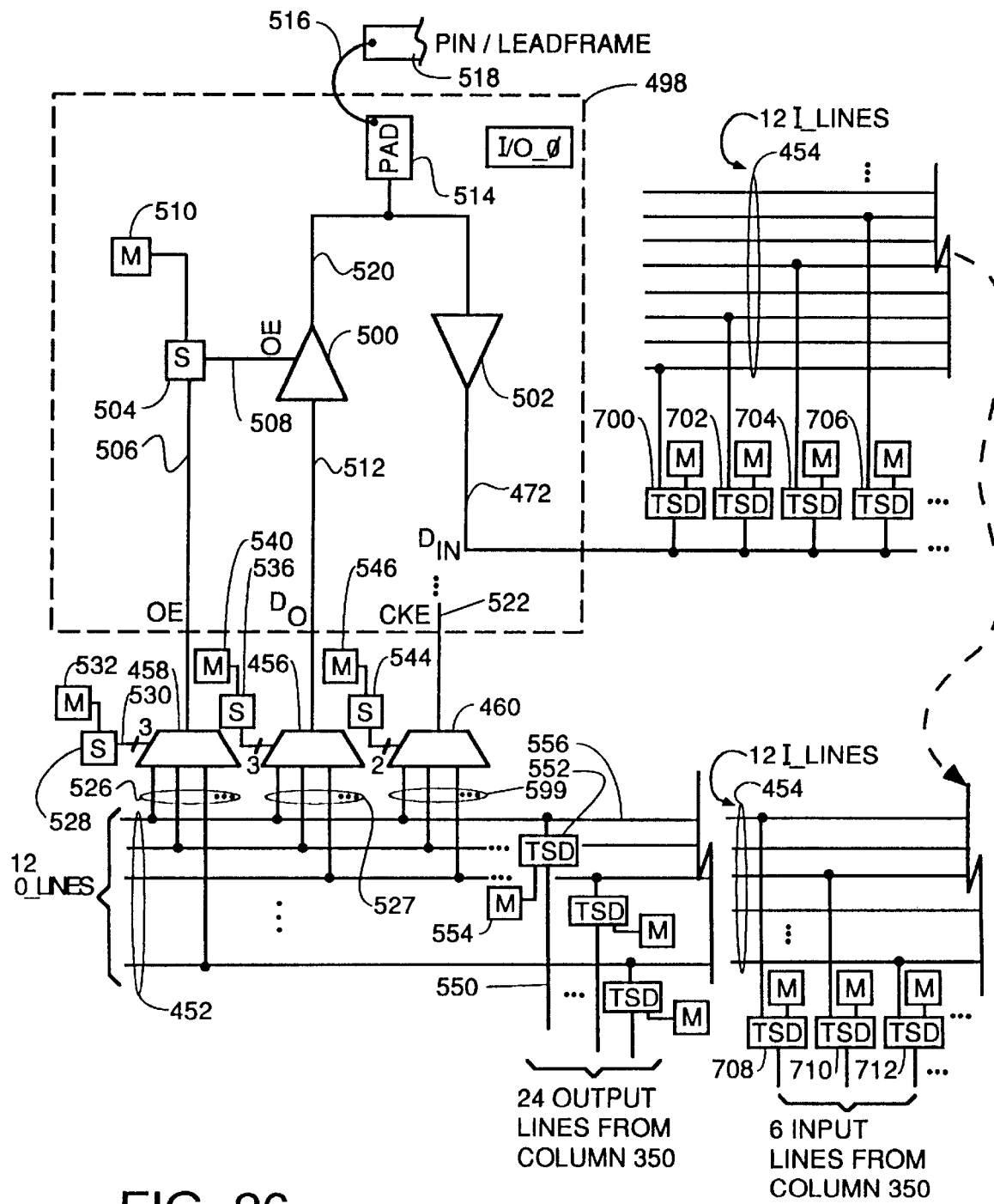
FIG. 26 is an expanded pseudo-schematic diagram illustrating the general structure of the output connection matrix for a single input/output cell in the programmable connection matrix.
Figure 27:
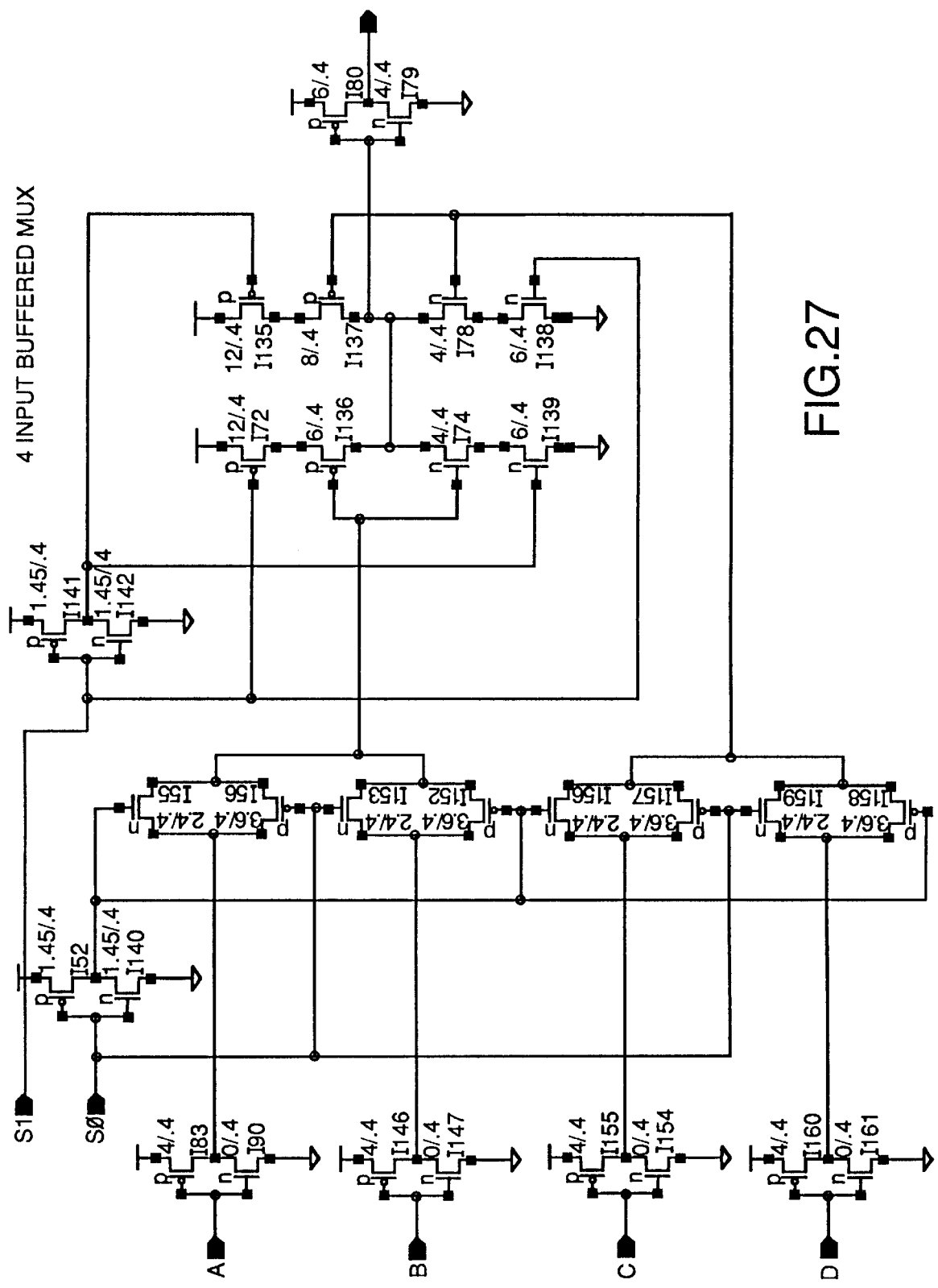
FIG. 27 is a circuit diagram of a 4-input multiplexer which can be extended to large numbers of inputs to implement the multiplexers in the core array and in the programmable connection matrix of the RIU.

The nature of the connections in the programmable connection matrix 450 represented by the X's is made more clear in FIG. 26 which is a simplified block diagram of a typical I/O cell showing its four inputs and output and how those three of those inputs which are in use when the I/O cell is programmed as an output are coupled to the O_lines and how the O_lines are coupled to the 24 output signal lines of the column 350. Referring to FIG. 26, the I/O cell 498 is comprised of a data output driver 500 and a data input driver 502. The I/O cell 498 is programmed as an output when switch 504 is programmed to connect an output enable signal line 506 labelled OE to the enable input 508 of the data output driver. The I/O cell can also be programmed as both a data output and a data input by changing the state of switch 504 periodically. In this type operation, a data output signal emerges from the core logic array on a data output line of column 350 and is routed to driver 500. Switch 504 is set to a state such that driver 500 receives the data output signal and drives it onto line 520, where driver 502 receives it. Since driver 502 is always enabled, it drives whatever signal is on line 520 onto line 472. Line 472 can be coupled through the I_lines and the programmable connection matrix to various input signal lines of various columns. Thus, it is possible to take data outputs on some lines of the columns and route them back into the core array on various data input lines of various columns through an I/O cell. This provides the possibility offloading some of the routing problems in the core array that cannot be routed within the core array itself because of a bottleneck to interconnects made through a bidirectional I/O cell.

Polarity (whether 1 or 0 activates it) of switch 504 is controlled by a programmable bit stored in memory cell 510. The switch 504 is turned on or off by data on line 506 driven by the core array through MUX 458. When the OE line is connected to driver 500, an active output enable signal on line 506 will cause the driver 500 to come out of a high impedance tri-state mode and drive whatever data signal that exists on $D_O$ line 512 out to pad 514, wire bond 516 and pin 518 via line 520. A CKE clock enable line 522 carries a clock enable signal which is only used in register mode.

The signals supplied to the I/O cell 498 are supplied from the array of core logic blocks through three multiplexers. Multiplexer 458 has five inputs 526 which make non-programmable tap connections to 5 selected O_lines (detailed in the table of FIG. 28) of the 12 total O_lines. Which particular one of these O_lines that is selected for coupling to OE line 506 is programmably controlled through a programmable switching circuit as shown in FIG. 26, which controls the states of 3 select bits on bus 530. The state of switching circuit 528 is controlled by programming bits stored in memory 532. In the preferred embodiment, the three select lines 530 are controlled by three individual programming bits.

The particular O_line which is selected to drive the $D_o$ line 512 is controlled by multiplexer 456, switching circuit 536 which controls the states of three select bits of the select input of multiplexer 456 and programmable bits stored in memory 540 that control the state of the switching circuit 536. Again, individual programming bits can be used to control the select lines. Multiplexer 456 has 7 inputs that are non-programmably connected to 7 selected O_lines of the 12 total. Which particular O_lines are selected is detailed in Table 1. Likewise, the CKE clock enable line 522 is controlled using multiplexer 460, switching circuit 544 and memory cell 546. Multiplexer 460 has 4 inputs which are non-programmably coupled to the 4 selected O_lines detailed in the table of FIG. 28, column 606.

In this particular species, the 12 O_lines are each programmably coupled through individual, programmable tri-state drivers to 2 selected ones of the 24 output lines of column 350. This is symbolically shown as the connection of output line 550 through tristate driver 552 to O_line 556. Whether tri-state driver 552 is turned on or turned off is programmably controlled by a bit stored in memory cell 554. The particular ones of the 24 output lines of column 350 which can be programmed to be connected to particular O_lines is detailed in the table of FIG. 28.

Figure 28:
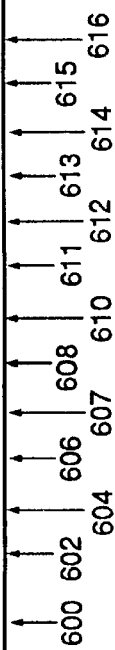
FIG. 28 is a table showing the output signal connections for the multiplexer inputs to the O_lines and the output signal lines of each column to the O_lines for a particular species of top and bottom padframe interface circuit programmable connection matrix.

The table of FIG. 28 details the output connection possibilities for driving the $D_o$, CKE and OE lines of each I/O cell programmed as an output for each RIU in either the top or bottom padframe interface circuit and is specific to the particular species used in the top and bottom padframe interface. Other programmable connection possibilities may be selected for other species and connection matrices which are either more populated or less populated may be used and still be within the genus of the invention. The table of FIG. 28 details the "hard wired" connections of the inputs of multiplexers 456, 458 and 460 to the O_lines so as to control the $D_o$, OE and CKE inputs of an I/O cell programmed as an output, and also details the programmable connection possibilities between the 24 output lines of each column and the 12 O_lines.

In the table of FIG. 28, column 600 represents the 12 O_lines, and column 602 represents the connection taps between the O_lines and the seven inputs of multiplexer 456 whose output is the $D_0$ input of the I/O cell 498. The taps to the O_lines of the five inputs 526 of multiplexer 458 controlling the OE input of I/O cell 498 are shown as Xs in column 604 of the table of FIG. 28. The taps to the O_lines of the four inputs 599 in FIG. 26 of multiplexer 460 controlling the CKE input of the I/O cell 498 are shown as Xs in column 606 of FIG. 28. The connection patterns to the O_lines of the three multiplexers controlling the $D_0$, OE and CKE lines for each of the other three I/O cells of the first half of the RIU (the second half I/O cells IO_4, IO_5, IO_6 and IO_7 have identical O_line output connections as the first half detailed in the table of FIG. 28) are also detailed in columns 607, 608, 610, 611, 612, 613, 614, 615 and 616, respectively.

The programmable connection possibilities between the 24 output lines from the core array of bus 466 of FIG. 25 forming part of column 350 are detailed in the right half of the table of FIG. 28. The columns labeled 0 through 29 represent the 30 output signal lines of bus 350 only 24 of which come out of the core array to the RIU connection matrix. The 6 output lines that do not extend into the RIU are represented in the right half of the table of FIG. 28 as dots. The Xs in the right half of the table of FIG. 28 represent programmable connections to the O_lines via tri-state driver active repeaters such as that shown in FIG. 22A.

The connections shown in the table of FIG. 28 are specific to the particular species detailed here as an example and are specific to this species as it is used in the top and bottom padframe interface circuits.

Figure 29:
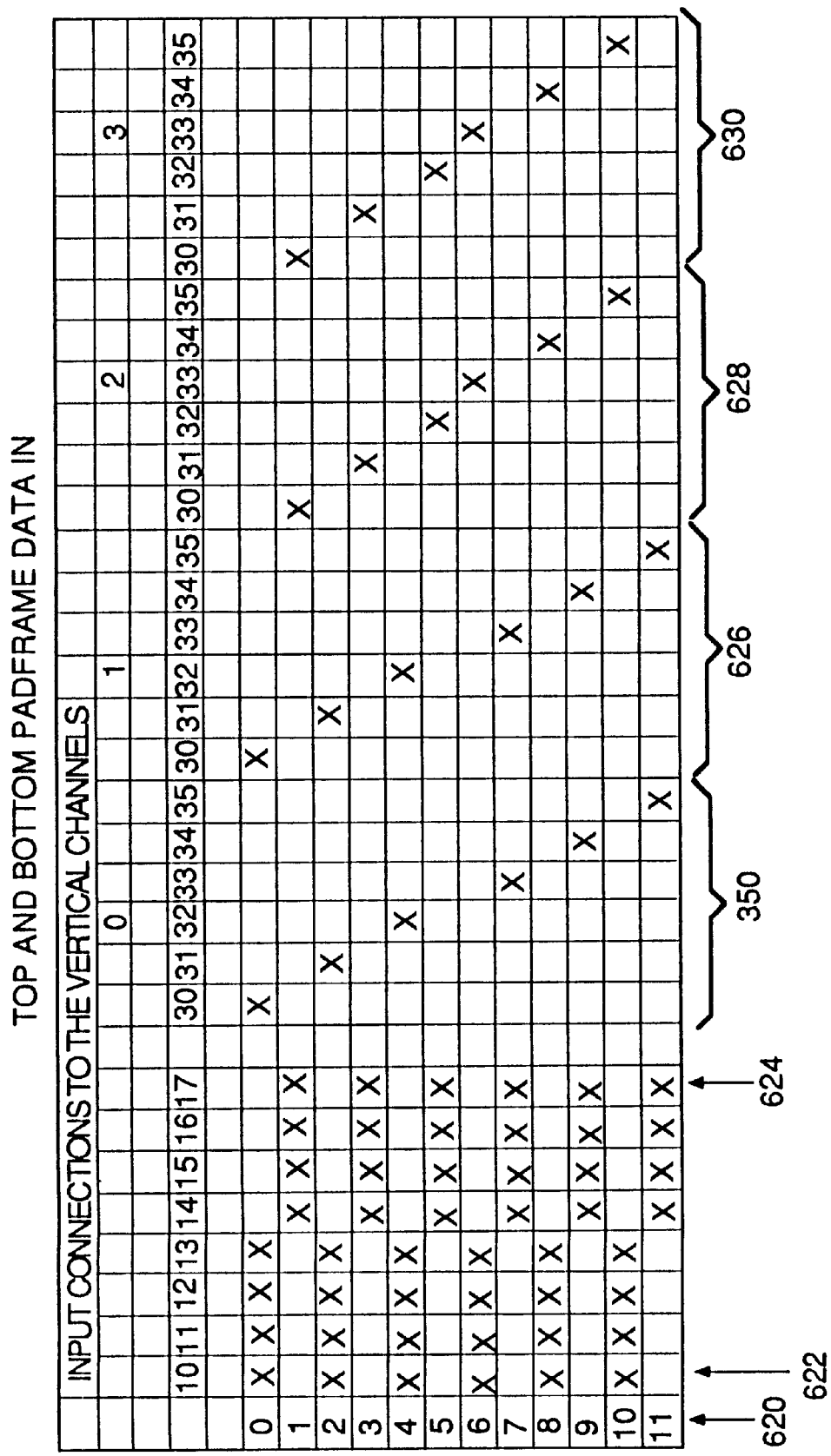
FIG. 29 is a table showing the data input connections for a particular species of top and bottom padframe interface circuit programmable connection matrix showing the details of the connections of the 8 data input lines of all 8 of the I/O cells of a single RIU to the I_lines and the population of the programmable connections in the programmable connection matrix between the I_lines the data input lines of all 4 columns of a single RIU.

The data input connections between the I_lines and the data input line 472 of each of the 8 I/O cells of an RIU are given, for the top and bottom padframe interface circuits, in the table of FIG. 29 and shown schematically in FIG. 26. FIG. 26 shows a partial schematic diagram of the programmable connection matrix for data input lines represented by Xs 468, 470, 473 and 474 in FIG. 25 to illustrate the general concept that defines the genus. The table of FIG. 29 gives the specific connections of the preferred species within this genus. In FIG. 26, the data input signal line 472 coming out of the I/O cell is coupled to a plurality of tri-state drivers of which drivers 700, 702, 704 and 706 are typical. Each of these drivers is coupled to a specific one of the 12 I_lines 454. The specific connections for the preferred species are shown in the left half of the table of FIG. 29. Some of the possible programmable connections to the data input lines of just one of the columns are shown in the lower right hand corner of FIG. 26. The I_lines have programmable connection possibilities through tristate drivers to all of the data input lines of all of the columns of the RIU, but not every I_line can connect to every data input line of every column. In other words, the programmable connection matrix is not fully populated. In FIG. 26, some of the tri-state drivers that provide programmable connection possibilities between predetermined I_lines and predetermined data input lines of column 350 are shown at 708, 710 and 712. Each of the tri-state drivers has a memory cell, indicated as a box with an M in it, that stores a programming bit which defines whether the tristate driver is "on" or "off".

Because of space limitations, not all of the tri-state drivers that connect line 472 to the I_lines or the data input signal lines of all four columns of the RIU to the I_lines can be shown. However, the particular I_lines that are connected to line 472 and the particular I_lines that are coupled to each data input signal line of each column can be determined for this particular species from the table of FIG. 29. The programmable connection matrix is comprised of this complete collection of tri-state drivers represented, for this species, by the Xs in the table of FIG. 29. The term "routing area" as used in the claims means the entire collection of all the I_lines and all the O_lines and all the tri-state drivers represented by the Xs in the input and output connection tables such as FIGS. 28 and 29. Although the particular connection possibilities differ from species to species and even within the same species vary from top and bottom to left and right sides, the general concept of a routing area in an RIU is the same and is illustrated by these examples.

In FIG. 29, column 620 gives the individual line numbers of the 12 I_lines 454 in FIG. 25. Column 622 details the available programmable connection possibilities between the data input line 472 of I/O cell IO_0 and the 12 I_lines. Each X in column 622 represents a programmable one-way connection between line 472 and the I_line in whose row the X resides through a tri-state driver inverter such as the circuit shown in FIG. 22A. There are 8 columns representing the $D_{in}$ line connection possibilities to the I_lines for each of the 8 I/O cells of the RIU, the last of these columns being column 624.

The right half of the table of FIG. 29 represents the programmable connection possibilities between the six input lines of each column like column 350 for each of the four columns 350, 626, 628 and 630 in FIG. 25. The programmable connection possibilities for the six input lines of bus 476 in FIG. 25 forming part of column 350 are given in the six columns labelled with a bracket numbered 350 with each individual line numbered 30 through 35. Each X represents a programmable connection possibility through a tri-state driver.

As is the case for the output programmable connection matrices, the particular population of the input programmable connection matrices selected is peculiar to this particular species of RIU, and other programmable connection populations may be selected for other species. The connection matrices are only partially populated for purposes of limiting the number of gate loads affecting any particular line to limit the amount of parasitic capacitance coupled to the line. This limitation is useful for improving the speed of performance.

Figure 31:
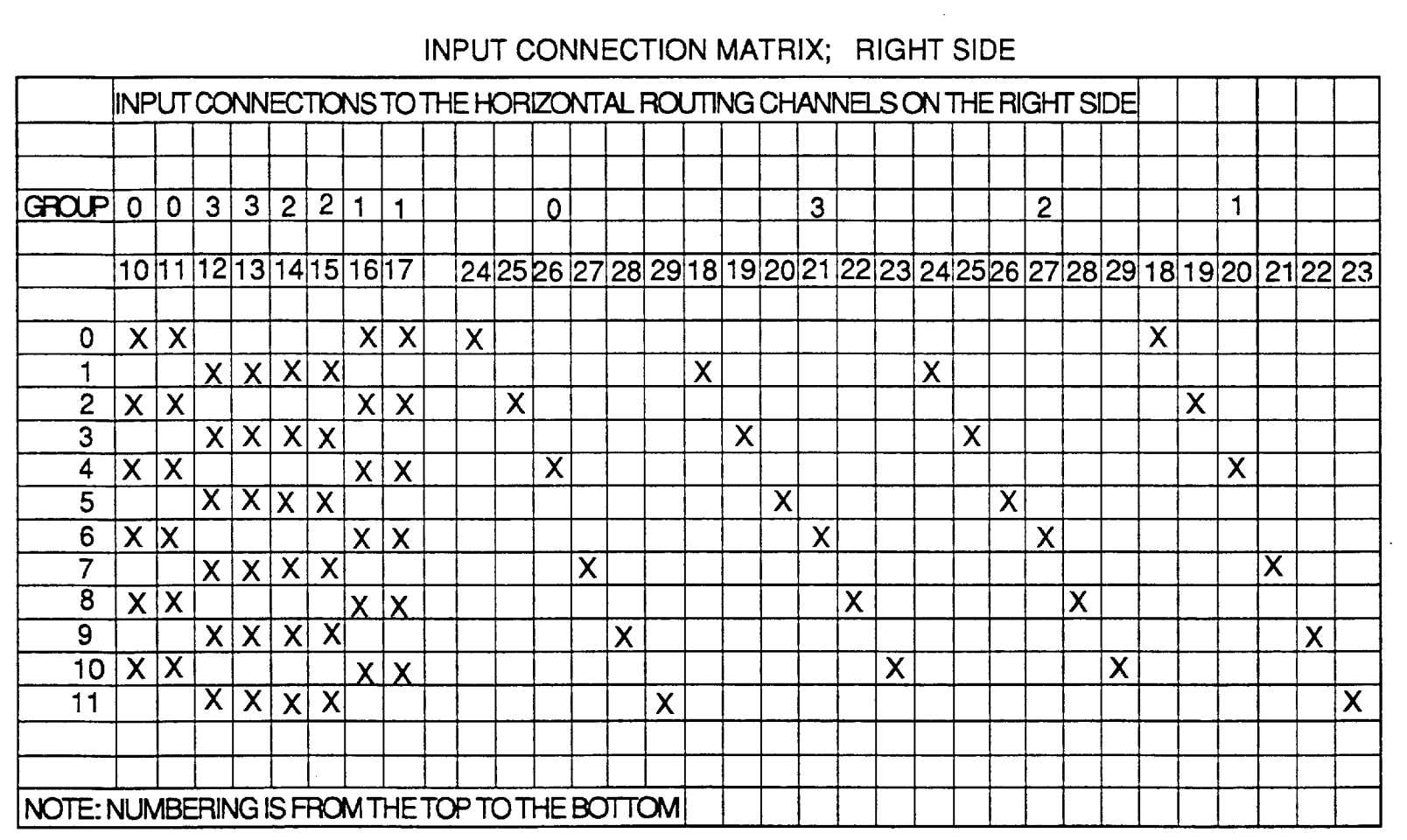
Figure 32A:
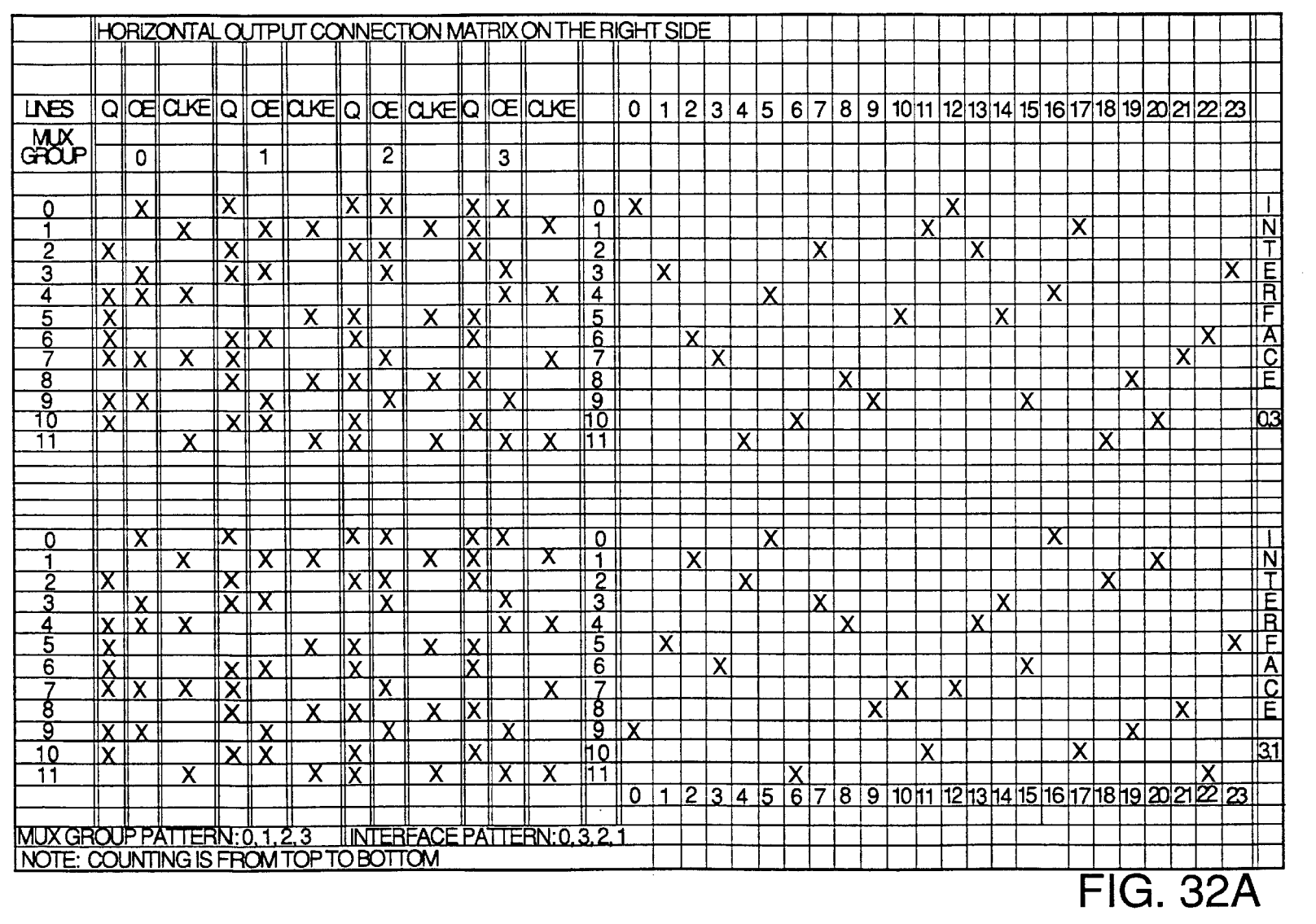
Figure 32B:
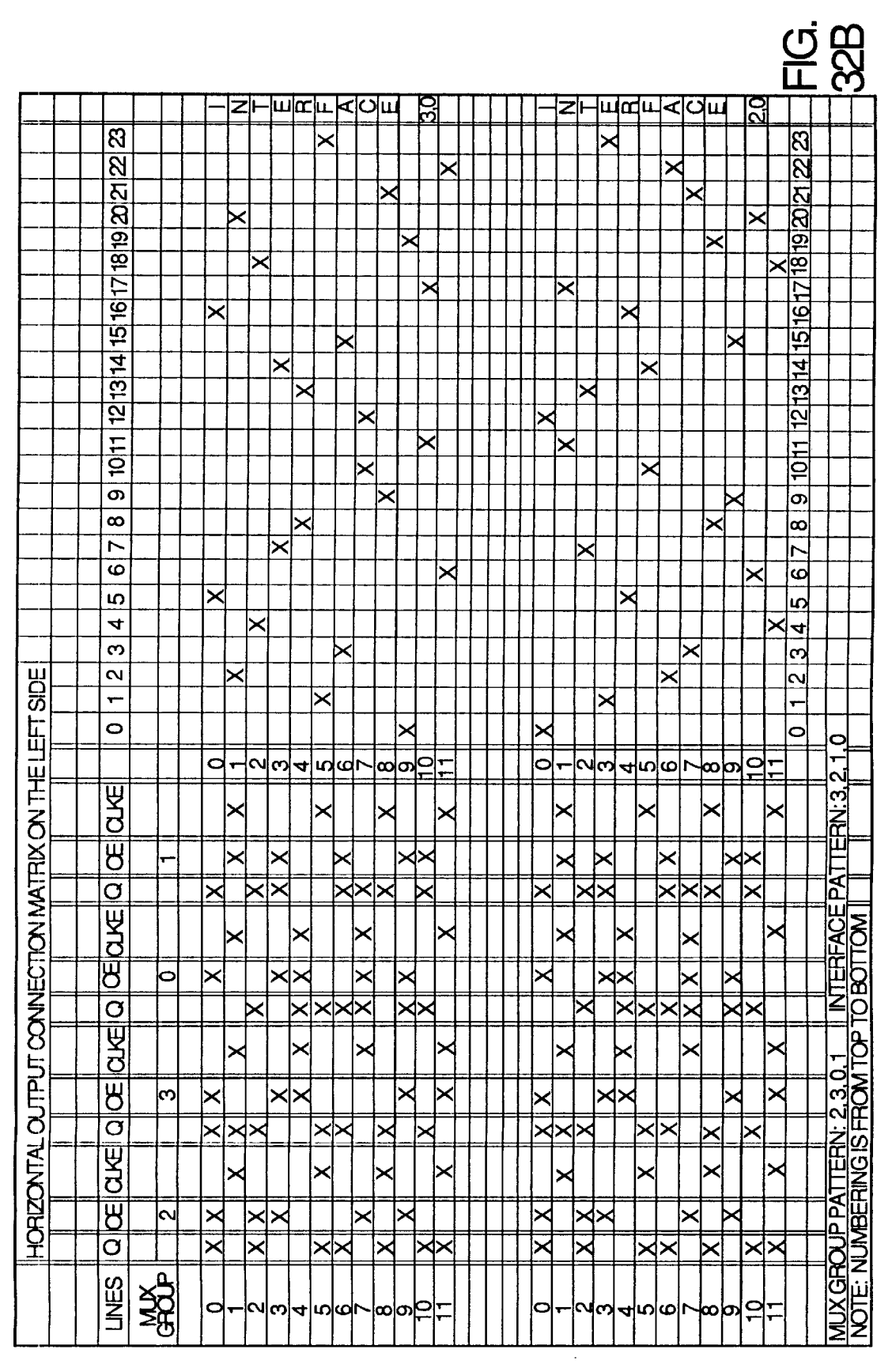

The data input programmable connection possibilities for connections between I/O cells and input lines in rows extending from the left side of the core array are shown in the table of FIG. 30. The data input programmable connection possibilities for connections between I/O cells and input lines in rows extending from the right side of the core array are shown in the table of FIG. 31. FIGS. 32A and 32B are tables showing the data output connection possibilities for a particular species of right and left side RIUs, respectively.

Figure 35:
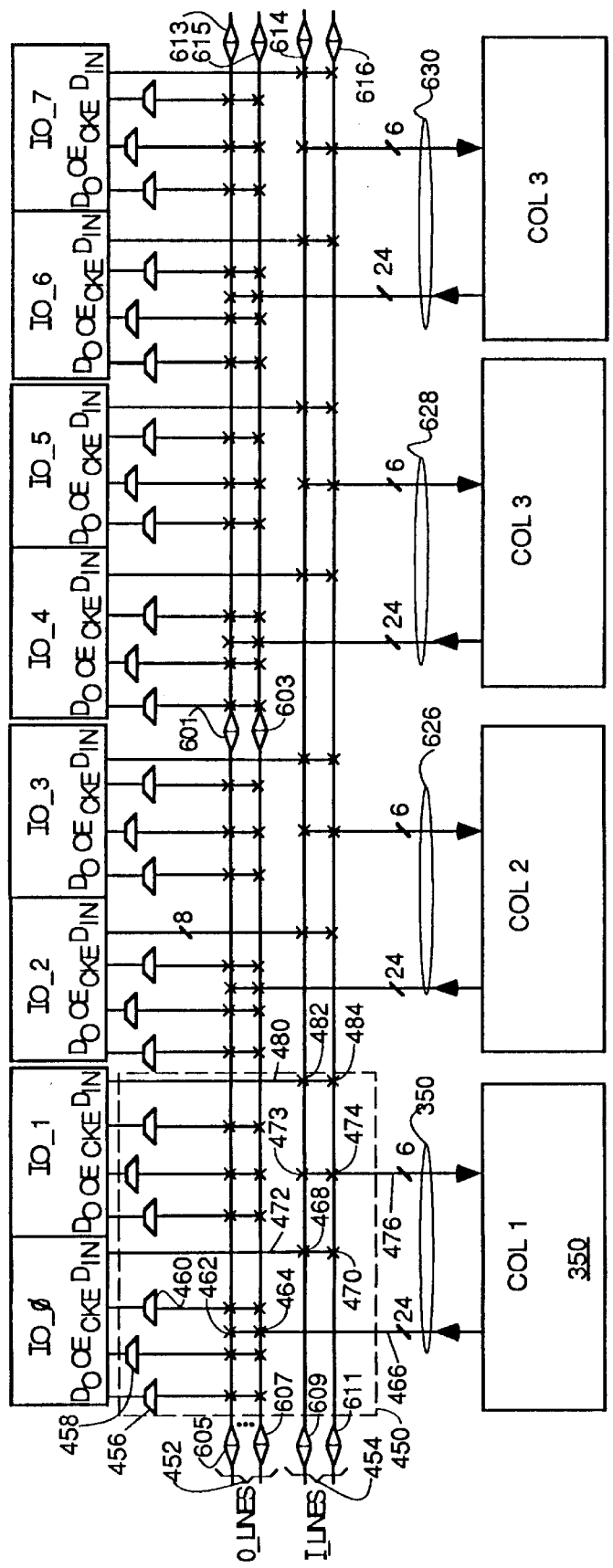
FIG. 35 shows an alternative embodiment for an RIU structure.

Referring to FIG. 35, there is shown an alternative embodiment for an RIU structure. Everything about this structure is the same as the structure shown in FIG. 25, except bidirectional repeaters have been added to provide for more routing possibilities. Specifically, bidirectional repeaters 601 and 603 have been added to programmably couple all or a selected few of the first half O_lines to the corresponding second half O_lines bus inside each RIU. Bidirectional active repeaters 601 and 603 represent a plurality of bidirectional active repeaters, one for each O_line (in some embodiments, only some of the O_lines will have bidirectional active repeaters between the halves thereof). Also, bidirectional active repeaters 605 and 607 (also representing one bidirectional active repeater for each O_line, or a selected few in alternative embodiments) have been added to programmably couple all or a selected few of the O_lines of bus 452 to the corresponding O_lines of the neighboring RIU on the left. Also, bidirectional active repeaters 609 and 611 (also representing one bidirectional active repeater for each I_line, or a selected few in alternative embodiments) have been added to programmably couple all or a selected few of the I_lines of bus 454 to the corresponding I_lines of the neighboring RIU on the left. Also, bidirectional active repeaters 613 and 615 (also representing one bidirectional active repeater for each O_line, or a selected few in some embodiments) have been added to programmably couple all or a selected few of the O_lines of bus 452 to the corresponding O_lines of the neighboring RIU on the right. Finally, bidirectional active repeaters 614 and 616 (also representing one bidirectional active repeater for each I_line, or a selected few in alternative embodiments) have been added to programmably couple all or a selected few of the I_lines of bus 452 to the corresponding I_lines of the neighboring RIU on the right.

The advantage of adding these new active repeaters to the RIUs is that it generates many new routing possibilities thereby easing the job of the routing software. Basically, there is unlimited routing to the core array from the I/O cells because the columns can connect not only the I/O cells of the particular RIU to which they are connected but also to any other I/O cell of any of the other RIUs as well. In other words, with this embodiment, if a particular column coming out of the FPGA core array has a larger number of data input and output signals than there are I/O cells in the RIU to which the column is coupled, the active repeaters in the RIU can be programmed to connect one or more O_lines or I_lines carrying the excess data signals to a neighboring RIU which is not using all its available I/O cells. This of course is subject to the restrictions described above about not putting conflicting signals on the same segment of an O_line or I_line.

The routing process to define the functionality of the FPGA has two components. The first is routing between data input and data output signals of a column and the I/O cells. The second component is routing between different logic blocks in the core array. Of these two components, the routing within the core array dominates the problem. By the provision of the bidirectional active repeaters at the ends of the I_lines and O_lines of the RIU so as to make programmable coupling to the I_lines and O_lines of neighboring RIUs possible and coupling the two separate sets of O_lines within each RIU to each other, it is possible to route some problematic interconnects within the core array (interconnects that cannot be made because of a bottleneck) out the horizontal or vertical buses, through the routing areas of the RIUs and then back into the core array such that the interconnect can be successfully made. Further, because the interconnect is made with active repeaters, even though the interconnect made in this way is longer than a more direct path through the array, because the active repeaters do not substantially worsen the delay as the new segments are added, the longer interconnects are more useable than would be the case if the longer interconnects were made with pass transistors.

Another advantage of adding the bidirectional repeaters 601 through 616 in the RIUs is that it relieves a restriction which would otherwise have to be placed on the routing software. Specifically, there sometimes arises a situation wherein the number of pins available to bond out to data signal inputs and outputs from the core array is fewer than the total number of data signal inputs and outputs of the FPGA. In this case, bottlenecks can arise in the I/O routing if the bidirectional active repeaters are not added to the RIU. Specifically, all the I/O cells of a particular RIU may be needed for connection to particular data input and output signals of the columns to which the RIU is connected. Suppose now that there is another data input or output signal in these columns which must be connected to a pin. In this case without the active repeaters in the RIU, that signal will be lost and will not make it to the outside world because there is no available I/O cell in its RIU. With the active repeaters 601 through 616 present in the RIU, this signal can be routed to an I/O cell in another neighboring RIU (or an RIU on the other side of the chip) as long as there are available segments of the I_lines or O_lines through which the interconnect can be routed to the appropriate I/O pin. This makes the job of the routing software much easier.

Although the invention has been described in terms of the preferred and alternative embodiments disclosed herein, those skilled in the art will recognize various structural and functional equivalents of the circuits disclosed herein. For example, any of the differential current mode logic current switches could be replaced by single ended versions such as are shown in FIG. 18. Other fast switching technology could be substituted for the bipolar devices shown herein and bipolar or other faster switching devices could be substituted for the CMOS enabling devices. All such structural and functional equivalents are intended to be included within the scope of the claims appended hereto.

What is claimed is:

1. An apparatus for an integrated field programmable gate array having a core array of programmable logic circuits comprising:

first and second pluralities of programmable I/O cells any one of which can be programmed to act as a data input or data output port for an integrated circuit, each I/O cell having a $D_o$ input for receiving a data output signal, an OE output enable input for receiving a signal which enables said I/O cell to drive any signal received at said $D_o$ input to an external pin and a CKE clock enable input for receiving a clock enable signal, and having a $D_{in}$ output at which a data input signal is presented if said I/O cell is programmed as a data input and having at least one programming signal input;

means coupled to the at least one programming signal input of said first and second pluralities of programmable I/O cells for supplying one or more programming signals that define whether each said I/O cell acts as a data input or a data output or both;

a first plurality of intermediary O_line conductors;

a second plurality of intermediary O_line conductors;

a plurality of intermediary I_line conductors;

first, second and third active repeater type multiplexers associated with each I/O cell in said first plurality of I/O cells and having first, second and third outputs coupled to said $D_o$, OE and CKE inputs, respectively, of the associated I/O cell, and having a plurality of inputs each of which is connected to a selected one or more of said first plurality of O_line conductors, said first, second and third multiplexers associated with each I/O cell in said first plurality of I/O cells having select inputs for receiving signals which control which input of each multiplexer is coupled to its output, and wherein each active repeater type multiplexer is implemented with switching transistors which are coupled to an external power supply when operational and programmed to select an input for coupling to said output of said multiplexer so as to use the large current drive and current sink capacity of the external power supply to charge or discharge parasitic capacitance loading said output of said multiplexer in accordance with the logic transitions of the input signal of the selected input to be coupled to said output;

fourth, fifth and sixth active repeater type multiplexers associated with each I/O cell in said second plurality of I/O cells and having first, second and third outputs coupled to said $D_o$, OE and CKE inputs, respectively, of the associated I/O cell, and having a plurality of inputs each of which is connected to a selected one or more of said second plurality of O_line conductors, said fourth, fifth and sixth multiplexers associated with each I/O cell in said second plurality of I/O cells having select inputs for receiving signals which control which input of each multiplexer is coupled to its output, said fourth, fifth and sixth active repeaters having the same structure as said first, second and third multiplexers;

means coupled to said select inputs of said first, second, third, fourth, fifth and sixth multiplexers for providing programmable signals to said select inputs to control which input of each multiplexer is coupled to that multiplexer's output;

a first plurality of active repeaters in the form of tri-state drivers programmably coupling said $D_{in}$ output of each I/O cell to a selected one or more of said plurality of intermediary I_lines;

a plurality of output lines from each of a plurality of buses comprised of conductors that pass through said array of programmable logic circuits carrying output signals therefrom;

a plurality of input lines in each of said plurality of buses for carrying input signals to said array of logic circuits a second plurality of active repeaters in the form of tri-state drivers programmably coupling said plurality of output lines from said buses to selected ones of said first and second pluralities of intermediary O_lines; and a third plurality of active repeaters in the form of tri-state drivers programmably coupling said plurality of input lines in said buses to selected ones of said plurality of intermediary I_lines;

and wherein each said active repeater is implemented with one or more switching transistors which are coupled to an external power supply when operational and programmed to be in an enabled state so as to regenerate on an output conductor an input signal appearing at an input of said active repeater by using the large current drive and current sink capacity of the external power supply to selectively charge or discharge parasitic capacitance loading said output of said active repeater in accordance with the logic transitions of the input signal so as to speed up the rise and fall times of the logic transitions created on said output conductor relative to corresponding logic transitions of the input signal, and wherein each active repeater includes programming means for controlling whether said active repeater is enabled or disabled.

2. An interface circuit for coupling input and output signal lines from buses that run through an array of logic circuits in field programmable gate array integrated circuit, comprising:

a plurality of input/output cells each of which can be programmed to be either a data input port for receiving input signals from an external source onto one or more input signal lines of said buses, or a data output port for outputting data output signals received from one or more of said output signal lines of said buses to external pins or output conductors of said integrated circuit available to the outside world, or both a data output and a data input for receiving a data output signal on a first conductor from said buses and driving the signal onto a second conductor from said buses which is different from said first conductor;

a plurality of buses each comprised of a plurality of individual data input conductors for carrying data input signals from external sources to an array of logic blocks of an integrated circuit and data output signal conductors for carrying data output signals generated by logic circuits in said array of logic blocks to pins or output conductors available to the outside world; and a programmable connection matrix providing programmable connections between said data input conductors and said data output conductors of said plurality of buses and said input/output cells, and wherein said programmable connection matrix implements every programmable connection using an active repeater where an active repeater is defined as a transistor switching circuit and output stage coupled to high and low voltage conductors of an external power supply when in operation which functions, when enabled, to programmably couple the digital signal propagating on a first conductor to a second conductor by using transistor action under the influence of the input signal propagating in said first conductor to selectively couple said high voltage conductor of said external power supply to said second line segment to charge the parasitic capacitance loading said second conductor or couple the low voltage conductor of said external power supply to discharge the parasitic capacitance loading said second conductor in accordance with the logic transitions of said input signal.

3. The apparatus of claim 2 wherein said plurality of input/output cells comprises eight input/output cells and wherein said plurality of buses comprises four buses.

4. The apparatus of claim 2 wherein said programmable connection matrix is structured so as to allow programmable connection possibilities between one or more of a first set of input/output cells programmed as outputs to data output signal conductors of one or more of a first set of said buses via programmable connections implemented using active repeaters.

5. The apparatus of claim 2 wherein said plurality of buses is divided into a first set and a second set of buses and wherein said plurality of input/output cells is divided into a first set and a second set of input/output cells, each said bus comprises a plurality of dedicated data output signal conductors and wherein said programmable connection matrix is structured so as to allow programmable connections between any one or more of said first set of input/output cells programmed as data outputs simultaneously to any of up to a predetermined number of data output signal conductors of any of said first set of said buses, so long as only one data output conductor, regardless of which bus of which it is a part, is connected to any one I/O cell programmed as a data output at any particular time, and wherein said programmable connection matrix is structured so as to allow programmable connections between any one or more of said second set of input/output cells programmed as data outputs simultaneously to any of up to a predetermined number of data output signal conductors of any of said second set of said buses, so long as only one data output conductor, regardless of which bus of which it is a part, is connected to any one I/O cell programmed as a data output at any particular time, said programmable connections being made through active repeaters.

6. The apparatus of claim 2 wherein said plurality of buses is divided into a first set and a second set of buses and wherein said plurality of input/output cells is divided into a first set and a second set of input/output cells, and wherein said programmable connection matrix is structured so as to allow programmable connections between any one or more of said first or second set of input/output cells programmed as data outputs simultaneously to any of up to a predetermined number of data output signal conductors of either said first or second set of buses so long as only one data output conductor, regardless of which bus of which it is a part, is connected to any one I/O cell programmed as a data output at any particular time.

7. The apparatus of claim 2 wherein said programmable connection matrix is structured so as to provide programmable simultaneous connection possibilities via said programmable active repeaters between one or more of up to all of said input/output cells programmed as inputs and any of up to a predetermined number of said input signal conductors from any of up to all of said buses, so long as no more than one input/output cell programmed as a data input port is driving any particular set of said input signals conductors at any particular time and so long as other input/output cells programmed as inputs do not attempt to use the same conductors in said programmable connection matrix used by any particular input/output cell programmed as a data input port to make its particular connection or connections.

8. The apparatus of claim 3 wherein said programmable connection matrix is comprised of a plurality of individual programmable connection matrices each of which is comprised of a plurality of conductors selectively coupled by a plurality of programmable active repeaters and at least some of which provides different programmable connection possibilities than the other programmable connection matrices in said programmable connection matrix.

9. An interface circuit for interfacing logic blocks in a core array of programmable logic blocks of an integrated circuit to a plurality of external pins of an integrated circuit, said interface circuit having an integrated circuit layout comprising:

a fixed number of input/output cells each of which may be programmed as either an input or an output, or both, and each of which is electrically coupled to an external pin of an integrated circuit, each said I/O circuit including programming circuitry controlling whether said I/O circuit operates as an input, an output or both;

a fixed number of I/O power and ground ports connected to external pins of an integrated circuit and connected to said input/output cells to supply power thereto, said fixed number of I/O power and ground ports established at a number which is high enough to supply adequate current considering the number of input/output cells in said interface circuit;

at least one empty slot for use in laying out power or ground connections from at least one external pin of said integrated circuit to said core array or for making connections from at least one external pin to other circuitry not part of said core array to carry one or more signals needed by said other circuitry;

a plurality of buses each comprising a plurality of data output signal lines carrying data output signals from said core array and a plurality of data input signal lines carrying data input signals to said core array; and a programmable connection matrix coupling said input/output cells to said plurality of data output signal lines and said data input signal lines via a plurality of programmable signal pathways via programmable connections made using an active repeater at every or substantially every programmable connection point.

10. A process for laying out an integrated circuit for a field programmable gate array comprising cutting and pasting a sufficient number of predesigned, substantially identical interface circuits to make connections between a plurality of data input and data output signals lines of buses running through a core array of programmable logic blocks in said field programmable gate array and the external pins of the integrated circuit, each of said substantially identical interface circuits having a plurality of programmable input/output cells for coupling to external pins which can be programmed as either data inputs or data outputs or both in the sense that data signals entering the input/output cell from a data output signal line of a bus may be turned around in an input/output cell and coupled back into said array of logic blocks as a data input signal, each of said substantially identical interface circuits having a plurality of power and ground connections from external pins to the input/output cells which are adequate to supply enough power to that number of input/output cells, and having at least one empty slot and having a programmable connection matrix through which pathways may be programmed via active repeaters to make connections between said input/output cells and the data input and data output signal lines in a core array of programmable logic blocks of said field programmable gate array, wherein each said active repeater in said predesigned, substantially identical interface circuits is implemented with one or more switching transistors which are coupled to an external power supply when operational and programmed to regenerate on an output conductor an input signal appearing at an input of said active repeater by using the large current drive and current sink capacity of the external power supply to selectively charge or discharge parasitic capacitance loading said output of said active repeater in accordance with the logic transitions of the input signal so as to speed up the rise and fall times of the logic transitions created on said output conductor relative to corresponding logic transitions of the input signal.

11. A collection of interface circuits for use as a padframe interface between the core array of logic blocks of a field programmable gate array integrated circuit and at least some of the external pins of the integrated circuit, each said interface circuit having any interface circuit structure suitable to perform the interface task defined above and characterized by the following features:

each interface circuit has the same structure and includes the same number of input/output cells each of which may be programmed as a data input or a data output or both, the same number of I/O power and ground connections and the same number of open spaces;

each interface circuit includes a programmable connection matrix which provides programmable data pathways between said input/output cells and data input and data output signal lines coming from said core array via programmable connections made through use of an active at every or substantially every programmable connection point;

each interface circuit includes enough power and ground pathways between external pins and said input/output cells to supply sufficient current to operate said input/output cells;

each interface circuit includes at least one open space in which a conductive pathway may be laid out on the integrated circuit to carry dedicated signals to circuits other than said core array which need said signals or which carry current to said core array;

and wherein larger or smaller size core arrays have their padframe interface circuits characterized by more of said interface circuits placed in the padframe interface circuit integrated circuit layout such that the ratio of input/output cells to I/O power and ground connections to open spaces remains unchanged.

12. A repeatable interface unit circuit for use in the padframe interface circuit area of a field programmable gate array integrated circuit comprising:

input/output cell means for providing a plurality of programmable data pathways to external pins of an integrated circuit, some of said pathways being programmable as data inputs and some of said pathways being programmable as data outputs, and some of said input/output cells programmable to be both inputs and outputs;

a plurality of data buses each of which includes a plurality of data output conductors for carrying data output signals from an array of logic blocks of the core array of said field programmable gate array and each of which includes a plurality of data input conductors for carrying data input signals to said array of logic blocks from said external pins; and programmable connection matrix means including a plurality of active repeaters at every or substantially every programmable connection point for allowing a plurality of programmable data pathways to be established between selected ones of said data output conductors of said buses and data output pathways of said input/output cell means, and for allowing a plurality of programmable data pathways to be established between selected ones of said data input conductors of said buses and data input pathways of said input/output cell means.

13. A repeatable interface unit circuit for use in the padframe interface circuit area of a field programmable gate array integrated circuit comprising:

input/output cell means for providing a plurality of programmable data pathways to external pins of an integrated circuit, some of said pathways being programmable as data inputs and some of said pathways being programmable as data outputs, and some of said input/output cells programmable to be both inputs and outputs:

a plurality of data buses each of which includes a plurality of data output conductors for carrying data output signals from an array of logic blocks of the core array of said field programmable gate array and each of which includes a plurality of data input conductors for carrying data input signals to said array of logic blocks from said external pins; and programmable connection matrix for allowing a plurality of programmable data pathways to be established between selected ones of said data output conductors of said buses and data output pathways of said input/output cell means, and for allowing a plurality of programmable data pathways to be established between selected ones of said data input conductors of said buses and data input pathways of said input/output cell means;

and wherein said input/output cell means provides eight programmable pathways which may be programmed as data inputs or data outputs, and wherein said interface circuit couples to four columns each of which has twenty-four data output conductors and six data input conductors, and wherein said programmable connection matrix allows programmable data pathways to be established between as many as eight of said programmable pathways programmed as data inputs and up to a three simultaneously of the six data input conductors of each of the four columns, provided no two or more programmable pathways programmed as data inputs are simultaneously connected to drive the same data input conductor of a column with two or more different data input signals.

14. A repeatable interface unit circuit for use in the padframe interface circuit area of a field programmable gate array integrated circuit comprising:

input/output cell means for providing a plurality of programmable data pathways to external pins of an integrated circuit, some of said pathways being programmable as data inputs and some of said pathways being programmable as data outputs, and some of said input/output cells programmable to be both inputs and outputs;

a plurality of data buses each of which includes a plurality of data output conductors for carrying data output signals from an array of logic blocks of the core array of said field programmable gate array and each of which includes a plurality of data input conductors for carrying data input signals to said array of logic blocks from said external pins; and programmable connection matrix for allowing a plurality of programmable data pathways to be established between selected ones of said data output conductors of said buses and data output pathways of said input/output cell means, and for allowing a plurality of programmable data pathways to be established between selected ones of said data input conductors of said buses and data input pathways of said input/output cell means;

and wherein said programmable connection matrix further comprises a plurality of I_lines which can be programmably coupled to each of the eight programmable pathways which can be programmed as inputs, and wherein said programmable connection matrix of each RIU interface circuit further comprises a first and second plurality of O_lines, each of which may be programmably connected to first and second halves of said programmable pathways of said input/output cell means, respectively, and each of which may be programmably connected to first and second pairs of said four columns, respectively, such that any of said first or second half of programmable pathways which are programmed as data outputs can be connected in programmable fashion to any of up to fourteen selected ones of the twenty-four data output conductors of either of the two columns in the pair of columns to which said first or second half of programmable pathways are coupled through said first or second plurality of O_lines, respectively, provided that no programmable data pathway programmed as a data output can be simultaneously driven by more than one data output signal from any one or more columns, and provided that no O_line can be simultaneously driven by more than one data output signal from any one or more columns, and wherein said first and second plurality of O_lines within each RIU interface circuit have individual O_lines each of which is divided into two line segments joined by an active repeater, and wherein said I_lines of each said RIU interface circuit are joined on both ends by active repeaters to the I_lines of neighboring RIU interface circuits.

15. A repeatable interface circuit for an integrated field programmable gate array having a core array of programmable logic circuits comprising:

first and second pluralities of programmable I/O cells any one of which can be programmed to act as a data input or data output port for an integrated circuit, each I/O cell having a Do input for receiving a data output signal, an OE output enable input for receiving a signal which enables said I/O cell to drive any signal received at said Do input to an external pin and a CKE clock enable input for receiving a clock enable signal, and having a Din output at which a data input signal is presented if said I/O cell is programmed as a data input and having at least one programming signal input;

means coupled to the at least one programming signal input of said first and second pluralities of programmable I/O cells for supplying one or more programming signals that define whether each said I/O cell acts as a data input or a data output or both;

a first plurality of intermediary O_line conductors;

a second plurality of intermediary O_line conductors, each said intermediary O_line conductor terminating on one end at the input of a tri-state driver type active repeater which has an output which is coupled to one of the intermediary O_line conductors of said first plurality of intermediarly O_line conductors, and terminating at the other end at the input of a tri-state driver type active repeater having an output for coupling to an intermediary O_line conductor of an adjacent repeatable interface circuit;

a plurality of intermediary I_line conductors each said intermediary I_line conductor terminating on both ends at the input of a tri-state driver type active repeater which has an output for coupling to an intermediary I_line conductor of an adjacent repeatable interface circuit;

first, second and third active repeater type multiplexers associated with each I/O cell in said first plurality of I/O cells and having first, second and third outputs coupled to said Do, OE and CKE inputs, respectively, of the associated I/O cell, and having a plurality of inputs each of which is connected to a selected one or more of said first plurality of O_line conductors, said first, second and third multiplexers associated with each I/O cell in said first plurality of I/O cells having select inputs for receiving signals which control which input of each multiplexer is coupled to its output, and wherein each active repeater type multiplexer is implemented with switching transistors which are coupled to an external power supply when operational and programmed to select an input for coupling to said output of said multiplexer so as to use the large current drive and current sink capacity of the external power supply to charge or discharge parasitic capacitance loading said output of said multiplexer in accordance with the logic transitions of the input signal of the selected input to be coupled to said output;

fourth, fifth and sixth active repeater type multiplexers associated with each I/O cell in said second plurality of I/O cells and having first, second and third outputs coupled to said Do, OE and CKE inputs, respectively, of the associated I/O cell, and having a plurality of inputs each of which is connected to a selected one or more of said second plurality of O_line conductors, said fourth, fifth and sixth multiplexers associated with each I/O cell in said second plurality of I/O cells having select inputs for receiving signals which control which input of each multiplexer is coupled to its output, said fourth, fifth and sixth active repeaters having the same structure as said first, second and third multiplexers;

means coupled to said select inputs of said first, second, third, fourth, fifth and sixth multiplexers for providing programmable signals to said select inputs to control which input of each multiplexer is coupled to that multiplexer's output;

a first plurality of active repeaters in the form of tri-state drivers programmably coupling said Din output of each I/O cell to a selected one or more of said plurality of intermediary I_lines;

a plurality of output lines from each of a plurality of buses comprised of conductors that pass through said array of programmable logic circuits carrying output signals therefrom;

a plurality of input lines in each of said plurality of buses for carrying input signals to said array of logic circuits a second plurality of active repeaters in the form of tri-state drivers programmably coupling said plurality of output lines from said buses to selected ones of said first and second pluralities of intermediary O_lines; and a third plurality of active repeaters in the form of tri-state drivers programmably coupling said plurality of input lines in said buses to selected ones of said plurality of intermediary I_lines;

and wherein each said active repeater is implemented with one or more switching transistors which are coupled to an external power supply when operational and programmed to be in an enabled state so as to regenerate on an output conductor an input signal appearing at an input of said active repeater by using the large current drive and current sink capacity of the external power supply to selectively charge or discharge parasitic capacitance loading said output of said active repeater in accordance with the logic transitions of the input signal so as to speed up the rise and fall times of the logic transitions created on said output conductor relative to corresponding logic transitions of the input signal, and wherein each active repeater includes programming means for controlling whether said active repeater is enabled or disabled.

* * * * *